(12) United States Patent
Iijima et al.

(10) Patent No.: US 8,395,693 B2
(45) Date of Patent: Mar. 12, 2013

(54) IMAGE PICKUP APPARATUS AND SEMICONDUCTOR CIRCUIT ELEMENT

(75) Inventors: Tomokuni Iijima, Osaka (JP); Satoshi Tamaki, Osaka (JP)

(73) Assignee: Panasonic Corporation, Osaka (JP)

( * ) Notice: Subject to any disclaimer, the term of this patent is extended or adjusted under 35 U.S.C. 154(b) by 431 days.

(21) Appl. No.: 12/667,029

(22) PCT Filed: Jun. 26, 2008

(86) PCT No.: PCT/JP2008/001667
§ 371 (c)(1),
(2), (4) Date: Dec. 28, 2009

(87) PCT Pub. No.: WO2009/001563
PCT Pub. Date: Dec. 31, 2008

(65) Prior Publication Data
US 2010/0182484 A1    Jul. 22, 2010

(30) Foreign Application Priority Data
Jun. 28, 2007 (JP) .................................. 2007-170420

(51) Int. Cl.
*H04N 5/225* (2006.01)
(52) U.S. Cl. ....................................................... 348/340
(58) Field of Classification Search .................. 348/340, 348/333.09, 14.16
See application file for complete search history.

(56) References Cited

U.S. PATENT DOCUMENTS

| | | |
|---|---|---|
| 6,184,511 B1 | 2/2001 | Yamashita |
| 6,337,736 B1 | 1/2002 | Sugiyama et al. |
| 2002/0122124 A1 | 9/2002 | Suda |
| 2003/0086013 A1 | 5/2003 | Aratani |
| 2004/0021773 A1* | 2/2004 | Hayakawa ..................... 348/164 |
| 2005/0018265 A1 | 1/2005 | Atsuumi et al. |

(Continued)

FOREIGN PATENT DOCUMENTS

| | | |
|---|---|---|
| JP | 04350613 A | 12/1992 |
| JP | 07087385 A | 3/1995 |

(Continued)

OTHER PUBLICATIONS

US Office Action issued in U.S. Appl. No. 12/678,881 dated Jun. 28, 2012.

*Primary Examiner* — Aung S Moe
*Assistant Examiner* — Amy Hsu
(74) *Attorney, Agent, or Firm* — McDermott Will & Emery LLP

(57) ABSTRACT

An image pickup apparatus of the present invention includes: a lens array having a plurality of lenses; a plurality of image pickup regions disposed to correspond to the plurality of lenses one-to-one and each having a light receiving surface substantially perpendicular to a direction in which an optical axis of the corresponding lens extends; a temperature sensor (126) disposed in the vicinity of the lens array to detect a temperature; a movement distance estimating portion (139) configured to estimate movement distances of all the optical axes of the plurality of lenses based on the temperature detected by the temperature sensor (126); an image pickup signal correcting portion (135) configured to correct an image pickup signal, generated in the image pickup region, based on the movement distances estimated by the movement distance estimating portion (139); and a parallax calculating portion (142) configured to calculate a parallax based on the image pickup signal corrected by the image pickup signal correcting portion (135).

21 Claims, 37 Drawing Sheets

U.S. PATENT DOCUMENTS

| | | | |
|---|---|---|---|
| 2006/0077543 | A1* | 4/2006 | Miyoshi et al. ............... 359/407 |
| 2006/0082879 | A1* | 4/2006 | Miyoshi et al. ............... 359/462 |
| 2007/0097249 | A1* | 5/2007 | Korenaga ...................... 348/335 |
| 2007/0247611 | A1* | 10/2007 | Tamaki et al. ................ 356/3.11 |
| 2009/0010633 | A1* | 1/2009 | Strandemar et al. .......... 396/121 |
| 2009/0160997 | A1* | 6/2009 | Oyama et al. ................. 348/340 |

FOREIGN PATENT DOCUMENTS

| | | |
|---|---|---|
| JP | 10-281761 | 10/1998 |
| JP | 11305112 A | 11/1999 |
| JP | 2001-099643 | 4/2001 |
| JP | 2002-204462 | 7/2002 |
| JP | 2003-143459 | 5/2003 |
| JP | 2007033315 A | 2/2007 |
| JP | 2007081806 A | 3/2007 |
| JP | 2007-271301 | 10/2007 |
| JP | 2007322128 A | 12/2007 |
| JP | 4264464 B2 | 5/2009 |
| WO | WO-2004106858 A1 | 12/2004 |
| WO | WO 2005/119175 A1 | 12/2005 |
| WO | WO-2009001563 A1 | 12/2008 |

* cited by examiner (a)

(b)

(d)

(e)

(g)

(h)

| Ts | xc1 |
|---|---|
| 0 | xc1_0 |
| 256 | xc1_256 |
| 512 | xc1_512 |
| 768 | xc1_768 |
| 1024 | xc1_1024 |
| ... | ... |
| 3840 | xc1_3840 |
| 4096 | xc1_4096 |

Fig. 31

IMAGE PICKUP APPARATUS AND SEMICONDUCTOR CIRCUIT ELEMENT

RELATED APPLICATIONS

This application is the U.S. National Phase under 35 U.S.C. §371 of International Application No. PCT/JP2008/001667, filed on Jun. 26, 2008, which in turn claims the benefit of Japanese Application No. 2007-170420, filed on Jun. 28, 2007, the disclosures of which Applications are incorporated by reference herein.

TECHNICAL FIELD

The present invention relates to an image pickup apparatus capable of measuring distances and a semiconductor circuit element used in the image pickup apparatus.

BACKGROUND ART

One example of a conventional image pickup apparatus capable of measuring distances is an image pickup apparatus of Patent Document 1. FIG. 38 is an exploded perspective view of the image pickup apparatus of Patent Document 1. FIG. 39 is a diagram for explaining an image pickup block of the image pickup apparatus of Patent Document 1. As shown in FIGS. 38 and 39, an image pickup apparatus 901 that is a compound-eye image pickup system includes an iris member 902, an optical lens array 903, a light shielding block 904, an optical filter 906, and an image pickup unit 907. In the image pickup apparatus 901, the iris member 902 having four openings 902-1, 902-2, 902-3, and 902-4 and the optical lens array 903 having four optical blocks (lenses) 903-1, 903-2, 903-3, and 903-4 constitute four image pickup optical systems. Light beams having passed through the respective image pickup optical systems form images on four image pickup blocks 907-1, 907-2, 907-3, and 907-4, respectively, on the image pickup unit 907. The image pickup unit 907 constituted by, for example, a CCD sensor is formed on a semiconductor substrate 910 together with a drive circuit 908 configured to drive the image pickup unit 907 and a parallax calculating circuit 909 configured to calculate information regarding parallax among images taken by the plurality of image pickup blocks 907-1 to 907-4.

As described above, the light beams having passed through the openings 902-1 to 902-4 of the iris member 902 are refracted by the lens 903-1 to 903-4, respectively. Then, the light beams pass through the light shielding block 904 and the optical filter 906 to form images on the image pickup blocks 907-1 to 907-4. Then, for example, a degree of similarity between the image taken by the image pickup block 907-1 and the image taken by the image pickup block 907-2 is calculated using block matching. A parallax d is calculated based on the degree of similarity, and a distance L is calculated based on the parallax d as shown by Formula (1) below. In Formula (1), f is a focal length of each of the lenses 903-1 and 903-2, B is an interval between optical axes of the lenses 903-1 and 903-2, and p is a pixel pitch of the image pickup unit 907 in a direction in which the optical axes of the lens 903-1 and 903-2 are opposite to each other.

$$L = fB/pd \quad (1)$$

However, the lens array 903 deforms with changes in temperature, and this changes the interval B between the optical axes of the lenses. Therefore, if the temperature changes, the distance cannot be calculated properly.

An image pickup apparatus capable of dealing with such temperature change is disclosed in Patent Document 2. Since the image pickup apparatus of Patent Document 2 is the same in configuration as the image pickup apparatus of Patent Document 1 except that the image pickup apparatus of Patent Document 2 includes a temperature sensor, it will be explained in reference to FIG. 38. The image pickup apparatus of Patent Document 2 includes the lenses 903-1 to 903-4 arranged at regular intervals and a temperature sensor configured to measure a temperature T of a portion in the vicinity of the lenses 903-1 to 903-4. The image pickup apparatus of Patent Document 2 uses the temperature T to correct images I1 to I4 taken by the image pickup blocks 907-1 to 907-4.

More specifically, the image pickup apparatus of Patent Document 2 calculates an amount (T−T0) of change in temperature with respect to a reference temperature T0, and as shown by Formula (2) below, calculates an amount z of change in the interval B between the optical axes of the lenses due to the temperature change based on a difference (aL−aS) between a linear thermal expansion coefficient aL of the lens array and a linear expansion coefficient aS of the image pickup unit 907. Then, using the image I1 taken by the image pickup block 907-1 as a reference as shown by Formula (3) below, the images I2, I3, and I4 taken by the image pickup blocks 907-2, 907-3, and 907-4, respectively, are corrected by the change in the interval between the optical axes of the lenses as shown by Formulas (4), (5), and (6). Here, the lenses 903-1 and 903-2 are arranged away from each other in an x-axis direction, the lenses 903-3 and 903-4 are arranged away from each other in the x-axis direction, the lenses 903-1 and 903-3 are arranged to be spaced apart from each other in a y-axis direction, and the lenses 903-2 and 903-4 are arranged to be spaced apart from each other in the y-axis direction. Then, p is the pixel pitch of the image pickup unit 907, and is the same in the x-axis direction and the y-axis direction. Each of I1(x, y), I2(x, y), I3(x, y), and I4(x, y) denotes luminance of each image at coordinates (x, y). As compared to the lens 903-1, the lens 903-2 moves by z/p pixels in the x-axis direction due to the temperature change. Therefore, as shown by Formula (4), I2(x, y) is corrected so as to move by z/p in the x-axis direction. Moreover, as compared to the lens 903-1, the lens 903-3 moves by z/p pixels in the y-axis direction due to the temperature change. Therefore, as shown by Formula (5), I3(x, y) is corrected so as to move by z/p in the y-axis direction. Further, as compared to the lens 903-1, the lens 903-4 moves by z/p pixels in the x-axis direction and by z/p pixels in the y-axis direction due to the temperature change. Therefore, as shown by Formula (6), I4(x, y) is corrected so as to move by z/p pixels in the x-axis direction and by z/p pixels in the y-axis direction.

$$z = B(aL-aS)(T-T0) \quad (2)$$

$$I1(x,y) = I1(x,y) \quad (3)$$

$$I2(x,y) = I2(x+z/p,y) \quad (4)$$

$$I3(x,y) = I3(y,x+z/p) \quad (5)$$

$$I4(x,y) = I4(x+z/p,y+z/p) \quad (6)$$

Patent Document 1: Japanese Laid-Open Patent Application Publication 2003-143459

Patent Document 2: Japanese Laid-Open Patent Application Publication 2002-204462

DISCLOSURE OF THE INVENTION

Problems to be Solved by the Invention

As described above, the conventional image pickup apparatus described in Patent Document 2 uses the image I1 taken by the image pickup block 907-1 as a reference to correct the images I2, I3, and I4 taken by the image pickup blocks 907-2, 907-3, and 907-4 by the change in the interval between the optical axes of the lenses as shown by Formulas (4), (5), and (6).

However, the centers of the optical axes of all the lenses change by the temperature change of the lens array. Therefore, although the interval between the optical axes is properly corrected using the image I1 as a reference, coordinates of the centers of the optical axes are not properly corrected. For example, the center of the optical axis of the lens 903-1 corresponding to the image pickup block 907-1 configured to take the image I1 changes due to the temperature change of the lens array. However, the image I1 is not corrected as shown by Formula (3). Therefore, the optical axis of the lens 903-1 is not corrected. Distortion exists concentrically at the center of the optical axis. Therefore, if the optical axis is not properly corrected, the distortion cannot be properly corrected. To be specific, the optical axis cannot be properly corrected using the image I1 as a reference as shown by Formulas (3) to (6). Therefore, the distortion cannot be properly corrected. On this account, accuracy of distance measurement deteriorates.

The present invention was made to solve the above problem, and an object of the present invention is to provide an image pickup apparatus capable of, even if a temperature changes, appropriately correcting an optical axis to properly correct the distortion, and as a result, capable of measuring distances with high accuracy, and a semiconductor circuit element used in the image pickup apparatus.

Means for Solving the Problems

In order to solve the above problems, an image pickup apparatus of the present invention includes: a lens array including a plurality of lenses; a plurality of image pickup regions disposed to correspond to the plurality of lenses one-to-one and each including a light receiving surface substantially perpendicular to a direction in which an optical axis of the corresponding lens extends; a temperature sensor disposed in a vicinity of the lens array to detect a temperature; a temperature compensating and image pickup signal correcting portion configured to correct an image pickup signal, generated in the image pickup region, in accordance with movement distances of all the optical axes of the plurality of lenses based on the temperature detected by the temperature sensor; and a parallax calculating portion configured to calculate a parallax based on the image pickup signal corrected by the temperature compensating and image pickup signal correcting portion.

In the image pickup apparatus according to the present invention, the temperature compensating and image pickup signal correcting portion may include a movement distance estimating portion configured to estimate the movement distances of all the optical axes of the plurality of lenses based on the temperature detected by the temperature sensor and an image pickup signal correcting portion configured to correct the image pickup signal, generated in the image pickup region, based on the movement distances estimated by the movement distance estimating portion, and the parallax calculating portion may be configured to calculate the parallax based on the image pickup signal corrected by the image pickup signal correcting portion.

In the image pickup apparatus according to the present invention, the movement distance estimating portion may be configured to calculate amounts of changes in intervals between the optical axes of the plurality of lenses based on the temperature detected by the temperature sensor and estimate the movement distances of the optical axes based on the amounts of changes. Here, the movement distance estimating portion may be configured to estimate half the amount of change as the movement distance of the optical axis.

Moreover, the image pickup signal correcting portion may be configured to correct positions of the optical axes based on the movement distances and to correct distortions around the optical axes. Moreover, the image pickup signal correcting portion may be configured to change a cut-out region based on the movement distance.

Moreover, in the image pickup apparatus according to the present invention, the temperature compensating and image pickup signal correcting portion may include a correction coefficient generating portion configured to generate correction coefficients including the movement distances of all the optical axes of the plurality of lenses based on the temperature detected by the temperature sensor and an image pickup signal correcting portion configured to correct the image pickup signal, generated in the image pickup region, based on the correction coefficients to generate a corrected image pickup signal, and the parallax calculating portion may be configured to calculate the parallax based on the corrected image pickup signal.

In the image pickup apparatus according to the present invention, the correction coefficient generating portion may be configured to calculate amounts of changes in intervals between the optical axes of the plurality of lenses based on the temperature detected by the temperature sensor and generate half the amount of change as the movement distance of the optical axis to generate the correction coefficient.

With this configuration, the amount of change in the interval between the optical axes of the plurality of lenses is calculated based on the temperature detected by the temperature sensor, the correction coefficient is generated based on the amount of change such that half the amount of change is set as the movement distance of the optical axis, and the image pickup signal is corrected based on the correction coefficient. With this, even if the lens array deforms due to the temperature change, the position of the optical axis can be accurately corrected. Therefore, it is possible to obtain the parallax which is less affected by the temperature. Based on this parallax, the distance measurement can be carried out accurately. Moreover, the amount of change in the interval between the lens portions is calculated based on the temperature detected by the temperature sensor, each of the origin points of the optical axes of the plurality of lenses is moved by half the amount of change, and the image is corrected to cancel the distortion around the origin point of the optical axis. With this, the influences of the distortion can be reduced accurately. Therefore, the detection of the parallax and the distance measurement can be carried out with high accuracy. Moreover, in a case where the position of the optical axis of the lens portion changes due to the temperature, the image taken by the image pickup apparatus moves. For example, in a case where the image pickup apparatus is utilized to monitor a view in front of a vehicle, and even if the center of the image taken by the image pickup apparatus and the center of the image viewed by a driver are caused to coincide with each other, the center of the image is displaced due to the temperature change. Therefore, the driver feels uncomfortable. In contrast, in the case of the image pickup apparatus of the present invention, even if the temperature changes, the change in the center of the image can be suppressed. Therefore, it is possible to realize the image pickup apparatus suitable for monitoring the view in front of a vehicle.

Moreover, the image pickup apparatus according to the present invention may further include a correction coefficient storing portion configured to store plural sets of correction coefficients corresponding to the temperatures as plural sets of correction coefficient storing values, wherein the correction coefficient generating portion may be configured to select the correction coefficient storing value corresponding to the temperature from the plural sets of correction coefficient storing values to generate the correction coefficient.

With this configuration, the correction coefficients corresponding to respective temperatures are prestored. With this, it becomes unnecessary to calculate the correction coefficient using the compensation formula. Therefore, a calculating time and a calculating circuit become unnecessary. Thus, the low-cost image pickup apparatus can be realized. Moreover, regarding the correction coefficient which changes complexly nonlinearly depending on the temperature, values obtained through experiment are stored and used. With this, an error that is a difference between the change represented by the compensation formula and the actual change is prevented, and the influences of the distortion can be reduced accurately. Therefore, the detection of the parallax and the distance measurement can be carried out with high accuracy.

Moreover, the image pickup apparatus according to the present invention may further include a temperature sensor signal input portion configured to receive a signal from the temperature sensor to generate a temperature value that is a digital value, wherein: the correction coefficient storing portion may be configured to store the set of correction coefficient storing values which is lower in resolution than the temperature value; and the correction coefficient generating portion may be configured to select and interpolate the plural sets of correction coefficient storing values based on the temperature value to generate the correction coefficients.

With this configuration, when the image pickup apparatus prestores the correction coefficients corresponding to respective temperatures, it stores not the correction coefficients corresponding to all temperatures but the correction coefficients corresponding to specified temperatures, and uses the correction coefficient interpolated with respect to the temperature. With this, since the storage region can be reduced by reducing the correction coefficients stored, it is possible to realize the low-cost image pickup apparatus in which a circuit size is reduced.

Moreover, in the image pickup apparatus according to the present invention, the image pickup signal correcting portion may be configured to obtain reference coordinates based on the correction coefficients and refer to and interpolate a plurality of the image pickup signals indicated by the reference coordinates to generate the corrected image pickup signals.

In the case of calculating and storing the reference coordinates in advance, the reference coordinates of all the pixels of the corrected image pickup signals become necessary. Therefore, a huge memory capacity is required, and this increases the cost. Especially, in a case where it is necessary to change the reference coordinates depending on the temperature, the reference coordinates corresponding to respective temperatures become necessary, and this requires a further huge memory capacity. By the configuration of the present invention, the reference coordinates are sequentially calculated from the correction coefficients to generate the corrected image pickup signals. With this, the storage region may be assigned to only the correction coefficients, and a large memory capacity is unnecessary. Therefore, the low-cost image pickup apparatus can be realized. Especially, this effect is significant in a case where the reference coordinates need to be changed depending on the temperature.

Moreover, a circuit element of the present invention is a semiconductor circuit element used in an image pickup apparatus including a lens array having a plurality of lenses, and a plurality of image pickup regions disposed to correspond to the plurality of lenses one-to-one and each including a light receiving surface substantially perpendicular to a direction in which an optical axis of the corresponding lens extends, the semiconductor circuit element including: a temperature compensating and image pickup signal correcting portion configured to correct an image pickup signal, generated in the image pickup region, in accordance with movement distances of all the optical axes of the plurality of lenses based on a temperature detected by a temperature sensor disposed in a vicinity of the lens array; and a parallax calculating portion configured to calculate a parallax based on the image pickup signal corrected by the temperature compensating and image pickup signal correcting portion.

In the circuit element according to the present invention, the temperature compensating and image pickup signal correcting portion may include a movement distance estimating portion configured to estimate the movement distances of all the optical axes of the plurality of lenses based on the temperature detected by the temperature sensor and an image pickup signal correcting portion configured to correct the image pickup signal, generated in the image pickup region, based on the movement distances estimated by the movement distance estimating portion, and the parallax calculating portion may be configured to calculate the parallax based on the image pickup signal corrected by the image pickup signal correcting portion.

Here, the movement distance estimating portion may be configured to calculate amounts of changes in intervals between the optical axes of the plurality of lenses based on the temperature detected by the temperature sensor and estimate the movement distances of the optical axes based on the amounts of changes. Moreover, the movement distance estimating portion may be configured to estimate half the amount of change as the movement distance of the optical axis.

Moreover, the image pickup signal correcting portion may be configured to correct positions of the optical axes based on the movement distances and to correct distortions around the optical axes. Moreover, the image pickup signal correcting portion may be configured to change a cut-out region based on the movement distance.

In the circuit element of the present invention, the temperature compensating and image pickup signal correcting portion may include a correction coefficient generating portion configured to generate correction coefficients including the movement distances of all the optical axes of the plurality of lenses based on the temperature detected by the temperature sensor and an image pickup signal correcting portion configured to correct the image pickup signal, generated in the image pickup region, based on the correction coefficients to generate a corrected image pickup signal, and the parallax calculating portion may be configured to calculate the parallax based on the corrected image pickup signal.

Here, the correction coefficient generating portion may be configured to calculate amounts of changes in intervals between the optical axes of the plurality of lenses based on the temperature detected by the temperature sensor and generate half the amount of change as the movement distance of the optical axis to generate the correction coefficient.

The above object, other objects, features and advantages of the present invention will be made clear by the following detailed explanation of preferred embodiments with reference to the attached drawings.

Effects of the Invention

Since the present invention can appropriately correct the optical axis of the lens and the distortion of the lens, it can measure distances with high accuracy.

BRIEF DESCRIPTION OF THE DRAWINGS

FIG. 31 is a diagram for explaining a coefficient storing portion according to Embodiment 3 of the present invention.

Explanation of Reference Numbers

Figure 1:
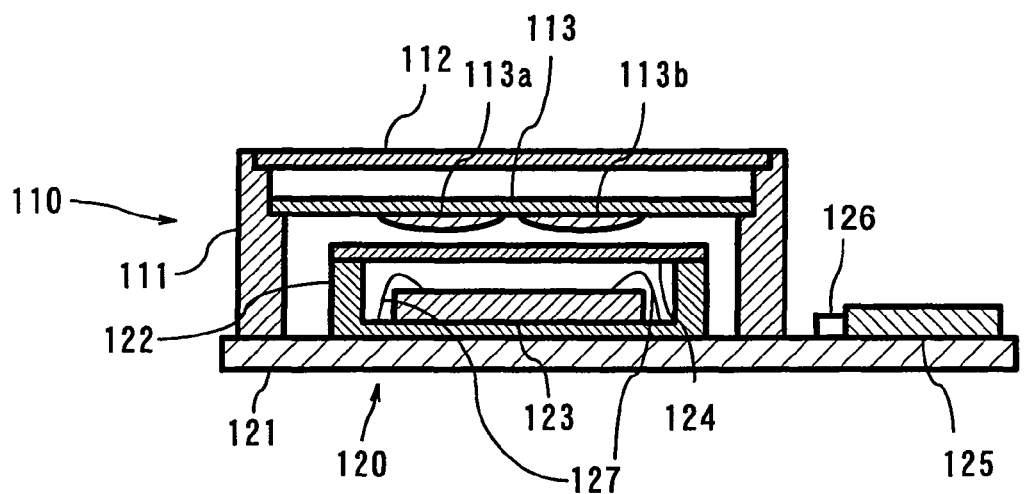
FIG. 1 is a cross-sectional view showing the configuration of an image pickup apparatus according to Embodiment 1 of the present invention.

| | |
|---|---|
| 101 | camera module |
| 110 | lens module |
| 111 | barrel |
| 112 | upper cover glass |
| 113 | lens array |
| 113a | first lens portion |
| 113b | second lens portion |
| 113c | third lens portion |
| 113d | fourth lens portion |
| 120 | circuit portion |
| 121 | substrate |
| 122 | package |
| 123 | image pickup element |
| 124 | package cover glass |
| 125 | SLSI |
| 126 | temperature sensor |
| 127 | gold wire |
| 131 | system control portion |
| 132 | image pickup element driving portion |
| 133 | image pickup signal input portion |
| 134 | input buffer |
| 135 | preprocessing portion |
| 135a | first interstage buffer |
| 135b | second interstage buffer |
| 135c | third interstage buffer |
| 135d | fourth interstage buffer |
| 135e | preprocessing calculating portion |
| 136 | calculating portion |
| 137 | output buffer |
| 137a | first output buffer |
| 137b | second output buffer |
| 138 | input-output portion |
| 139 | temperature compensating portion |
| 139a | temperature sensor signal input portion |

-continued

Explanation of Reference Numbers

| | |
|---|---|
| 139b | temperature compensation calculating portion |
| 141 | calculating buffer |
| 141 | first calculating buffer |
| 141 | second calculating buffer |
| 142 | parallax calculating portion |
| 143 | distance calculating portion |
| 225 | SLSI |
| 234 | temperature sensor signal input portion |
| 235 | input-output portion |
| 241 | coefficient storing portion |
| 242 | temperature compensation calculating portion |
| 243 | image pickup signal correcting portion |
| 244 | distance calculating portion |

BEST MODE FOR CARRYING OUT THE INVENTION

Hereinafter, preferred embodiments of the present invention will be explained in reference to the drawings. In the drawings, the same reference numbers are used for the same or corresponding components, and a repetition of the same explanation will be avoided.

Embodiment 1

An image pickup apparatus according to Embodiment 1 of the present invention corrects an image such that: the amount of change in an interval between optical axes of a plurality of lenses is calculated based on a temperature detected by a temperature sensor; and each of origin points of the optical axes of the plurality of lenses is moved by half the amount of change to cancel distortion around the origin point of the optical axis. With this, influences of the distortion can be appropriately reduced. Therefore, the image pickup apparatus can detect highly accurate parallaxes, and measure distances with high accuracy.

FIG. 1 is a cross-sectional view showing the configuration of the image pickup apparatus according to Embodiment 1 of the present invention. As shown in FIG. 1, an image pickup apparatus 101 includes a circuit portion 120 and a lens module portion 110 disposed above the circuit portion 120.

The lens module portion 110 includes a cylindrical barrel 111, an upper cover glass 112 covering an opening of the barrel 111, and a lens array 113 disposed under the upper cover glass 112 and inside the barrel 111. Moreover, the circuit portion 120 includes a substrate 121, a package 122 disposed on the substrate 121, an image pickup element 123, a package cover glass 124, a system LSI (hereinafter referred to as "SLSI") 125 that is a semiconductor circuit element, and a temperature sensor 126 configured to detect a temperature of a portion in the vicinity of the lens array 113.

As described above, the barrel 111 has a cylindrical shape. An inner wall surface of the barrel 111 is painted with matte black to prevent diffused reflection of light. The barrel 111 is formed by injection molding of a resin. The upper cover glass 112 has a disc shape and is formed by an optical glass material, a transparent resin, or the like. The upper cover glass 112 is fixed to an inner wall of an upper portion of the barrel 111 by an adhesive or the like. A protective coating for preventing damages by friction or the like and an antireflection coating for preventing reflection of incident light are disposed on a surface of the upper cover glass 112.

Figure 2:
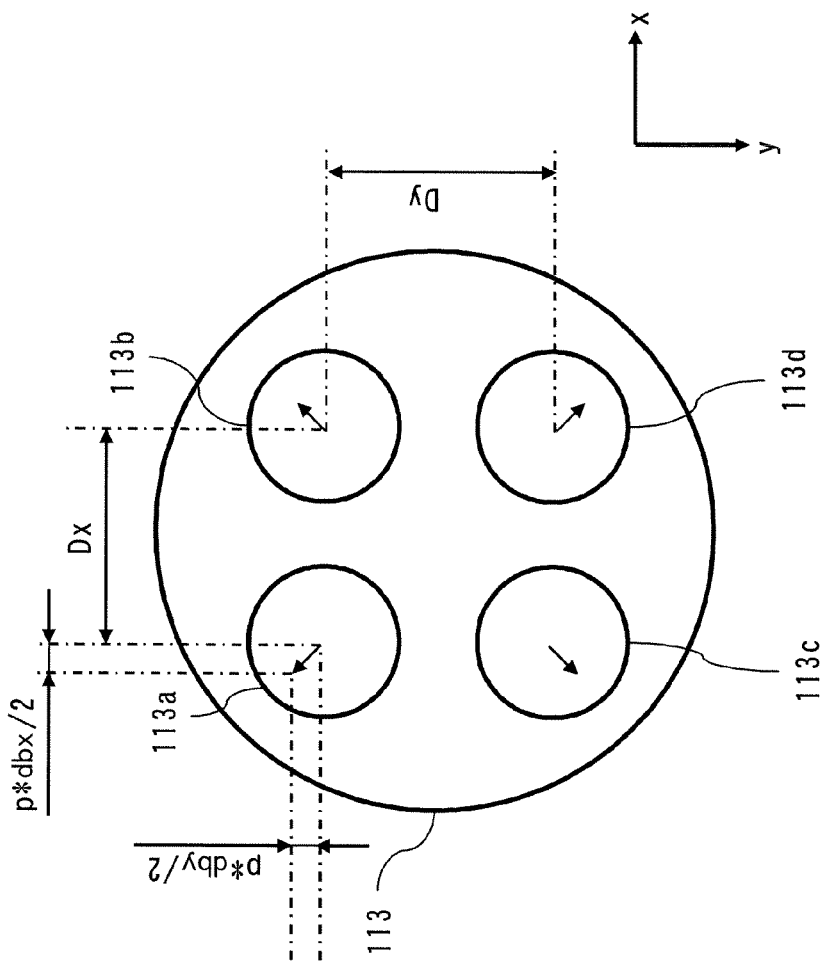
FIG. 2 is a plan view showing the configuration of a lens array of the image pickup apparatus according to Embodiment 1 of the present invention.

FIG. 2 is a plan view showing the configuration of the lens array of the image pickup apparatus according to Embodiment 1 of the present invention. The lens array 113 has a substantially disc shape and is formed by an optical glass material, a transparent resin, or the like. In the lens array 113, a circular first lens portion 113a, a circular second lens portion 113b, a circular third lens portion 113c, and a circular fourth lens portion 113d are arranged in two rows and two columns in a grid pattern. As shown in FIG. 2, x-axis and y-axis are set along directions in which the first to fourth lens portions 113a to 113d are arranged. In the first lens portion 113a, the second lens portion 113b, the third lens portion 113c, and the fourth lens portion 113d, light incident from a subject side is emanated toward the image pickup element 123 side, and four images are formed on the image pickup element 123. As shown in FIG. 2, the optical axis of the first lens portion 113a and the optical axis of the second lens portion 113b are spaced apart from each other by Dx in an x-axis direction and coincide with each other in a y-axis direction. The optical axis of the first lens portion 113a and the optical axis of the third lens portion 113c coincide with each other in the x-axis direction and are spaced apart from each other by Dy in the y-axis direction. The optical axis of the third lens portion 113c and the optical axis of the fourth lens portion 113d are spaced apart from each other by Dx in the x-axis direction and coincide with each other in the y-axis direction. The optical axis of the fourth lens portion 113d and the optical axis of the first lens portion 113a are spaced apart from each other by Dx in the x-axis direction and by Dy in the y-axis direction.

The substrate 121 is constituted by a resin substrate. A bottom surface of the barrel 111 contacts an upper surface of the substrate 121 to be fixed to the upper surface by an adhesive or the like. Thus, the lens module portion 110 and the circuit portion 120 are fixed to constitute the image pickup apparatus 101.

The package 122 is made of resin having metal terminals. The package 122 is fixed such that inside the barrel 111, the metal terminals thereof are, for example, soldered to the upper surface of the substrate 121.

The image pickup element 123 is a solid-state image pickup element, such as a CCD sensor or a CMOS sensor, and is disposed such that a light receiving surface thereof is substantially perpendicular to the optical axes of the first lens portion 113a, the second lens portion 113b, the third lens portion 113c, and the fourth lens portion 113d. Respective terminals of the image pickup element 123 are connected to the metal terminals at a bottom portion inside the package 122 by gold wires 127 using wire bonding, and are electrically connected to the SLSI 125 via the substrate 121. Light emanating from the first lens portion 113a, the second lens portion 113b, the third lens portion 113c, and the fourth lens portion 113d form images on the light receiving surface of the image pickup element 123, this light information is converted into electric information by a photodiode constituting a pixel of the image pickup element 123, and this electric information is transferred to the SLSI 125.

Figure 3A:
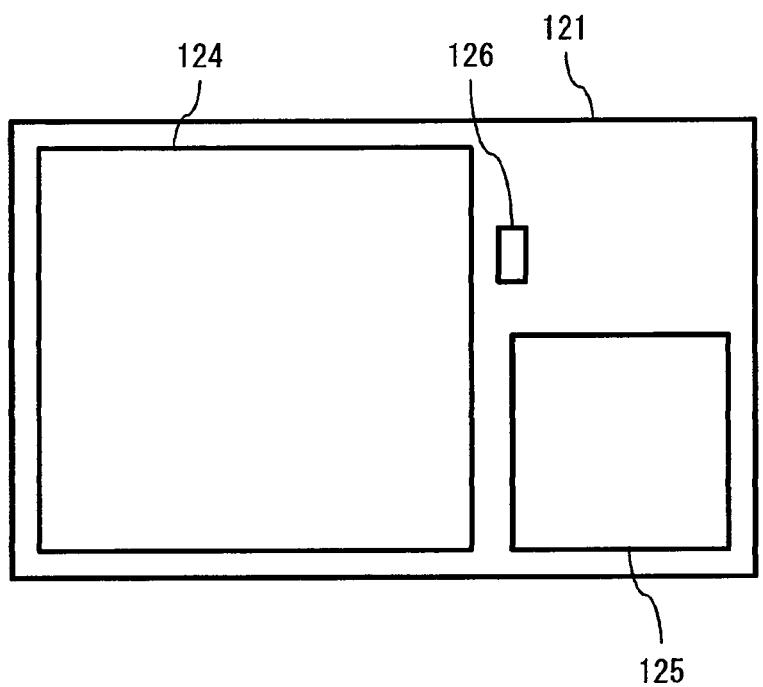
FIG. 3A is a plan view showing the configuration of a circuit portion of the image pickup apparatus according to Embodiment 1 of the present invention.

FIG. 3A is a plan view showing the configuration of the circuit portion 120 of the image pickup apparatus according to Embodiment 1 of the present invention. The package cover glass 124 has a flat plate shape, is formed by a transparent resin, and is fixed to an upper surface of the package 122 by an adhesive or the like. In FIG. 3A, for convenience sake, the image pickup element 123 and the like which can be seen through the package cover glass 124 are omitted.

In accordance with the following method, the SLSI 125 drives the image pickup element 123, receives the electric information from the image pickup element 123, carries out various calculations, communicates with a host CPU, and outputs image information, distance information, and the like to outside. The SLSI 125 is connected to a power supply (3.3 V for example) and a ground (0 V for example).

Figure 3B:
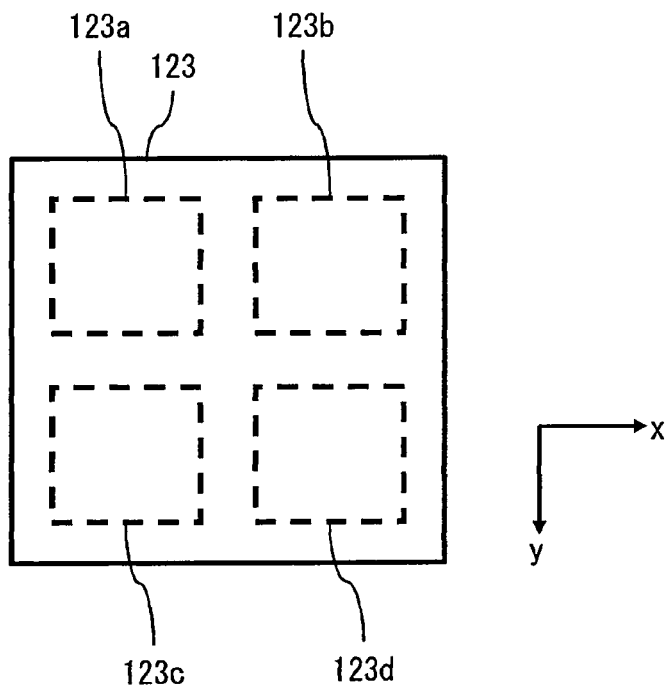
FIG. 3B is a plan view showing the configuration of an image pickup element of the image pickup apparatus according to Embodiment 1 of the present invention.

FIG. 3B is a plan view showing the configuration of the image pickup element of the image pickup apparatus according to Embodiment 1 of the present invention. As shown in FIG. 3B, the image pickup element 123 comprises a first image pickup region 123a, a second image pickup region 123b, a third image pickup region 123c, and a fourth image pickup region 123d. The first to fourth image pickup regions 123a to 123d are arranged in two rows and two columns such that light receiving surfaces thereof are substantially perpendicular to the optical axes of the first to fourth lens portions 113a to 113d, respectively. The image pickup regions 123a to 123d generate the image pickup signals.

Figure 4:
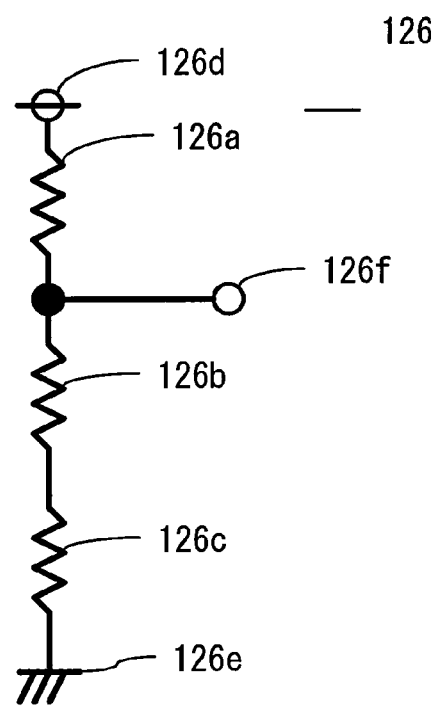
FIG. 4 is a circuit diagram of a temperature sensor of the image pickup apparatus according to Embodiment 1 of the present invention.

FIG. 4 is a circuit diagram of the temperature sensor of the image pickup apparatus according to Embodiment 1 of the present invention. As shown in FIG. 4, the temperature sensor 126 is configured such that a first fixed resistor 126a, a thermistor 126b, and a second fixed resistor 126c are connected in series. Here, the other end (end opposite an end to which the thermistor 126b is connected) of the first fixed resistor 126a is connected to a power supply 126d (3.3 V for example), and the other end (end opposite an end to which the thermistor 126b is connected) of the second fixed resistor 126c is connected to a ground 126e (0 V for example; the same potential as the ground of the SLSI 125). Moreover, a connecting point 126f where the first fixed resistor 126a and the thermistor 126b are connected to each other is connected to the SLSI 125.

Next, a relation between a subject distance and the parallax will be explained. Since the image pickup apparatus according to Embodiment 1 of the present invention has four lens portions (the first lens portion 113a, the second lens portion 113b, the third lens portion 113c, and the fourth lens portion 113d), relative positions of four object images formed by four lens portions, respectively, change depending on the subject distance.

Figure 5:
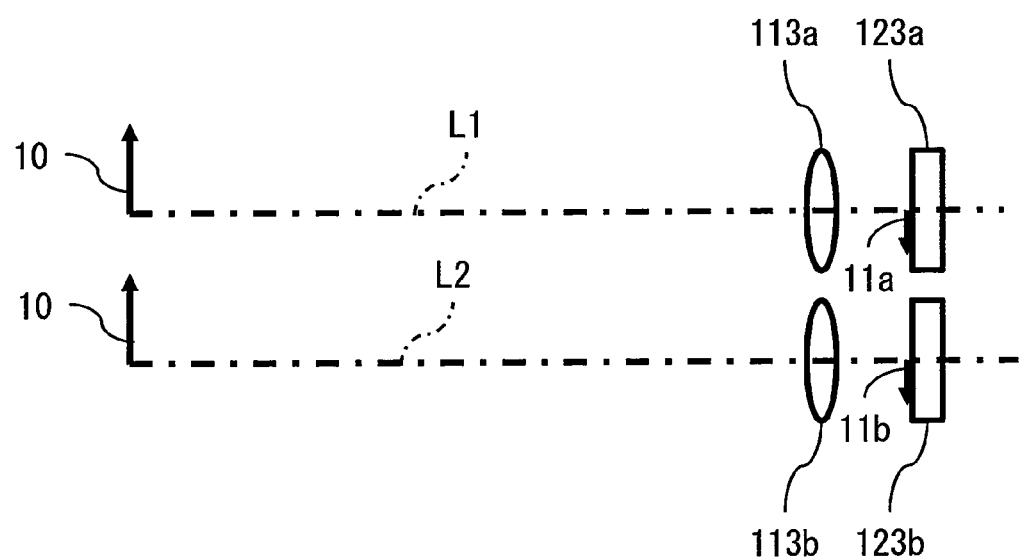
FIG. 5 is a diagram for explaining a position of an image of an object positioned at infinity in the image pickup apparatus according to Embodiment 1 of the present invention.

FIG. 5 is a diagram for explaining a position of an image of an object positioned at infinity in the image pickup apparatus according to Embodiment 1 of the present invention. In FIG. 5, for simplicity, only the first lens portion 113a and the second lens portion 113b of the lens array 113 are shown. Incident light L1 that is light incident from an object 10 at infinity to the first lens portion 113a and incident light L2 that is light incident from the object 10 at infinity to the second lens portion 113b are in parallel with each other. Therefore, a distance between the first lens portion 113a and the second lens portion 113b is equal to a distance between an object image 11a and an object image 11b on the image pickup element 123. That is, there is no parallax.

Figure 6:
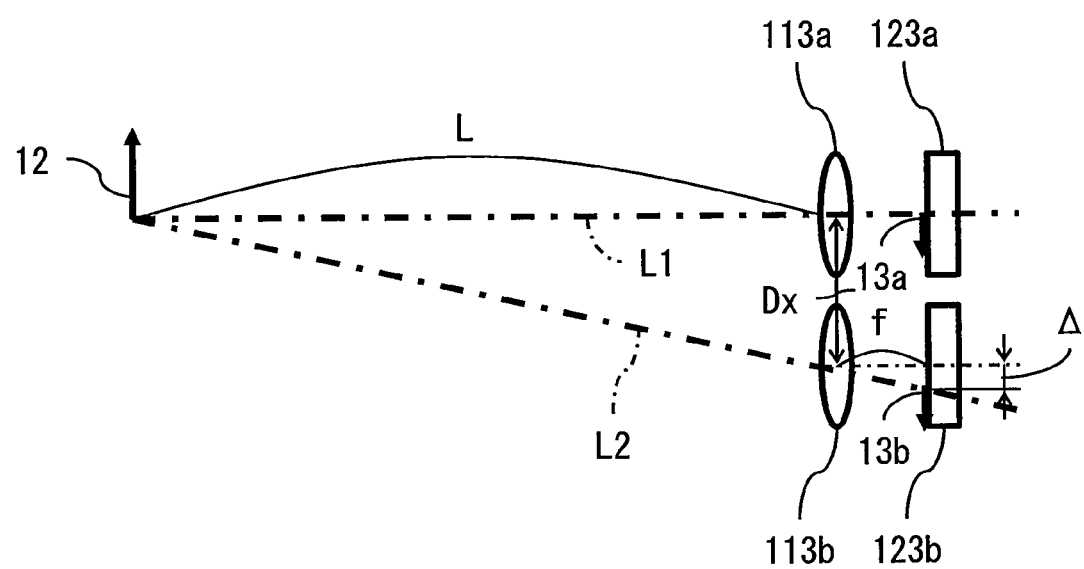
FIG. 6 is a diagram for explaining a position of the image of the object positioned at a finite distance in the image pickup apparatus according to Embodiment 1 of the present invention.

FIG. 6 is a diagram for explaining a position of the image of the object positioned at a finite distance in the image pickup apparatus according to Embodiment 1 of the present invention. In FIG. 6, for simplicity, only the first lens portion 113a and the second lens portion 113b of the lens array 113 are shown. The incident light L1 that is light incident from an object 12 at the finite distance to the first lens portion 113a and the incident light L2 that is light incident from the object 12 at the finite distance to the second lens portion 113b are not in parallel with each other. Therefore, a distance between an object image 13a and an object image 13b on the image pickup element 123 is longer than the distance between the first lens portion 113a and the second lens portion 113b. That is, there exists the parallax.

In a case where a distance (subject distance) to the object image 12 is denoted by L, the distance between the first lens portion 113a and the second lens portion 113b is denoted by Dx, and a focal length of each of the lens portions 113a and 113b is denoted by f, a parallax Δ is represented by Formula (7) below since a right angled triangle whose two sides sandwiching a right angle have lengths of L and Dx, respectively and a right angled triangle whose two sides sandwiching a right angle have lengths of f and Δ, respectively, are similar to each other in FIG. 6.

$$L=f\times Dx/\Delta \quad (7)$$

The same relation as above is true between the other lens portions. Thus, the relative positions of four object images formed by four lens portions 113a, 113b, 113c, and 113d, respectively, change depending on the subject distance. For example, the parallax Δ increases as the subject distance L decreases.

Figure 7:
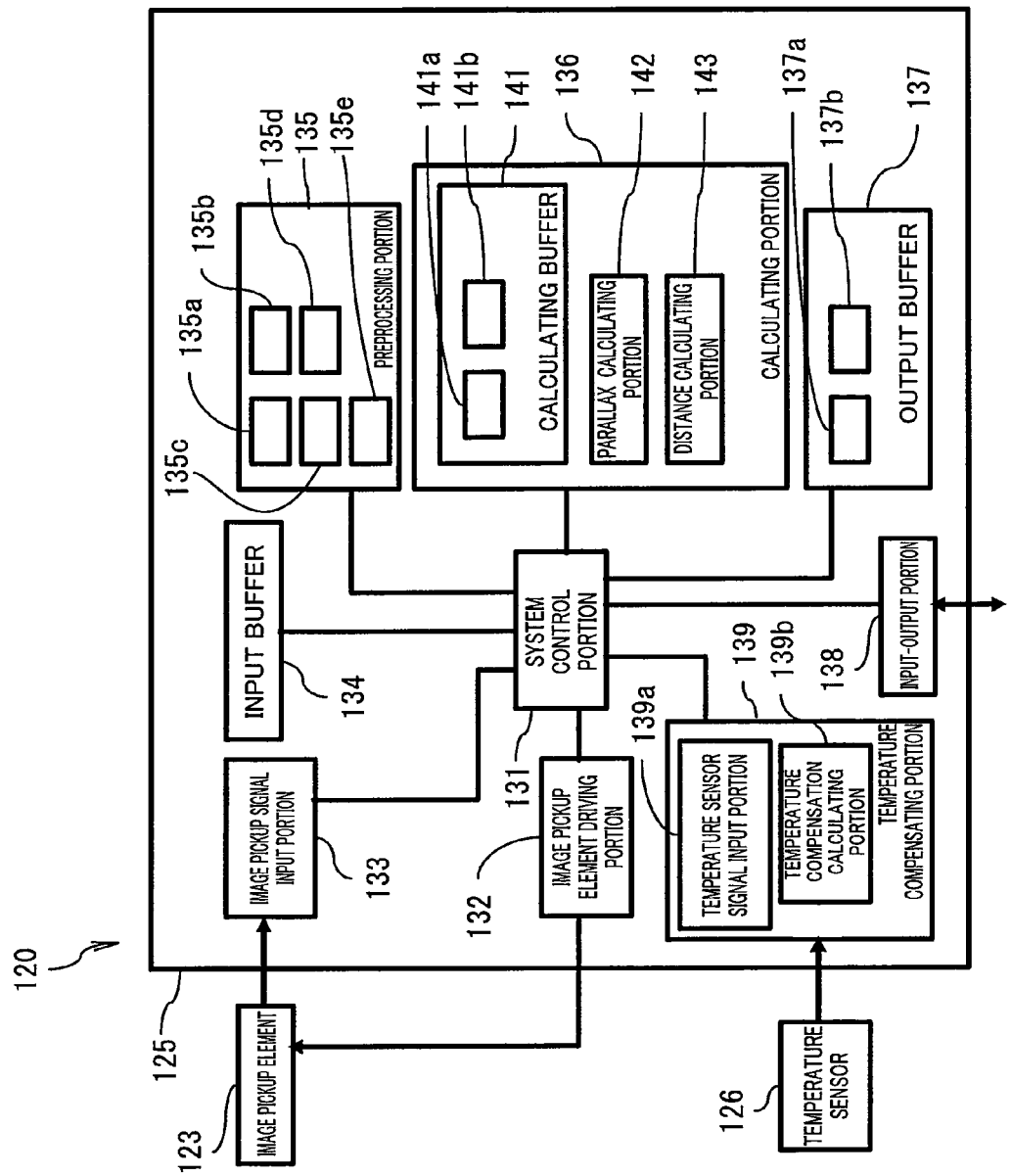
FIG. 7 is a block diagram showing the configuration of the image pickup apparatus according to Embodiment 1 of the present invention.

FIG. 7 is a block diagram showing the configuration of the image pickup apparatus according to Embodiment 1 of the present invention. The SLSI 125 includes a system control portion 131 and components controlled by the system control portion 131, i.e., an image pickup element driving portion 132, an image pickup signal input portion 133, an input buffer 134, a preprocessing portion 135, a calculating portion 136, an output buffer 137, an input-output portion 138, and a temperature compensating portion 139. The preprocessing portion 135 includes a first interstage buffer 135a, a second interstage buffer 135b, a third interstage buffer 135c, a fourth interstage buffer 135d, and a preprocessing calculating portion 135e. The preprocessing portion 135 serves as an image pickup signal correcting portion configured to correct the image pickup signal in the following manner. The calculating portion 136 includes a calculating buffer 141, a parallax calculating portion 142, and a distance calculating portion 143. The calculating buffer 141 includes a first calculating buffer 141a and a second calculating buffer 141b. The output buffer 137 includes a first output buffer 137a and a second output buffer 137b. The temperature compensating portion 139 includes a temperature sensor signal input portion 139a and a temperature compensation calculating portion 139b. The temperature compensating portion 139 serves as a movement distance estimating portion configured to estimate a movement distance of the optical axis of each of the lens portions 113a to 113d in the following manner. The temperature compensating portion 139 and the preprocessing portion 135 constitute a temperature compensating and image pickup signal correcting portion.

The system control portion 131 is constituted by a CPU (Central Processing Unit), a logic circuit, or the like, and controls the entire SLSI 125.

The image pickup element driving portion 132 is constituted by, for example, a logic circuit. The image pickup element driving portion 132 generates a signal for driving the image pickup element 123 and applies a voltage corresponding to the signal to the image pickup element 123.

The image pickup signal input portion 133 is configured such that a CDS circuit (Correlated Double Sampling Circuit), an AGC (Automatic Gain Controller), and an ADC (Analog Digital Converter) are connected in series. When an electric signal is input from the image pickup element 123 to the image pickup signal input portion 133, the image pickup signal input portion 133 removes a fixed noise by the CDS circuit, adjusts a gain by the AGC, and converts an analog signal into a digital value by the ADC to carry out intensity correction, thereby generating an image pickup signal I0.

Figure 8:
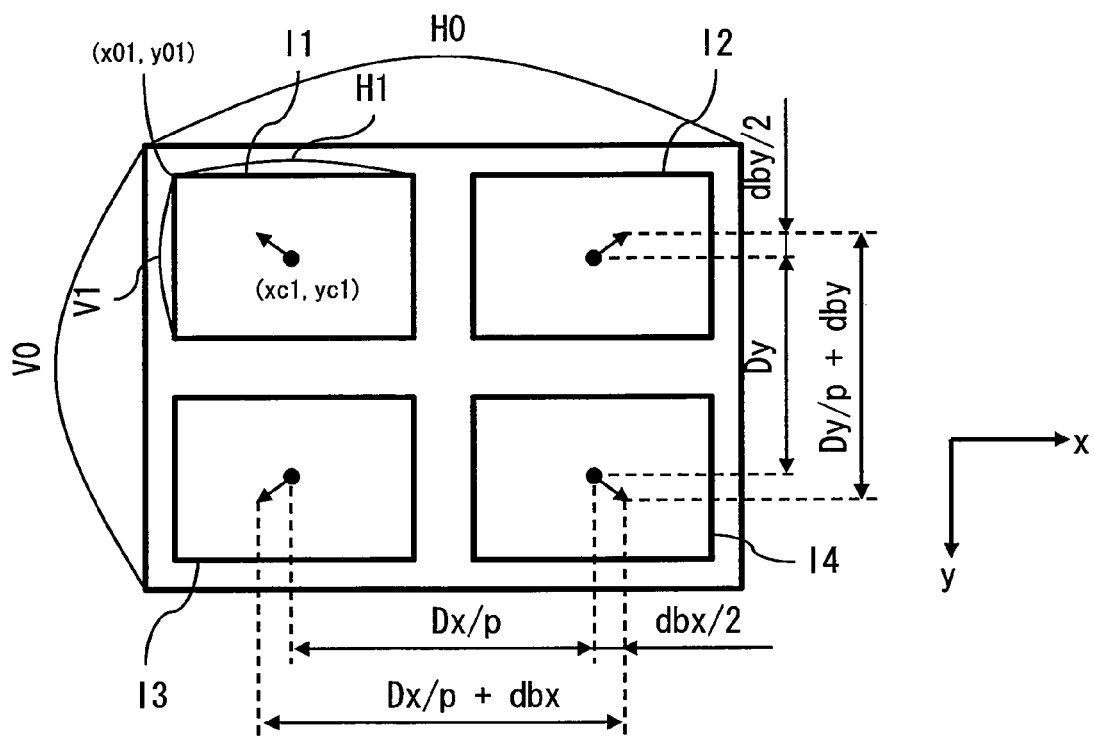
FIG. 8 is a diagram for explaining a cut-out position of an image pickup signal of the image pickup apparatus according to Embodiment 1 of the present invention.

FIG. 8 is a diagram for explaining a cut-out position of the image pickup signal of the image pickup apparatus according to Embodiment 1 of the present invention. The image pickup signal I0(x, y) input to the image pickup signal input portion 133 has H0 pixels in the x-axis direction and V0 pixels in the y-axis direction. The image pickup signal I0 (x, y) is input to the image pickup signal input portion 133 in order of I0(0, 0) ((x, y)=(0, 0)), I0(1, 0), I0(2, 0), ..., and I0(H0−1, V0−1), and is sequentially transferred to the input buffer 134. Moreover, the intensity correction is carried out as shown by Formula (8) below using intensity correction coefficients ks(x, y) at respective coordinates (x, y). The intensity correction coefficient ks(x, y) is determined by shooting a specific chart (white chart for example) in a checking step or the like, and stored in an EEPROM or a flash memory.

$$I0(x,y)=ks(x,y)\times I0(x,y) \quad (8)$$

The input buffer 134 is constituted by, for example, a DRAM (Dynamic Random Access Memory), and stores the image pickup signal I0 (x, y) input from the image pickup signal input portion 133.

The preprocessing portion 135 is constituted by a logic circuit, a DRAM, and the like. In the preprocessing portion 135, images according to subject images formed by the lens portions are cut out by the preprocessing calculating portion 135e from the image pickup signal I0 stored in the input buffer 134, and distortion correction processing is carried out to generate a first image pickup signal I1(x, y) corresponding to the first lens portion 131a, a second image pickup signal I2(x, y) corresponding to the second lens portion 131b, a third image pickup signal I3(x, y) corresponding to the third lens portion, and a fourth image pickup signal I4(x, y) corresponding to the fourth lens portion. These image pickup signals are respectively transferred to and stored in the first interstage buffer 135a, the second interstage buffer 135b, the third interstage buffer 135c, and the fourth interstage buffer 135d. As shown by Formula (9) below, the first image pickup signal I1(x, y) is generated from the image pickup signal I0(x, y) based on coordinate transformation tables tx1(x, y) and ty1(x, y). To be specific, the image pickup signal I0 at coordinates (tx1(x, y), ty1(x, y)) becomes the first image pickup signal I1(x, y). The coordinates (tx1(x, y), ty1(x, y)) may have a decimal point. In this case, an integer portion of the coordinate transformation table tx1(x, y) is shown by tx1i(x, y), and a fractional portion of the coordinate transformation table tx1(x, y) is shown by tx1f(x, y). The first image pickup signal I1(x, y) is calculated using four pixels as shown by Formula (10) below. Similarly, as shown by Formula (11) below, the second image pickup signal I2(x, y) is generated from the image pickup signal I0 (x, y) based on coordinate transformation tables tx2(x, y) and ty2(x, y). As shown by Formula (12) below, the third image pickup signal I3(x, y) is generated from the image pickup signal I0 (x, y) based on coordinate transformation tables tx3(x, y) and ty3(x, y). As shown by Formula (13) below, the fourth image pickup signal I4(x, y) is generated from the image pickup signal I0 (x, y) based on coordinate transformation tables tx4(x, y) and ty4(x, y). The coordinate transformation tables tx1(x, y), ty1(x, y), tx2(x, y), ty2(x, y), tx3(x, y), ty3(x, y), tx4(x, y), and ty4(x, y) are generated by the below-described temperature compensation calculating portion 139b.

$$I1(x,y)=I0(tx1(x,y),ty1(x,y)) \quad (9)$$

$$\begin{aligned}I1(x,y)=&\{1-tx1f(x,y)\}\times\{1-ty1f(x,y)\}\times I0(tx1i(x,y),ty1i(x,y))\\&+tx1f(x,y)\times\{1-ty1f(x,y)\}\times I0(tx1i(x,y)+1,ty1i(x,y))\\&+\{1-ty1f(x,y)\}\times ty1f(x,y)\times I0(tx1i(x,y),ty1i(x,y)+1)\\&+tx1f(x,y)\times ty1f(x,y)\times I0(tx1i(x,y)+1,ty1i(x,y)+1)\end{aligned} \quad (10)$$

$$I2(x,y)=I0(tx2(x,y),ty2(x,y)) \quad (11)$$

$$I3(x,y)=I0(tx3(x,y),ty3(x,y)) \quad (12)$$

$$I4(x,y)=I0(tx4(x,y),ty4(x,y)) \quad (13)$$

In a case where there is no distortion and expansion of the lens by the temperature is not generated, as shown in FIG. 8, the first image pickup signal I1(x, y) is a signal showing an image of a region which is cut out from the image pickup signal I0 and has an origin point (x01, y01), H1 pixels in the x-axis direction, and V1 pixels in the y-axis direction. The second image pickup signal I2(x, y) is a signal showing an image of a region which is cut out from the image pickup signal I0 and has an origin point (x02, y02), H1 pixels in the x-axis direction, and V1 pixels in the y-axis direction. The third image pickup signal I3(x, y) is a signal showing an image of a region which is cut out from the image pickup signal I0 and has an origin point (x03, y03), H1 pixels in the x-axis direction, and V1 pixels in the y-axis direction. The fourth image pickup signal I4(x, y) is a signal showing an image of a region which is cut out from the image pickup signal I0 and has an origin point (x04, y04), H1 pixels in the x-axis direction, and V1 pixels in the y-axis direction.

The first interstage buffer 135a is constituted by, for example, a DRAM. The first interstage buffer 135a sequentially loads the first image pickup signal I1 subjected to the distortion correction processing by the coordinate transformation using the coordinate transformation tables tx1(x, y) and ty1(x, y) and stores data of H1*V1 pixels (H1 pixels in the x-axis direction and V1 pixels in the y-axis direction). The second interstage buffer 135b is constituted by, for example, a DRAM. The second interstage buffer 135b sequentially loads the second image pickup signal I2 subjected to the distortion correction processing by the coordinate transformation using the coordinate transformation tables tx2(x, y) and ty2(x, y) and stores data of H1*V1 pixels (H1 pixels in the x-axis direction and V1 pixels in the y-axis direction). The third interstage buffer 135c is constituted by, for example, a DRAM. The third interstage buffer 135c sequentially loads the third image pickup signal I3 subjected to the distortion correction processing by the coordinate transformation using the coordinate transformation tables tx3(x, y) and ty3(x, y) and stores data of H1*V1 pixels (H1 pixels in the x-axis direction and V1 pixels in the y-axis direction). The fourth interstage buffer 135d is constituted by, for example, a DRAM. The fourth interstage buffer 135d sequentially loads the fourth image pickup signal I4 subjected to the distortion correction processing by the coordinate transformation using the coordinate transformation tables tx4(x, y) and ty4(x, y) and stores data of H1*V1 pixels (H1 pixels in the x-axis direction and V1 pixels in the y-axis direction).

The calculating portion 136 is constituted by the first calculating buffer 141a, the second calculating buffer 141b, the parallax calculating portion 142, and the distance calculating portion 143. Each of the first calculating buffer 141a and the second calculating buffer 141b is constituted by a SRAM (Static Random Access Memory). The parallax calculating portion 142 is constituted by a logic circuit, a CPU, or the like. The distance calculating portion 143 is constituted by a logic circuit, a CPU, or the like. The calculating portion 136 loads the first image pickup signal I1, the second image pickup signal I2, the third image pickup signal I3, and the fourth image pickup signal I4 by the block, and stores these image pickup signals in the first calculating buffer 141a and the second calculating buffer 141b. The parallax calculating portion 142 calculates the parallax based on, for example, data in the first calculating buffer 141a and the second calculating buffer 141b. The distance calculating portion 143 calculates a distance based on the obtained parallax and transfers the obtained distance data to the output buffer 137. Details of this operation will be described later.

The output buffer 137 is constituted by, for example, a DRAM. The output buffer 137 stores the image data and the distance data transferred from the calculating portion 136 and sequentially transfers the data to the input-output portion 138.

The input-output portion 138 communicates with the host CPU (not shown) and outputs the image data and the distance data to the host CPU, an external memory (not shown), and an external display apparatus (not shown), such as a liquid crystal display.

The temperature sensor signal input portion 139a is constituted by, for example, an ADC (Analog Digital Converter). The temperature sensor signal input portion 139a receives a temperature sensor signal that is an analog voltage signal from the temperature sensor 126. The temperature sensor signal input portion 139a converts the input analog signal to a digital value and outputs the value as a temperature value Th to the temperature compensation calculating portion 139b.

The temperature compensation calculating portion 139b generates based on the temperature value Th the coordinate transformation tables tx1(x, y), ty1(x, y), tx2(x, y), ty2(x, y), tx3(x, y), ty3(x, y), tx4(x, y), and ty4(x, y) utilized in the preprocessing portion 135. The movement distances of the optical axes of the lens portions 113a to 113d are estimated by conversion processing using the coordinate transformation tables. Hereinafter, details of the generation of the coordinate transformation tables will be explained.

In a case where the lens array 113 is increased in temperature, the lens portions 113a to 113d expand. Therefore, as shown by arrows in FIG. 2, the centers of the optical axes of the lens portions 113a to 113d move toward an outer side of the lens. The change in the interval between the optical axes due to this lens expansion are shown by Formulas (14) and (15) below. Here, dbx denotes the amount of change in the interval between the optical axes of the lens portions in the x-axis direction due to the temperature increase, and used as a unit thereof is a pixel pitch of the image pickup element 123. Moreover, dby denotes the amount of change in the interval between the optical axes of the lens portions in the y-axis direction due to the temperature increase, and used as a unit thereof is the pixel pitch of the image pickup element 123. Moreover, Dx denotes the interval between the optical axes of the lens portions in the x-axis direction at a reference temperature Th0, aL denotes a linear thermal expansion coefficient of the lens portion 113, and aS denotes a linear thermal expansion coefficient of the image pickup element 123. Moreover, Th denotes a sensor temperature as described above, Th0 denotes a reference temperature, p denotes the pixel pitch of the image pickup element 123, and Dy denotes the interval between the optical axes of the lens portions in the y-axis direction at the reference temperature Th0.

$$dbx=Dx \times (aL-aS) \times (Th-Th0)/p \quad (14)$$

$$dby=Dy \times (aL-aS) \times (Th-Th0)/p \quad (15)$$

Since the lens array 113 has a substantially circular shape, the lens portions expand isotropically by the temperature increase. To be specific, as shown in FIG. 8, each of the lens portions moves by half the change in the interval between the optical axes of the lens portions due to the temperature increase (by dbx/2 in the x-axis direction and dby/2 in the y-axis direction). The transformation tables tx1(x, y) and ty1(x, y) for the first image pickup signal I1(x, y) are generated as shown by Formulas (16), (17), and (18) below. Here, (x01, y01) denotes coordinates of the origin point in the image pickup signal I0 in a case where there is no distortion, (xc1, yc1) denotes coordinates of the center of the optical axis in the image pickup signal I1(x, y) at the reference temperature Th0, (−dbx/2, −dby/2) denotes the movement distance of the center of the optical axis due to the temperature increase, and each of kd2 and kd4 denotes a distortion coefficient. In Formula (18), ^2 denotes a square value. The transformation tables tx2(x, y) and ty2(x, y) for the second image pickup signal I2(x, y) are generated as shown by Formulas (19), (20), and (21) below. Here, (x02, y02) denotes coordinates of the origin point in the image pickup signal I0 in a case where there is no distortion, (xc2, yc2) denotes coordinates of the center of the optical axis in the image pickup signal I2(x, y) at the reference temperature Th0, (+dbx/2, −dby/2) denotes the movement distance of the center of the optical axis due to the temperature increase, and each of kd2 and kd4 denotes the distortion coefficient. In Formula (21), ^2 denotes the square value. The transformation tables tx3(x, y) and ty3(x, y) for the third image pickup signal I3(x, y) are generated as shown by Formulas (22), (23), and (24) below. Here, (x03, y03) denotes coordinates of the origin point in the image pickup signal I0 in a case where there is no distortion, (xc3, yc3) denotes coordinates of the center of the optical axis in the image pickup signal I3(x, y) at the reference temperature Th0, (−dbx/2, +dby/2) denotes the movement distance of the center of the optical axis due to the temperature increase, and each of kd2 and kd4 denotes the distortion coefficient. In Formula (24), ^2 denotes the square value. The transformation tables tx4(x, y) and ty4(x, y) for the fourth image pickup signal I4(x, y) are generated as shown by Formulas (25), (26), and (27) below. Here, (x04, y04) denotes coordinates of the origin point in the image pickup signal I0 in a case where there is no distortion, (xc4, yc4) denotes coordinates of the center of the optical axis in the image pickup signal I4(x, y) at the reference temperature Th0, (+dbx/2, +dby/2) denotes the movement distance of the center of the optical axis due to the temperature increase, and each of kd2 and kd4 denotes the distortion coefficient. In Formula (27), ^2 denotes the square value.

$$tx1(x,y)=x01+xc1+\{x-xc1-dbx/2\}\times(1+kd2\times r2+kd4\times r4) \quad (16)$$

$$ty1(x,y)=y01+yc1+\{y-yc1-dby/2\}\times(1+kd2\times r2+kd4\times r4) \quad (17)$$

$$r2=\{x-xc1-dbx/2\}^2+\{y-yc1-dby/2\}^2, r4=r2^2 \quad (18)$$

$$tx2(x,y)=x02+xc2+\{x-xc2+dbx/2\}\times(1+kd2\times r2+kd4\times r4) \quad (19)$$

$$ty2(x,y)=y02+yc2+\{y-yc2-dby/2\}\times(1+kd2\times r2+kd4\times r4) \quad (20)$$

$$r2=\{x-xc2+dbx/2\}^2+\{y-yc2-dby/2\}^2, r4=r2^2 \quad (21)$$

$$tx3(x,y)=x03+xc3+\{x-xc3-dbx/2\}\times(1+kd2\times r2+kd4\times r4) \quad (22)$$

$$ty3(x,y)=y03+yc3+\{y-yc3+dby/2\}\times(1+kd2\times r2+kd4\times r4) \quad (23)$$

$$r2=\{x-xc3-dbx/2\}^2+\{y-yc3+dby/2\}^2, r4=r2^2 \quad (24)$$

$$tx4(x,y)=x04+xc4+\{x-xc4+dbx/2\}\times(1+kd2\times r2+kd4\times r4) \quad (25)$$

$$ty4(x,y)=y04+yc4+\{y-yc4+dby/2\}\times(1+kd2\times r2+kd4\times r4) \quad (26)$$

$$r2=\{x-xc4+dbx/2\}^2+\{y-yc4+dby/2\}^2, r4=r2^2 \quad (27)$$

In a case where there is no distortion, the coordinate transformation carried out using the above coordinate transformation tables corresponds to an operation in which the images are cut out from the image pickup signal I0 (x, y) as shown by Formulas (28) to (31) below, and the parallel displacement is then carried out as shown by Formulas (32) to (35) below.

$$I1(x,y)=I0(x+x01,y+y01) \quad (28)$$

$$I2(x,y)=I0(x+x02,y+y02) \quad (29)$$

$$I3(x,y)=I0(x+x03,y+y03) \quad (30)$$

$$I4(x,y)=I0(x+x04,y+y04) \quad (31)$$

$$I1(x,y)=(x-dbx/2,y-dby/2) \quad (32)$$

$$I2(x,y)=I2(x+dbx/2,y-dby/2) \quad (33)$$

$$I3(x,y)=I3(y-dbx/2,x+dby/2) \quad (34)$$

$$I4(x,y)=I4(x+dbx/2,y+dby/2) \quad (35)$$

Figure 9A:
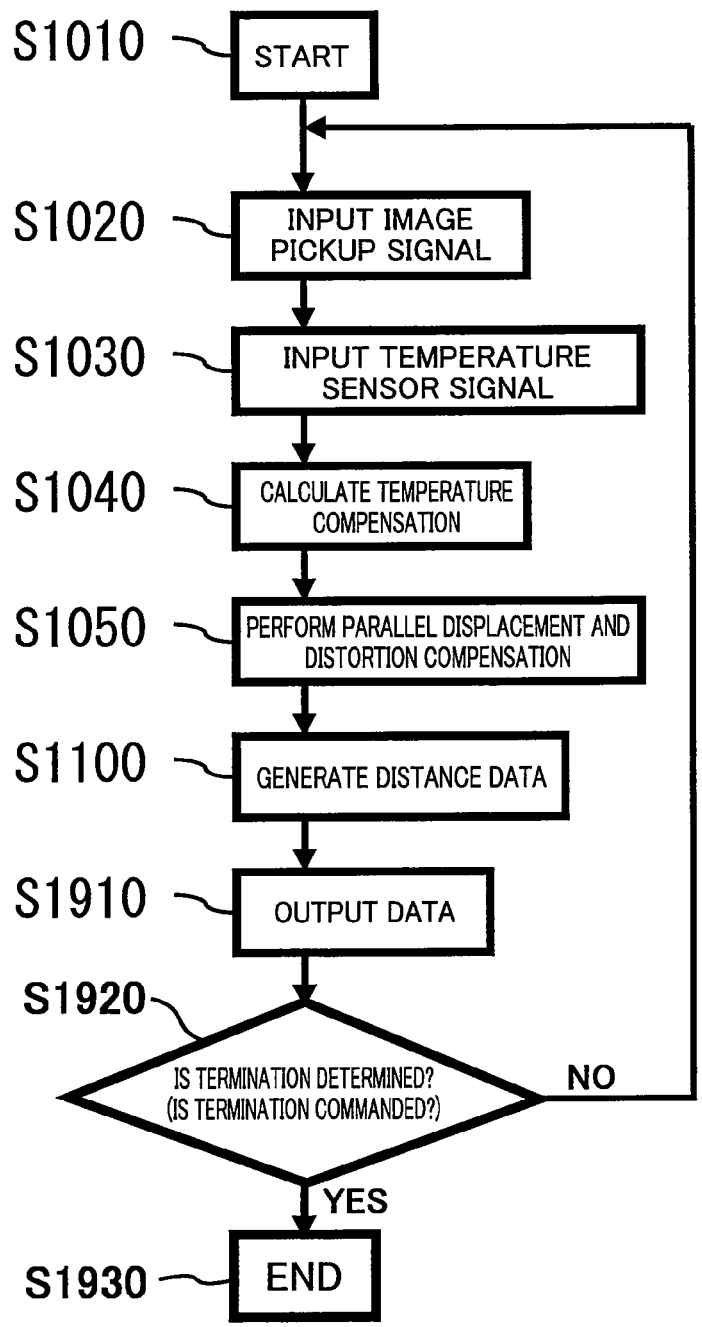
FIG. 9A is a flow chart showing an operation of the image pickup apparatus according to Embodiment 1 of the present invention.

FIG. 9A is a flow chart showing the operation of the image pickup apparatus according to Embodiment 1 of the present invention. The image pickup apparatus 101 is operated by the system control portion 131 of the SLSI 125 in accordance with this flow chart.

In Step S1010, the image pickup apparatus 101 starts operating. For example, the host CPU (not shown) commands the image pickup apparatus 101 via the input-output portion 136 to start operating. Thus, the image pickup apparatus 101 starts operating. Next, Step S1020 is executed.

In Step S1020, the image pickup signal is input. By the command of the system control portion 131, the image pickup element driving portion 132 outputs as needed a signal for carrying out the operation of an electronic shutter and the transfer of the image pickup signal. As a result, the image pickup signal I0 (x, y) having H0 pixels in the x-axis direction and V0 pixels in the y-axis direction is input to the image pickup signal input portion 133. In this case, the image pickup signal I0 (x, y) is input to the image pickup signal input portion 133 in order of I0(0, 0) ((x, y)=(0, 0)), I0(1,0), I0(2, 0), . . . , and I0(H0−1, V0−1), and is sequentially transferred to the input buffer 134. Next, Step S1030 is executed.

In Step S1030, the temperature sensor signal input portion 139a receives the temperature sensor signal from the temperature sensor 126, converts this signal into a digital value, and outputs the value as the temperature value Th to the temperature compensation calculating portion 139b. Next, Step S1040 is executed.

In Step S1040, as described above, the temperature compensation calculating portion 139b generates based on the temperature value Th the coordinate transformation tables tx1(x, y), ty1(x, y), tx2(x, y), ty2(x, y), tx3(x, y), ty3(x, y), tx4(x, y), and ty4(x, y) used in the preprocessing portion 135. Next, Step S1050 is executed.

In Step S1050, as described above, the preprocessing calculating portion 135e cuts out, from the image pickup signal I0 stored in the input buffer 134, the images according to the subject images formed by the lens portions and carries out the parallel displacement processing (parallel displacement processing realized by compensating the coordinate transformation tables such that the parallel displacement of the optical axes toward the outer side of the lens array 113 is carried out by half the change in the interval between the optical axes of the lens portions due to the temperature increase (by dbx/2 in the x-axis direction and dby/2 in the y-axis direction) and the distortion correction to generate the first image pickup signal I1(x, y) corresponding to the first lens portion 113a, the second image pickup signal I2(x, y) corresponding to the second lens portion 113b, the third image pickup signal I3(x, y) corresponding to the third lens portion 113c, and the fourth image pickup signal I4(x, y) corresponding to the fourth lens portion 113d. These image pickup signals are respectively transferred to and stored in the first interstage buffer 135a, the second interstage buffer 135b, the third interstage buffer 135c, and the fourth interstage buffer 135d.

Figure 9B:
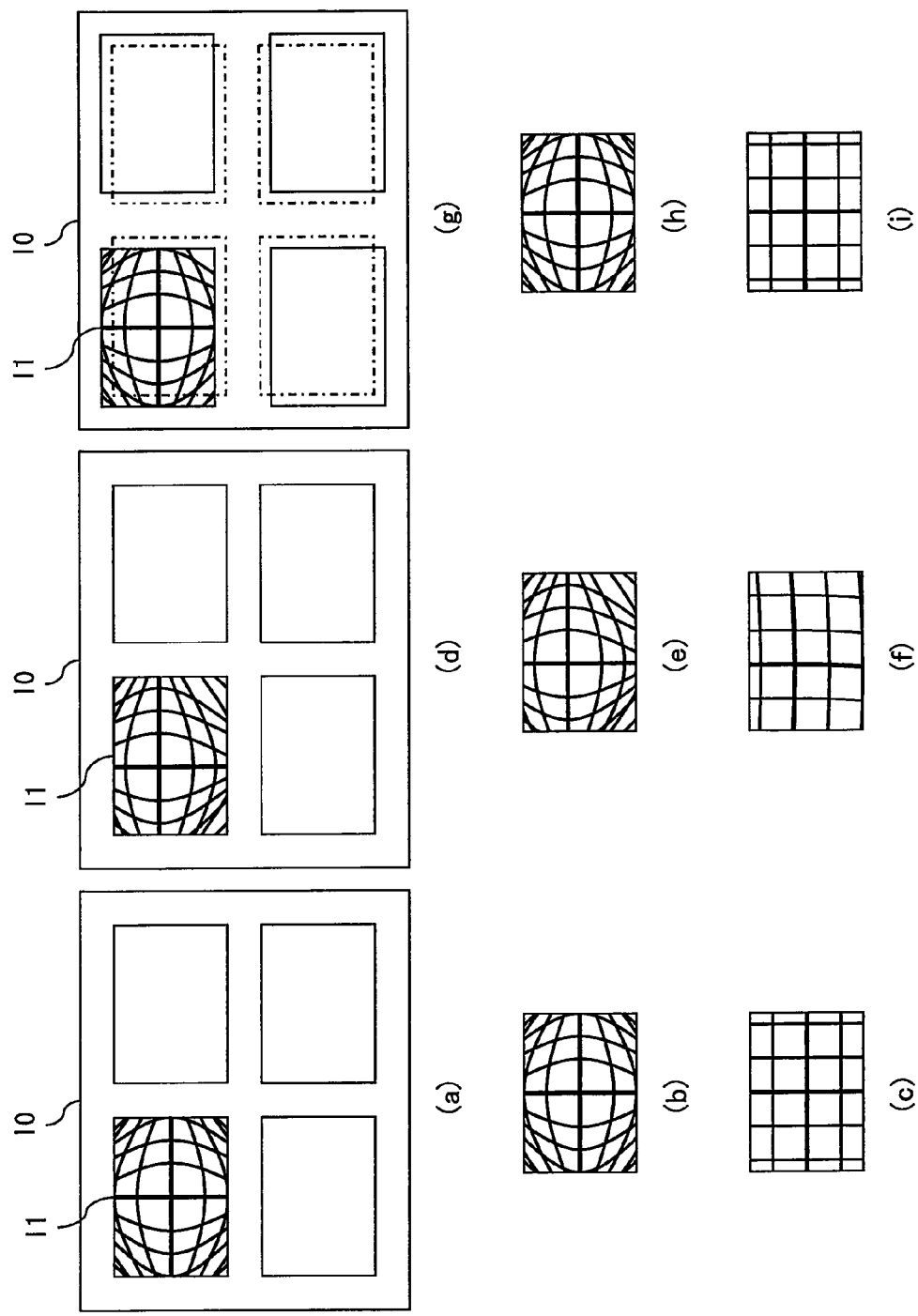
FIG. 9B is a diagram showing the image pickup signals before and after being subjected to parallel displacement processing and/or distortion correction processing.

The following will explain that the accuracy of the distortion correction improves by temperature compensation. FIG. 9B is a diagram showing the image pickup signals before and after being subjected to the parallel displacement processing and/or the distortion correction processing. FIG. 9B shows the image pickup signal (image) obtained by taking an image of a subject that is a flat plate on which a grid pattern is drawn and a cross drawn at a center thereof is shown in boldface. For simplicity, only the subject image of the first image pickup signal is shown, and the subject images of the second to fourth image pickup signals are omitted. Here, the image pickup apparatus 101 is placed to face the flat plate such that an intersection point of the cross at the center is positioned on the optical axis of the first lens portion 113a. FIG. 9B(a) is a diagram showing the image pickup signal at the reference temperature. FIG. 9B(b) is a diagram showing the first image pickup signal in a case where the parallel displacement processing and the distortion correction processing are not carried out. As shown in FIG. 9B(b), the thick cross is positioned at the center at the reference temperature. FIG. 9B(c) is a diagram showing the first image pickup signal in a case where the parallel displacement processing is not carried out and the distortion correction processing is carried out. As shown in FIG. 9B(c), the grid pattern is reproduced by the distortion correction. FIG. 9B(d) is a diagram showing the image pickup signal at a temperature higher than the reference temperature. FIG. 9B(e) is the first image pickup signal in a case where the parallel displacement processing and the distortion correction processing are not carried out. As shown in FIG. 9B(e), in a case where the temperature is higher than the reference temperature, the subject image moves in an upper left direction as the optical axis of the first lens portion 113a moves in the upper left direction. Therefore, the intersection point of the thick cross moves in the upper left direction from the center. FIG. 9B(f) is a diagram showing the first image pickup signal in a case where the parallel displacement processing is not carried out and the distortion correction processing is carried out. As shown in FIG. 9B(f), since the center of the optical axis of the distortion correction and the center of the distortion do not correspond to each other, the grid pattern is not completely reproduced, and the distortion remains. FIG. 9B(g) is a diagram showing the image pickup signal at a temperature higher than the reference temperature. FIG. 9B(h) is a diagram showing the first image pickup signal in a case where the parallel displacement processing is carried out and the distortion correction processing is not carried out. As shown in FIG. 9B(h), in a case where the temperature is higher than the reference temperature, the subject image moves in the upper left direction as the optical axis of the first lens portion 113a moves in the upper left direction. However, the movement in the upper left direction is compensated by the parallel displacement processing, and the intersection point of the thick cross is therefore positioned at the center. FIG. 9B(i) is a diagram showing the first image pickup signal in a case where the parallel displacement processing and the distortion correction processing are carried out. As shown in FIG. 9B(i), since the center of the optical axis of the distortion correction and the center of the distortion correspond to each other, the grid pattern is reproduced. As above, the parallel displacement is carried out by setting the coordinate transformation tables such that the parallel displacement of the origin point of the optical axis toward the outer side is caused at high temperature. Thus, the accuracy of the distortion correction improves, and this improves the accuracy of the parallax calculation. As a result, the accuracy of a distance measurement calculation improves.

Figure 9C:
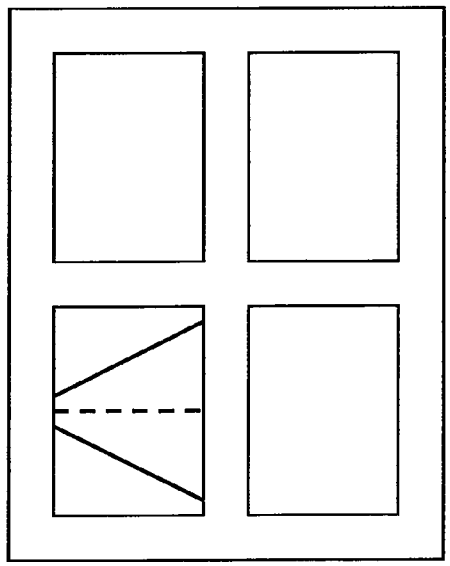
FIG. 9C is a diagram showing the image pickup signals before and after being subjected to the parallel displacement processing.
Figure 9C:
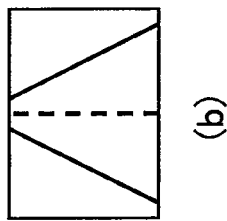
Figure 9C:
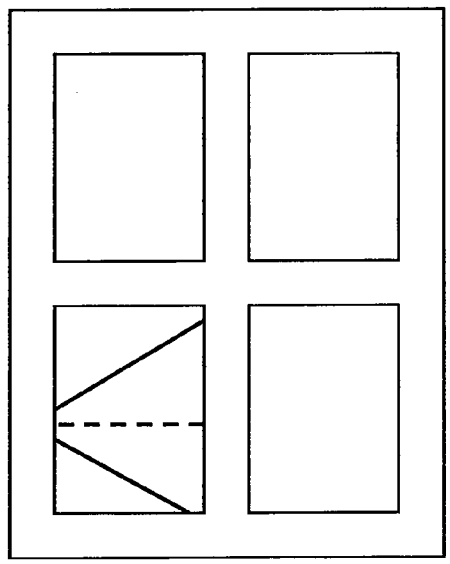
Figure 9C:
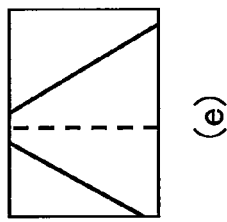
Figure 9C:
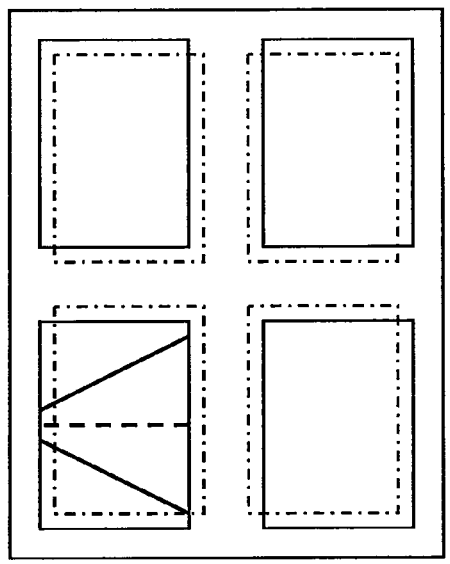
Figure 9C:
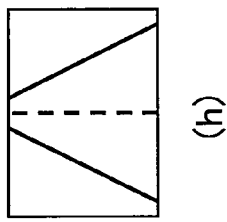

Next, the following will explain that the subject image does not move by the temperature compensation. FIG. 9C is a diagram showing the image pickup signals (images) before and after being subjected to the parallel displacement processing. For ease of explanation, FIG. 9C shows the image pickup signals in a case where the lens portions (the first lens portion 113a, the second lens portion 113b, the third lens portion 113c, and the fourth lens portion 113d) do not have the distortion, and the distortion correction is therefore not carried out. FIG. 9C shows the image pickup signals in a case where the image pickup apparatus 101 is placed at a front portion a vehicle, and only an image of a traffic lane as a subject in front of the vehicle is taken. FIG. 9C(a) is a diagram showing the image pickup signal at the reference temperature. FIG. 9C(b) is a diagram showing the first image pickup signal in a case where the parallel displacement processing is not carried out. As shown in FIG. 9C(b), the subject is positioned at the center at the reference temperature. FIG. 9C(d) is a diagram showing the image pickup signal at a temperature higher than the reference temperature. FIG. 9C(e) is a diagram showing the first image pickup signal in a case where the parallel displacement processing is not carried out. As shown in FIG. 9C(e), in a case where the temperature is higher than the reference temperature, the subject image moves in the upper left direction as the optical axis of the first lens portion 113a moves in the upper left direction. FIG. 9C(g) is a diagram showing the image pickup signal at a temperature higher than the reference temperature. FIG. 9C(h) is a diagram showing the first image pickup signal in a case where the parallel displacement processing is carried out. As shown in FIG. 9C(h), in a case where the temperature is higher than the reference temperature, the subject image moves in the upper left direction as the optical axis of the first lens portion 113a moves in the upper left direction. However, the movement in the upper left direction is compensated by the parallel displacement processing, and the subject is therefore positioned at the center. As above, the parallel displacement is carried out by setting the coordinate transformation tables such that the parallel displacement of the origin point of the optical axis toward the outer side is caused at high temperature. Thus, the movement of the center of the image of the subject is suppressed. Next, Step S1100 is executed.

In Step S1100, the calculating portion 136 generates the distance data and sequentially transfers the data to the second output buffer 137b. Details of this operation will be described later. In addition to the distance data, the calculating portion 136 generates the image data and sequentially transfers the data to the first output buffer 137a. Next, Step S1910 is executed.

In Step S1910, the data is output to outside. The input-output portion 138 outputs the image data on the first output buffer 137a and the distance data on the second output buffer 137b to the host CPU and the external display apparatus. Next, Step S1920 is executed.

In Step S1920, whether or not the operation is terminated is determined. For example, the system control portion 131 communicates with the host CPU via the input-output portion 136 to request a command regarding whether or not the operation is terminated. In a case where the host CPU commands the termination (YES in S1920), the image pickup apparatus 101 proceeds to Step S1930 and terminates the operation. In contrast, in a case where the host CPU does not command the termination (NO in S1920), the image pickup apparatus 101 continues the operation, and next, Step S1020 is executed. To be specific, as long as the host CPU does not command the termination, a loop of Steps S1020, S1030, S1040, S1050, S1100, and S1910 is continuously executed.

Figure 10:
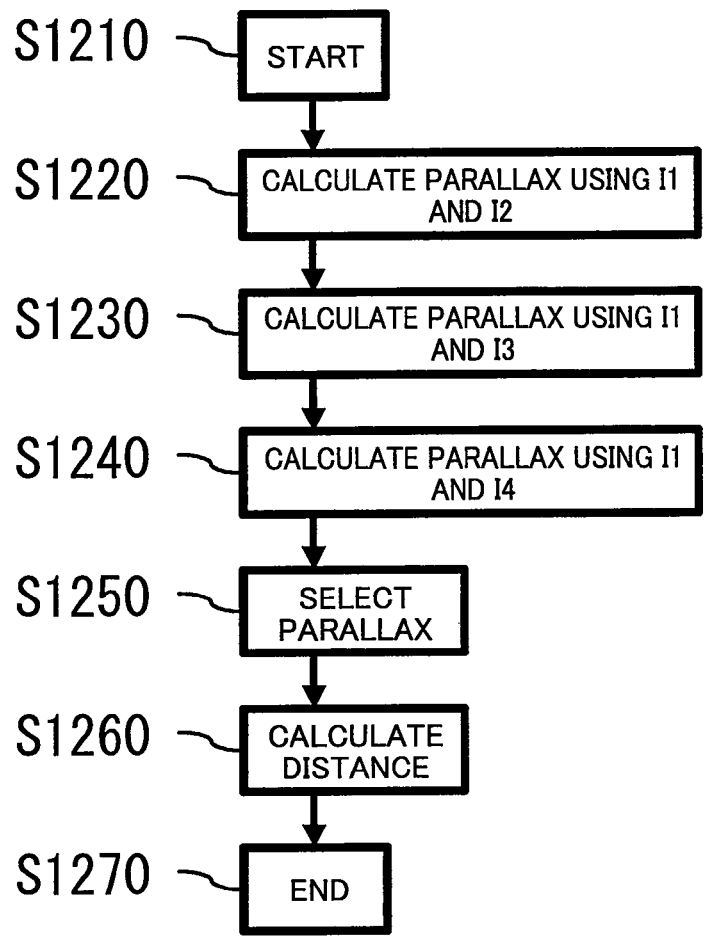
FIG. 10 is a flow chart showing an operation of a calculating portion of the image pickup apparatus according to Embodiment 1 of the present invention.

Next, details of the operation of Step S1100 will be explained. FIG. 10 is a flow chart showing the operation of the calculating portion of the image pickup apparatus according to Embodiment 1 of the present invention. The flow chart of FIG. 10 shows details of the operation of Step S1100. In the calculation of Step S1100, first, Step S1210 is executed.

In Step S1210, the operation of the calculation starts. Next, Step S1220 is executed.

Figure 11:
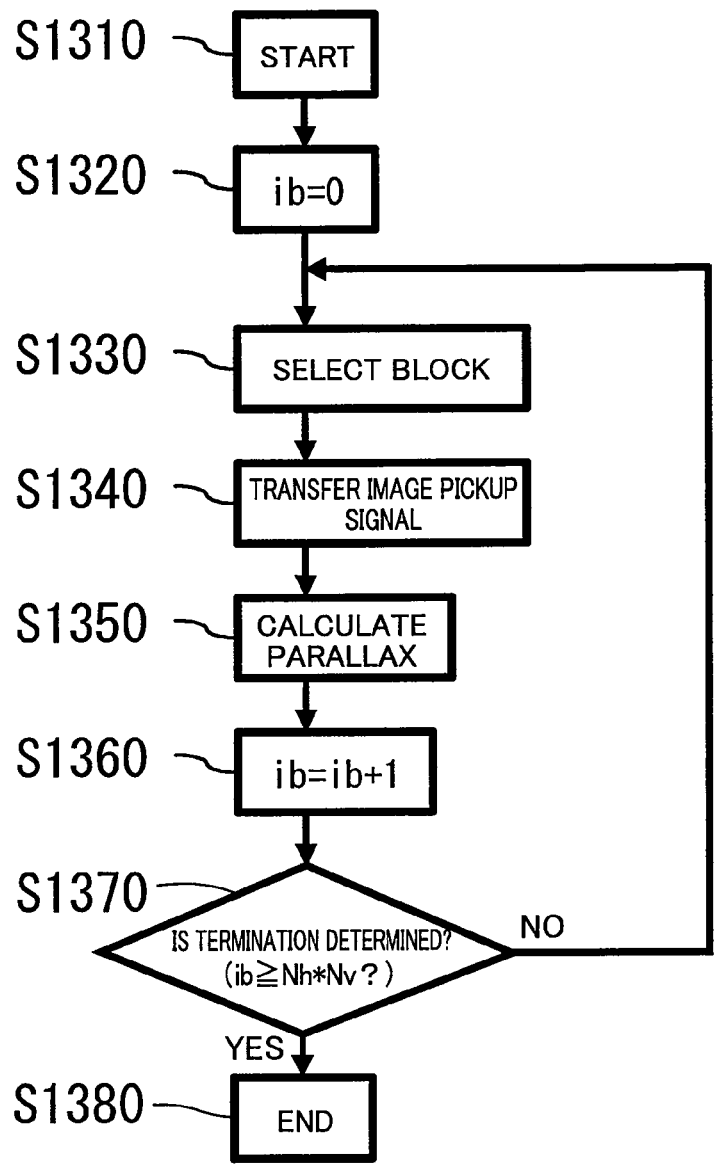
FIG. 11 is a flow chart showing an operation of a parallax calculation utilizing a first image pickup signal and a second image pickup signal in the image pickup apparatus according to Embodiment 1 of the present invention.

In Step S1220, the parallax calculation utilizing the first image pickup signal and the second image pickup signal is executed. FIG. 11 is a flow chart showing the operation of the parallax calculation utilizing the first image pickup signal and the second image pickup signal in the image pickup apparatus according to Embodiment 1 of the present invention. The flow chart of FIG. 11 shows details of the operation of Step S1220. In the calculation of Step S1220, first, Step S1310 is executed.

In Step S1310, the operation of the parallax calculation utilizing the first image pickup signal and the second image pickup signal starts. Next, Step S1320 is executed.

In Step S1320, a block index ib is initialized to 0. Next, Step S1330 is executed.

Figure 12:
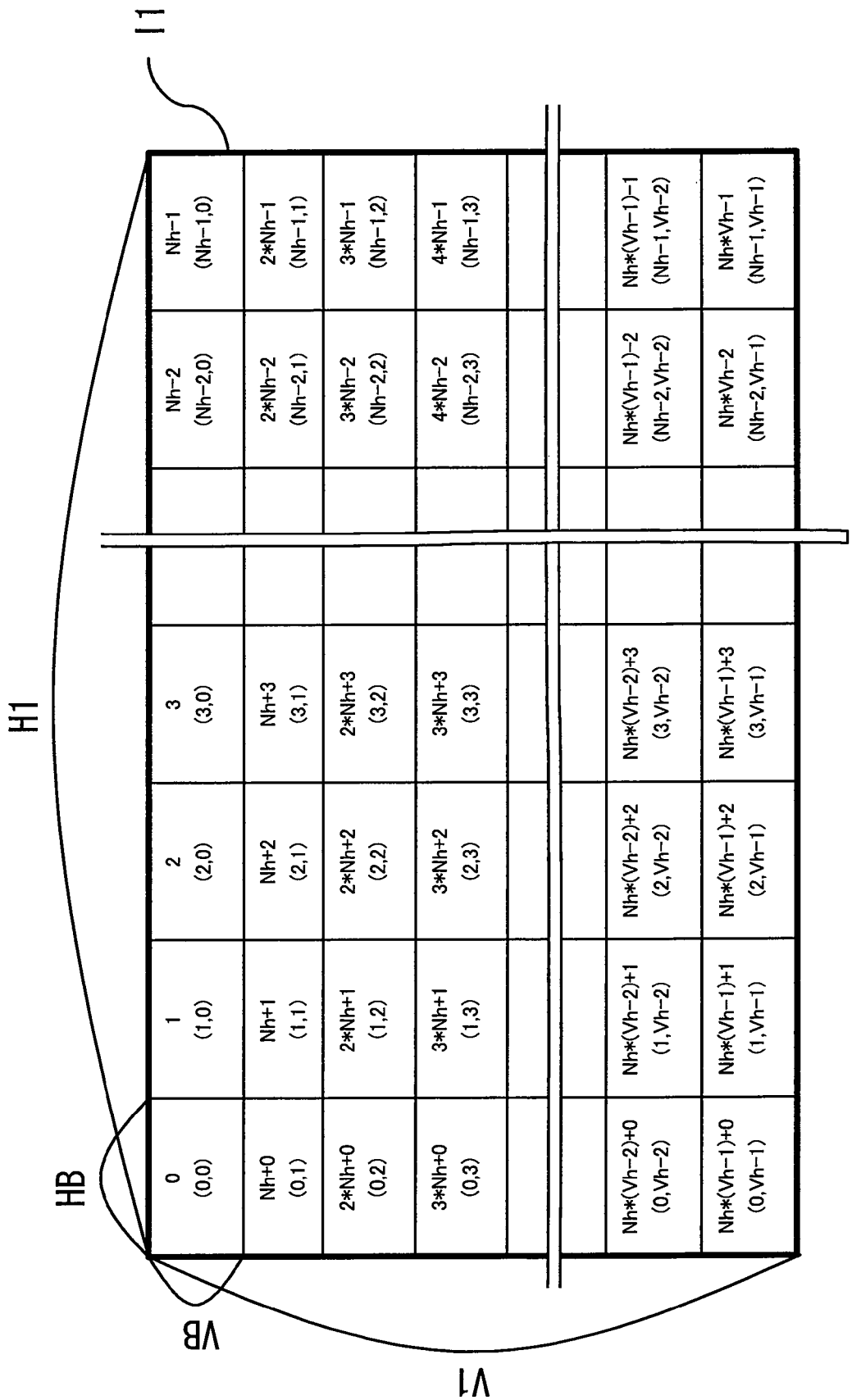
FIG. 12 is a diagram for explaining divided blocks and calculation order of the first image pickup signal in the parallax calculation utilizing the first image pickup signal and the second image pickup signal in the image pickup apparatus according to Embodiment 1 of the present invention.
Figure 13:
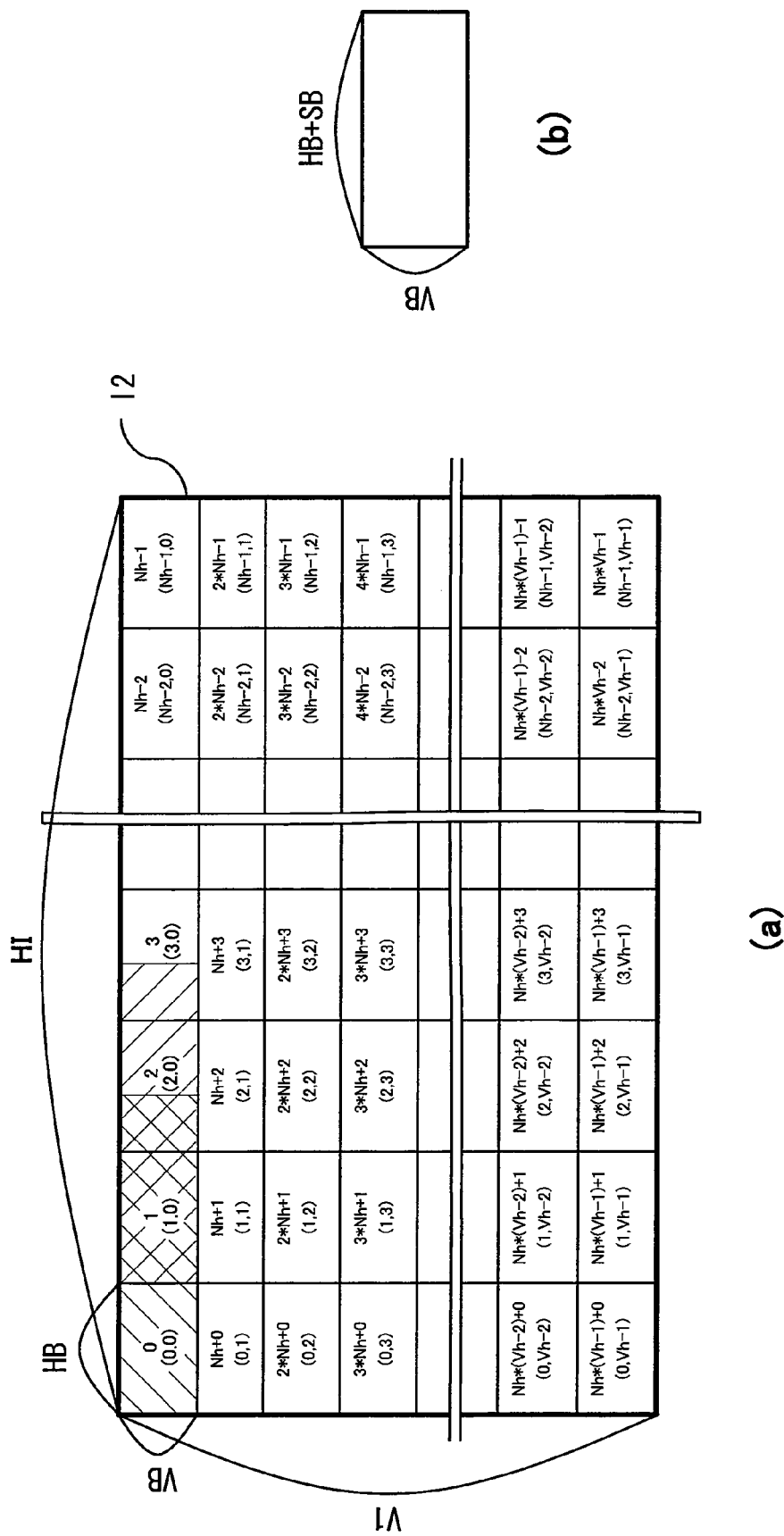
FIG. 13 is a diagram for explaining divided blocks and calculation order of the second image pickup signal in the parallax calculation utilizing the first image pickup signal and the second image pickup signal in the image pickup apparatus according to Embodiment 1 of the present invention.

In Step S1330, a block is selected. FIG. 12 is a diagram for explaining divided blocks and calculation order of the first image pickup signal in the parallax calculation utilizing the first image pickup signal and the second image pickup signal in the image pickup apparatus according to Embodiment 1 of the present invention. FIG. 13 is a diagram for explaining divided blocks and calculation order of the second image pickup signal in the parallax calculation utilizing the first image pickup signal and the second image pickup signal in the image pickup apparatus according to Embodiment 1 of the present invention.

As shown in FIG. 12, the first image pickup signal I1 is divided into rectangular blocks each having HB pixels in the x-axis direction and VB pixels in the y-axis direction. Adjacent blocks are arranged so as to be displaced from each other by HB pixels in the x-axis direction or VB pixels in the y-axis direction. Therefore, blocks adjacent to each other in the x-axis direction do not overlap each other, and blocks adjacent to each other in the y-axis direction do not overlap each other. As a result, the first image pickup signal I1 has Nh blocks in the x-axis direction and Nv blocks in the y-axis direction.

The second image pickup signal I2 is divided into rectangular blocks each having (HB+SB) pixels in the x-axis direction and VB pixels in the y-axis direction as shown in FIG. 13(b). Adjacent blocks are arranged so as to be displaced from each other by HB pixels in the x-axis direction or VB pixels in the y-axis direction. Therefore, although blocks adjacent to each other in the x-axis direction overlap each other, blocks adjacent to each other in the y-axis direction do not overlap each other. As a result, as shown in FIG. 13(a), the second image pickup signal I2 has Nh blocks in the x-axis direction and Nv blocks in the y-axis direction. In a case where the block positioned on a right side of the drawing cannot have (HB+SB) pixels in the x-axis direction, a right end portion of the block in the x-axis direction is omitted accordingly. The following will explain an example in which HB is 32 and VB is 32.

In FIGS. 12 and 13, a number shown on an upper level of each block denotes the block index ib. Moreover, in FIGS. 12 and 13, coordinates (ibx, iby) shown on a lower level of each block denote that the block is an ibx-th block in the x-axis direction and an iby-th block in the y-axis direction. Here, ibx is from 0 to Nh-1, and iby is from 0 to Vh-1. In Step S1330, a block B(ib) (block B(ibx, iby) shown by coordinates (ibx, iby)) shown by the block index ib in FIGS. 12 and 13 is selected. Next, Step S1340 is executed.

In Step S1340, the image pickup signal is transferred. More specifically, the first image pickup signal I1 of the coordinates corresponding to the block B(ibx, iby) selected in Step S1330 is calculated using Formula (9), and the obtained signal is transferred to the first calculating buffer 141a. A value at the coordinates (x, y) of the first calculating buffer 141a is Bc1(x, y). Here, since HB is 32 and VB is 32, x is from 0 to 31, and y is from 0 to 31.

Moreover, the second image pickup signal I2 of the coordinates corresponding to the block B(ibx, iby) selected in Step S1330 is calculated using Formula (11), and the obtained signal is transferred to the second calculating buffer 141b. A value at the coordinates (x, y) of the second calculating buffer 141b is Bc2(x, y). Here, since HB is 32 and VB is 32, x is from 0 to 31+SB, and y is from 0 to 31.

For example, when ib is 0, the image pickup signal I1 of 1024 pixels surrounded by the coordinates (0, 0) and the coordinates (31,31) is transferred to the first calculating buffer 141a, and the image pickup signal I2 of (1024+32*SB) pixels which are marked with diagonal lines extending in a diagonally upper right direction in FIG. 13 and surrounded by the coordinates (0, 0) and the coordinates (31+SB, 31) is transferred to the second calculating buffer 141b.

Next, when ib is 1, the image pickup signal I1 of 1024 pixels surrounded by the coordinates (32, 0) and the coordinates (63, 31) is transferred to the first calculating buffer 141a. In this case, the second calculating buffer 141b requires the image pickup signal I2 of (1024+32*SB) pixels which are marked with diagonal lines extending in a diagonally lower right direction in FIG. 13 and surrounded by the coordinates (32, 0) and the coordinates (63+SB, 31). However, since a portion (region of 32*SB pixels surrounded by the coordinates (32, 0) and the coordinates (31+SB, 31)) which overlaps the block whose ib is 0 has already been transferred to the second calculating buffer 141b, only 1024 pixels surrounded by the coordinates (32+SB, 0) and the coordinates (63+SB, 31) may be newly transferred to the second calculating buffer 141b. Note that the signals are suitably transferred to the first output buffer 137a as output image data. Next, Step S1350 is executed.

Figure 14:
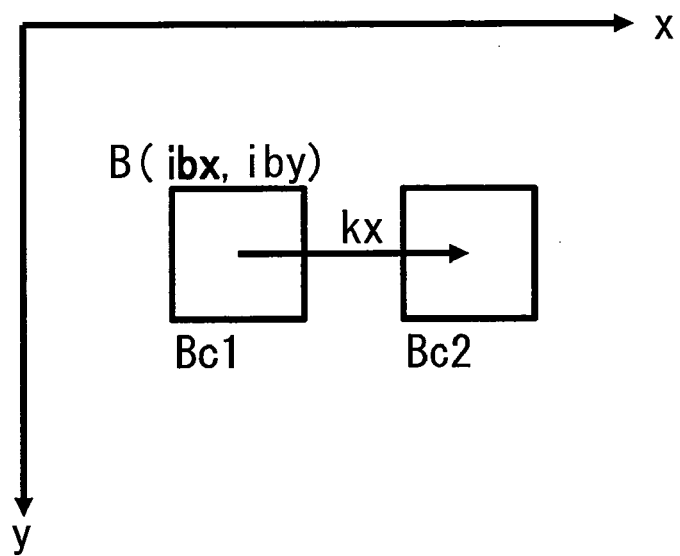
FIG. 14 is a diagram for explaining a calculation region of a parallax evaluated value when the first image pickup signal and the second image pickup signal are utilized in the image pickup apparatus according to Embodiment 1 of the present invention.

In Step S1350, the parallax calculation is executed. First, a parallax evaluated value R(kx) is calculated. Here, kx denotes the displacement amount showing how much amount an image is displaced, and kx is changed to be 0, 1, 2, . . . , and SB. FIG. 14 is a diagram for explaining a calculation region of the parallax evaluated value when the first image pickup signal and the second image pickup signal are utilized in the image pickup apparatus according to Embodiment 1 of the present invention. As shown in FIG. 14, a region indicated by Bc1 is a region of the first calculating buffer 141a, and a region indicated by Bc2 is a region which is in the second calculating buffer 141b and is away from the block indicated by Bc1 by the displacement amount kx in the x-axis direction. Then, a sum of absolute differences (SAD) shown by Formula (36) below is calculated in a case where the displacement amount kx is from 0 to SB, thereby obtaining the parallax evaluated value R(kx). Here, $\Sigma\Sigma$ denotes the sum in the x-axis direction and the y-axis direction, and is changed from 0 to HB−1 (herein, 31) in the x-axis direction and 0 to VB−1 (herein, 31) in the y-axis direction.

$$R(kx) = \Sigma\Sigma |Bc1(x,y) - Bc2(x+kx,y)| \quad (36)$$

The parallax evaluated value R(kx) shows how much data Bc1 of the first calculating buffer 141a and data Bc2 of the second calculating buffer 141b in the region away from the data Bc1 by kx in the x-axis direction are correlated to each other. The smaller the parallax evaluated value R(kx) is, the stronger the correlation therebetween is (that is, in a case where the parallax evaluated value R(kx) is small, the data Bc1 and the data Bc2 are similar to each other). Here, since the data Bc1 of the first calculating buffer 141a is the transferred first image pickup signal I1, and the data Bc2 of the second calculating buffer 141b is the transferred second image pickup signal I2, this parallax evaluated value R(kx) shows how much the first image pickup signal I1 and the corresponding second image pickup signal I2 are correlated to each other.

Figure 15:
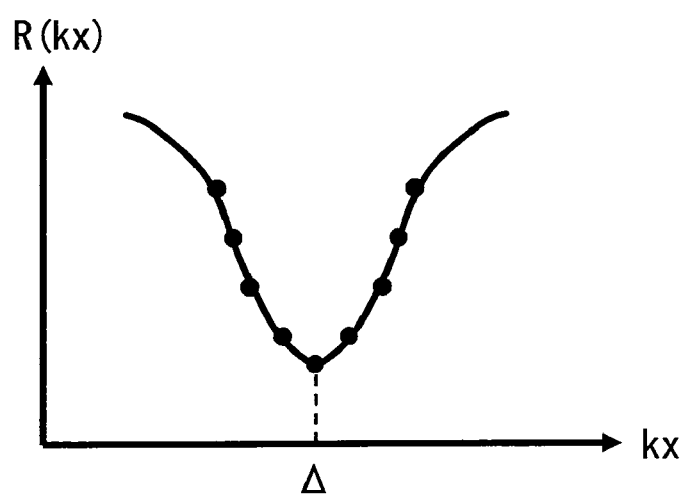
FIG. 15 is a diagram for explaining a relation between a parallax and the parallax evaluated value in the parallax calculation utilizing the first image pickup signal and the second image pickup signal in the image pickup apparatus according to Embodiment 1 of the present invention.

FIG. 15 is a diagram for explaining a relation between the parallax and the parallax evaluated value in the parallax calculation utilizing the first image pickup signal and the second image pickup signal in the image pickup apparatus according to Embodiment 1 of the present invention. As shown in FIG. 15, the parallax evaluated value R(kx) changes depending on the value of the displacement amount kx and becomes a minimal value when the displacement amount kx is $\Delta$. This shows that the data Bc1 of the first calculating buffer 141a is most strongly correlated to (is most similar to) the data Bc2 of the second calculating buffer 141b which is located in the region away from the data Bc1 of the first calculating buffer 141a by $\Delta$ in the x-axis direction. Therefore, it is found that the parallax in the x-axis direction between the data Bc1 of the first calculating buffer 141a and the data Bc2 of the second calculating buffer 141b is $\Delta$. Then, this parallax $\Delta$ is stored as a parallax value $\Delta 12$(ibx, iby) of the block B(ibx, iby) in the case of utilizing the first image pickup signal and the second image pickup signal.

Figure 16:
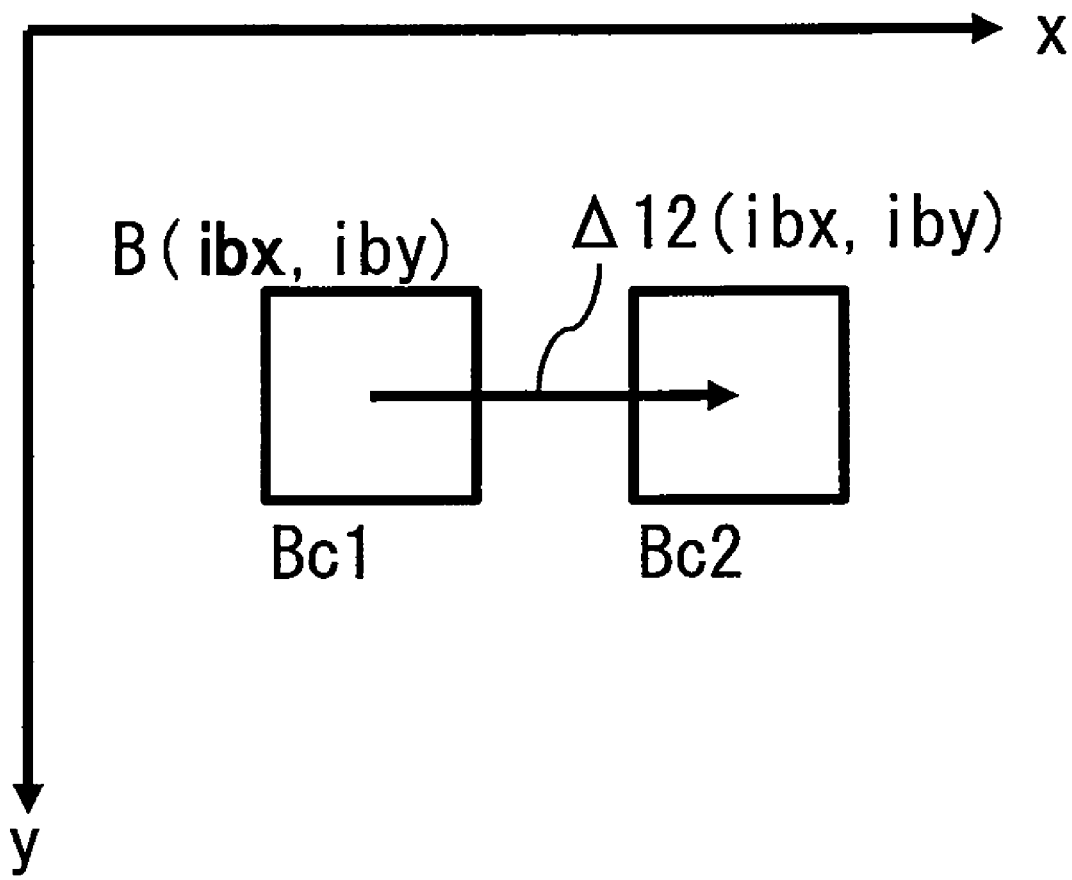
FIG. 16 is a diagram for explaining the calculation region of reliability of the parallax evaluated value in the parallax calculation utilizing the first image pickup signal and the second image pickup signal in the image pickup apparatus according to Embodiment 1 of the present invention.

Next, the reliability of the parallax value $\Delta 12$(ibx, iby) of the block B(ibx, iby) in the case of utilizing the first image pickup signal and the second image pickup signal is calculated. FIG. 16 is a diagram for explaining the calculation region of the reliability of the parallax evaluated value in the parallax calculation utilizing the first image pickup signal and the second image pickup signal in the image pickup apparatus according to Embodiment 1 of the present invention. The data Bc1 is data stored in the region of the first calculating buffer 141a. The data Bc2 is data which is in the second calculating buffer 141b and is away from the data Bc1 by $\Delta 12$(ibx, iby) in the x-axis direction. As shown by Formula (37) below, regarding the data Bc1 (x, y) and the data Bc2(x+$\Delta 12$(ibx, iby), y) in respective regions, a normalized correlation coefficient is regarded as reliability E12(ibx, iby) of the block B(ibx, iby) in the case of utilizing the first image pickup signal and the second image pickup signal. $\Sigma\Sigma$ denotes the sum in the x-axis direction and the y-axis direction, and is changed from 0 to HB−1 (herein, 31) in the x-axis direction and 0 to VB−1 (herein, 31) in the y-axis direction. Next, Step S1360 is executed.

$$E12(ibx,iby)=\Sigma\Sigma(Bc1(x,y)-avg1)(Bc2(x+\Delta 12(ibx,iby),y)-avg2)/\Sigma\Sigma(Bc1(x,y)-avg1)(Bc1(x,y)-avg1)/\Sigma\Sigma(Bc2(x+\Delta 12(ibx,iby),y)-avg2)(Bc2(x+\Delta 12(ibx,iby),y)-avg2)$$

$$avg1=\Sigma\Sigma Bc1(x,y)/(HB*VB)$$

$$avg2=\Sigma\Sigma Bc2(x+\Delta 12(ibx,iby),y)/(HB*VB) \qquad (37)$$

In Step S1360, 1 is added to the block index ib. Next, Step S1370 is executed.

In Step S1370, whether or not the parallax calculation utilizing the first image pickup signal and the second image pickup signal is terminated is determined. When the block index ib is less than Nh*Nv (NO in S1370), the process returns to Step S1330 to calculate the parallax of the next block. In contrast, when the block index ib is Nh*Nv or more (YES in S1370), it is determined that the parallaxes of all the blocks are calculated, and next, Step S1380 is executed.

In Step S1380, the parallax calculation utilizing the first image pickup signal and the second image pickup signal is terminated, and the process returns to an upper routine.

Thus, in the parallax calculation utilizing the first image pickup signal and the second image pickup signal, the parallax value $\Delta 12$(ibx, iby) of the block B(ibx, iby) shown by the block index ib and having 32*32 pixels and the reliability E12(ibx, iby) are calculated. Here, 12 denotes that the first image pickup signal and the second image pickup signal are utilized, and (ibx, iby) denotes the coordinates shown on the lower level in each block in FIG. 12 (ibx changes from 0 to Nh−1, and iby changes from 0 to Vh−1). Next, Step S1230 of FIG. 10 is executed.

Figure 17:
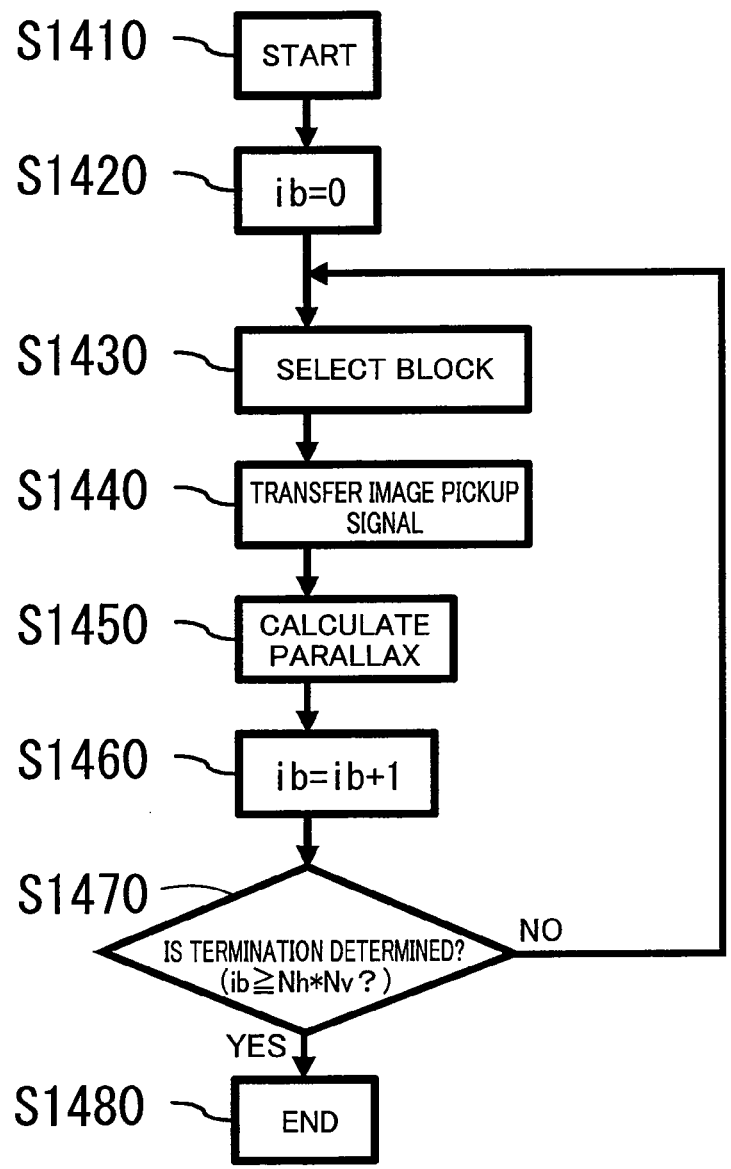
FIG. 17 is a flow chart showing an operation of the parallax calculation utilizing the first image pickup signal and a third image pickup signal in the image pickup apparatus according to Embodiment 1 of the present invention.

In Step S1230, the parallax calculation utilizing the first image pickup signal and the third image pickup signal is executed. FIG. 17 is a flow chart showing the operation of the parallax calculation utilizing the first image pickup signal and the third image pickup signal in the image pickup apparatus according to Embodiment 1 of the present invention. The flow chart of FIG. 17 shows details of the operation of Step S1230. In the calculation of Step S1230, first, Step S1410 is executed.

In Step S1410, the operation of the parallax calculation utilizing the first image pickup signal and the third image pickup signal is started. Next, Step S1420 is executed.

In Step S1420, the block index ib is initialized to 0. Next, Step S1430 is executed.

Figure 18:
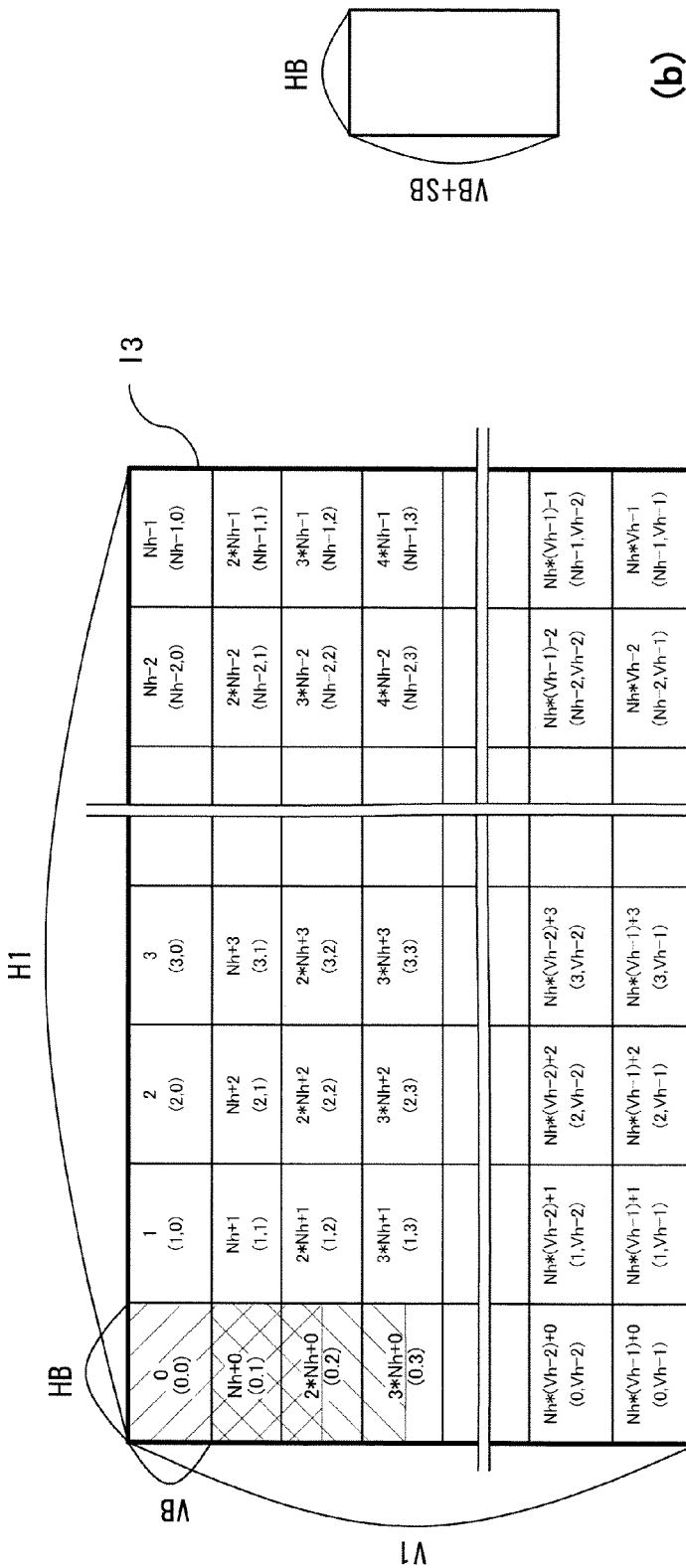
FIG. 18 is a diagram for explaining divided blocks and calculation order of the third image pickup signal in the parallax calculation utilizing the first image pickup signal and the third image pickup signal in the image pickup apparatus according to Embodiment 1 of the present invention.

In Step S1430, a block is selected. The block division of the first image pickup signal is the same as in Step S1330, so that an explanation thereof is omitted. FIG. 18 is a diagram for explaining divided blocks and calculation order of the third image pickup signal in the parallax calculation utilizing the first image pickup signal and the third image pickup signal in the image pickup apparatus according to Embodiment 1 of the present invention. The third image pickup signal I3 is divided into rectangular blocks each having HB pixels in the x-axis direction and (VB+SB) pixels in the y-axis direction as shown in FIG. 18(b). Adjacent blocks are arranged so as to be displaced from each other by HB pixels in the x-axis direction or VB pixels in the y-axis direction. Therefore, blocks adjacent to each other in the y-axis direction overlap each other, and blocks adjacent to each other in the x-axis direction do not overlap each other. As a result, as shown in FIG. 18(a), the third image pickup signal I3 has Nh blocks in the x-axis direction and Nv blocks in the y-axis direction. In a case where the block positioned on a lower side of the drawing cannot have (VB+SB) pixels in the y-axis direction, a lower end portion of the block in the y-axis direction is omitted accordingly. The following will explain an example in which HB is 32 and VB is 32.

In FIG. 18, a number shown on the upper level of each block denotes the block index ib. Moreover, in FIG. 18, coordinates (ibx, iby) shown on the lower level of each block denote that the block is an ibx-th block in the x-axis direction and an iby-th block in the y-axis direction. Here, ibx is from 0 to Nh−1, and iby is from 0 to Vh−1. In Step S1430, the block B(ib) (block B(ibx, iby) shown by coordinates (ibx, iby)) shown by the block index ib in FIGS. 12 and 18 is selected. Next, Step S1440 is executed.

In Step S1440, the image pickup signal is transferred. More specifically, the first image pickup signal I1 of the coordinates corresponding to the block B(ibx, iby) selected in Step S1430 is calculated using Formula (9), and the obtained signal is transferred to the first calculating buffer Bc1. A value at the coordinates (x, y) of the first calculating buffer 141a is Bc1(x, y). Here, since HB is 32 and VB is 32, x is from 0 to 31, and y is from 0 to 31.

Moreover, the third image pickup signal I3 of the coordinates corresponding to the block B(ibx, iby) selected in Step S1430 is calculated using Formula (12), and the obtained signal is transferred to the second calculating buffer 141b. A value at the coordinates (x, y) of the second calculating buffer 141b is Bc2(x, y).

Here, since HB is 32 and VB is 32, x is from 0 to 31, and y is from 0 to 31+SB.

For example, when ib is 0, the image pickup signal I1 of 1024 pixels surrounded by the coordinates (0, 0) and the coordinates (31, 31) is transferred to the first calculating buffer 141a, and the image pickup signal I2 of (1024+32*SB) pixels which are marked with diagonal lines extending in a diagonally upper right direction in FIG. 18 and surrounded by the coordinates (0, 0) and the coordinates (31, 31+SB) is transferred to the second calculating buffer 141b.

Next, when ib is 1, the image pickup signal I1 of 1024 pixels surrounded by the coordinates (0, 32) and the coordinates (31, 63) is transferred to the first calculating buffer 141a. In this case, the second calculating buffer 141b requires the image pickup signal I2 of (1024+32*SB) pixels which are marked with diagonal lines extending in a diagonally lower right direction in FIG. 18 and surrounded by the coordinates (0, 32) and the coordinates (31, 63+SB). However, since a portion (region of 32*SB pixels surrounded by the coordinates (0, 32) and the coordinates (31, 31+SB)) which overlaps the block whose ib is 0 has already been transferred to the second calculating buffer 141a, only 1024 pixels surrounded by the coordinates (0, 32+SB) and the coordinates (31, 63+SB) may be newly transferred to the second calculating buffer 141b. Next, Step S1450 is executed.

Figure 19:
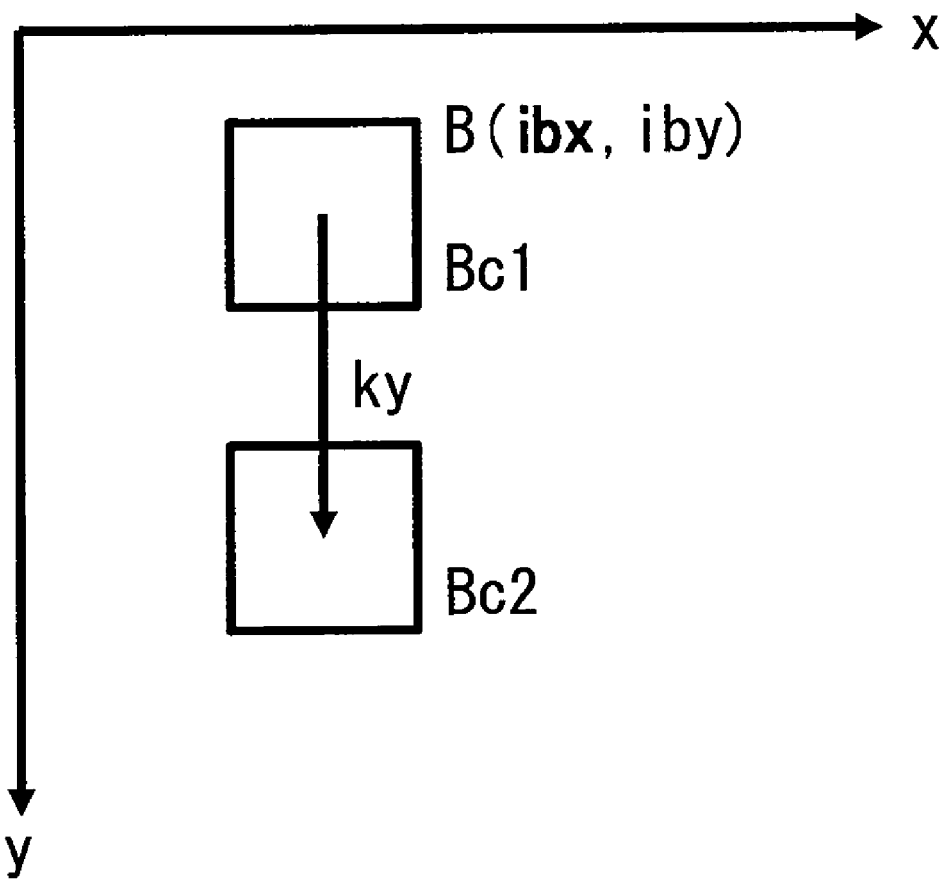
FIG. 19 is a diagram for explaining the calculation region of the parallax evaluated value when the first image pickup signal and the third image pickup signal are utilized in the image pickup apparatus according to Embodiment 1 of the present invention.

In Step S1450, the parallax calculation is executed. First, a parallax evaluated value R(ky) is calculated. Here, ky denotes the displacement amount showing how much amount an image is displaced, and ky is changed to be 0, 1, 2, . . . , and SB. FIG. 19 is a diagram for explaining the calculation region of the parallax evaluated value when the first image pickup signal and the third image pickup signal are utilized in the image pickup apparatus according to Embodiment 1 of the present invention. As shown in FIG. 19, a region indicated by Bc1 is a region of the first calculating buffer 141a, and a region indicated by Bc2 is a region which is in the second calculating buffer 141b and is away from the block shown by Bc1 by the displacement amount ky in the y-axis direction. Then, the sum of absolute differences shown by Formula (38) below is calculated in a case where the displacement amount ky is from 0 to SB, thereby obtaining the parallax evaluated value R(ky). Here, $\Sigma\Sigma$ denotes the sum in the x-axis direction and the y-axis direction, and is changed from 0 to HB−1 (herein, 31) in the x-axis direction and 0 to VB−1 (herein, 31) in the y-axis direction.

$$R(ky) = \Sigma\Sigma |Bc1(x,y) - Bc2(x,y+ky)| \quad (38)$$

The parallax evaluated value R(ky) shows how much the data Bc1 of the first calculating buffer 141a and the data Bc2 of the second calculating buffer 141b in the region away from the data Bc1 by ky in the y-axis direction are correlated to each other. The smaller the parallax evaluated value R(ky) is, the stronger the correlation therebetween is (that is, in a case where the parallax evaluated value R(ky) is small, the data Bc1 and the data Bc2 are similar to each other). Here, since the data Bc1 of the first calculating buffer 141a is the transferred first image pickup signal I1, and the data Bc2 of the second calculating buffer 141b is the transferred third image pickup signal I3, this parallax evaluated value R(ky) shows how much the first image pickup signal I1 and the corresponding third image pickup signal I3 are correlated to each other.

Figure 20:
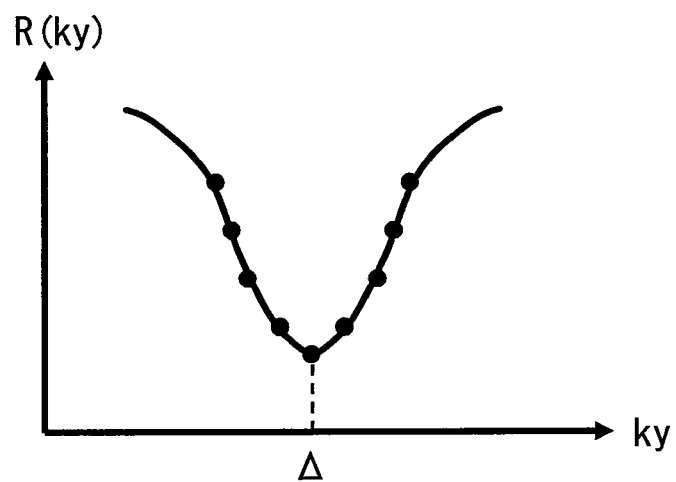
FIG. 20 is a diagram for explaining the relation between the parallax and the parallax evaluated value in the parallax calculation utilizing the first image pickup signal and the third image pickup signal in the image pickup apparatus according to Embodiment 1 of the present invention.

FIG. 20 is a diagram for explaining the relation between the parallax and the parallax evaluated value in the parallax calculation utilizing the first image pickup signal and the third image pickup signal in the image pickup apparatus according to Embodiment 1 of the present invention. As shown in FIG. 20, the parallax evaluated value R(ky) changes depending on the value of the displacement amount ky and becomes a minimal value when the displacement amount ky is Δ. This shows that the data Bc1 of the first calculating buffer 141a is most strongly correlated to (is most similar to) the data Bc2 of the second calculating buffer 141b which is located in the region away from the data Bc1 of the first calculating buffer 141a by Δ in the y-axis direction. Therefore, it is found that the parallax in the y-axis direction between the data Bc1 of the first calculating buffer 141a and the data Bc2 of the second calculating buffer 141b is Δ. Then, this parallax Δ is stored as a parallax value Δ13(ibx, iby) of the block B(ibx, iby) in the case of utilizing the first image pickup signal and the third image pickup signal.

Figure 21:
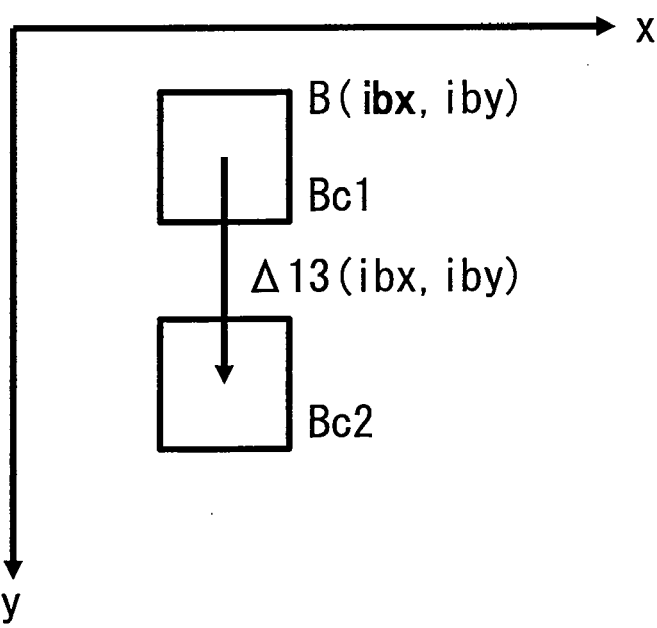
FIG. 21 is a diagram for explaining the calculation region of the reliability of the parallax evaluated value in the parallax calculation utilizing the first image pickup signal and the third image pickup signal in the image pickup apparatus according to Embodiment 1 of the present invention.

Next, the reliability of the parallax value Δ13(ibx, iby) of the block B(ibx, iby) in the case of utilizing the first image pickup signal and the third image pickup signal is calculated. FIG. 21 is a diagram for explaining the calculation region of the reliability of the parallax evaluated value in the parallax calculation utilizing the first image pickup signal and the third image pickup signal in the image pickup apparatus according to Embodiment 1 of the present invention. The region indicated by Bc1 is a region of the first calculating buffer 141a. The region indicated by Bc2 is a region which is in the second calculating buffer 141b and is away from the region indicated by Bc1 by Δ13(ibx, iby) in the y-axis direction. As shown by Formula (39) below, regarding the data Bc1(x, y) and the data Bc2(x, y+Δ13(ibx, iby)) in respective regions, a normalized correlation coefficient is regarded as reliability E13(ibx, iby) of the block B(ibx, iby) in the case of utilizing the first image pickup signal and the third image pickup signal. $\Sigma\Sigma$ denotes the sum in the x-axis direction and the y-axis direction, and is changed from 0 to HB−1 (herein, 31) in the x-axis direction and 0 to VB−1 (herein, 31) in the y-axis direction. Next, Step S1460 is executed.

$$E13(ibx,iby) = \Sigma\Sigma(Bc1(x,y) - avg1)(Bc2(x,y+\Delta 13(ibx,iby)) - avg2)/\Sigma\Sigma(Bc1(x,y) - avg1)(Bc1(x,y) - avg1)/$$
$$\Sigma\Sigma(Bc2(x,y+\Delta 13(ibx,iby)) - avg2)(Bc2(x,y+\Delta 13(ibx,iby)) - avg2)$$

$$avg1 = \Sigma\Sigma Bc1(x,y)/(HB*VB)$$

$$avg2 = \Sigma\Sigma Bc2(x,y+\Delta 13(ibx,iby))/(HB*VB) \quad (39)$$

In Step S1460, 1 is added to the block index ib. Next, Step S1470 is executed.

In Step S1470, whether or not the parallax calculation utilizing the first image pickup signal and the third image pickup signal is terminated is determined. When the block index ib is less than Nh*Nv (NO in S1470), the process returns to Step S1430 to calculate the parallax of the next block. In contrast, when the block index ib is Nh*Nv or more (YES in S1470), it is determined that the parallaxes of all the blocks are calculated, and next, the process proceeds to Step S1480.

In Step S1480, the parallax calculation utilizing the first image pickup signal and the third image pickup signal is terminated, and the process returns to the upper routine. Thus, in the parallax calculation utilizing the first image pickup signal and the third image pickup signal, the parallax value Δ13(ibx, iby) of the block B(ibx, iby) shown by the block index ib and having 32*32 pixels and the reliability E13(ibx, iby) are calculated. Here, 13 denotes that the first image pickup signal and the third image pickup signal are utilized, and (ibx, iby) denotes the coordinates shown on the lower level in each block in FIG. 12 (ibx changes from 0 to Nh−1, and iby changes from 0 to Vh−1). Next, Step S1240 of FIG. 10 is executed.

Figure 22:
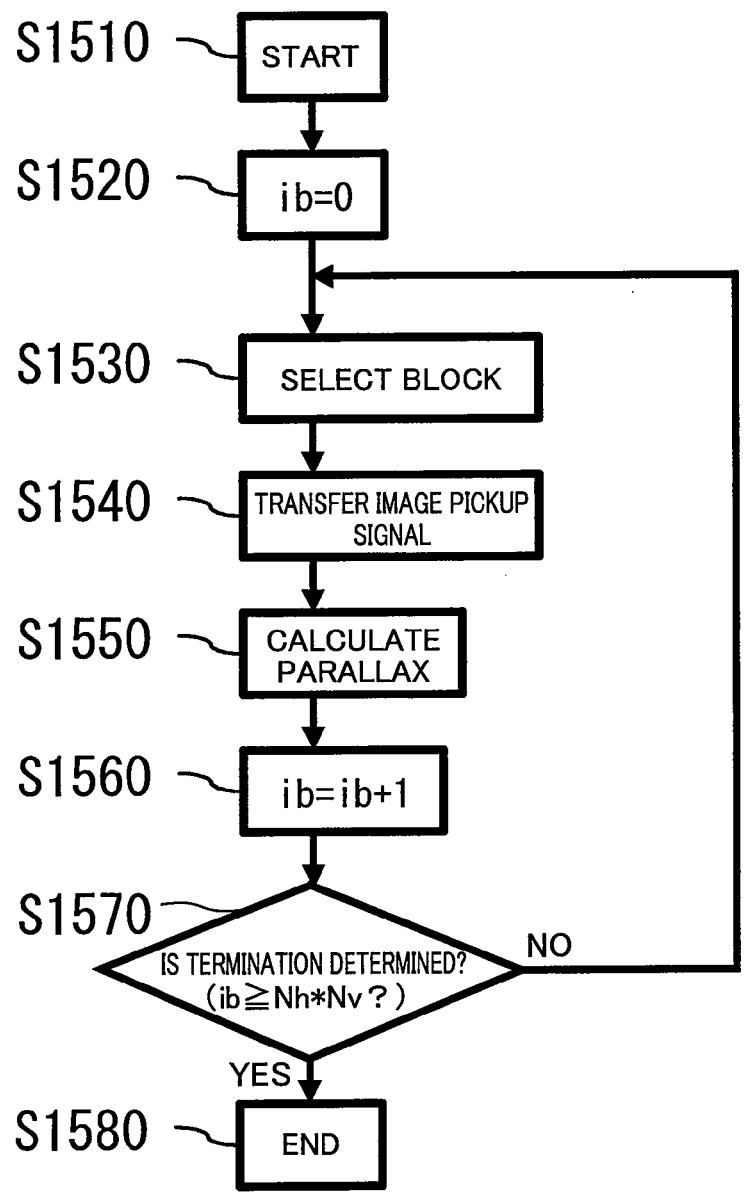
FIG. 22 is a flow chart showing an operation of the parallax calculation utilizing the first image pickup signal and a fourth image pickup signal in the image pickup apparatus according to Embodiment 1 of the present invention.

In Step S1240, the parallax calculation utilizing the first image pickup signal and the fourth image pickup signal is executed. FIG. 22 is a flow chart showing the operation of the parallax calculation utilizing the first image pickup signal and the fourth image pickup signal in the image pickup apparatus according to Embodiment 1 of the present invention. The flow chart of FIG. 22 shows details of the operation of Step S1240. In the calculation of Step S1240, first, Step S1510 is executed.

In Step S1510, the operation of the parallax calculation utilizing the first image pickup signal and the fourth image pickup signal is started. Next, Step S1520 is executed.

In Step S1520, the block index ib is initialized to 0. Next, Step S1530 is executed.

Figure 23:
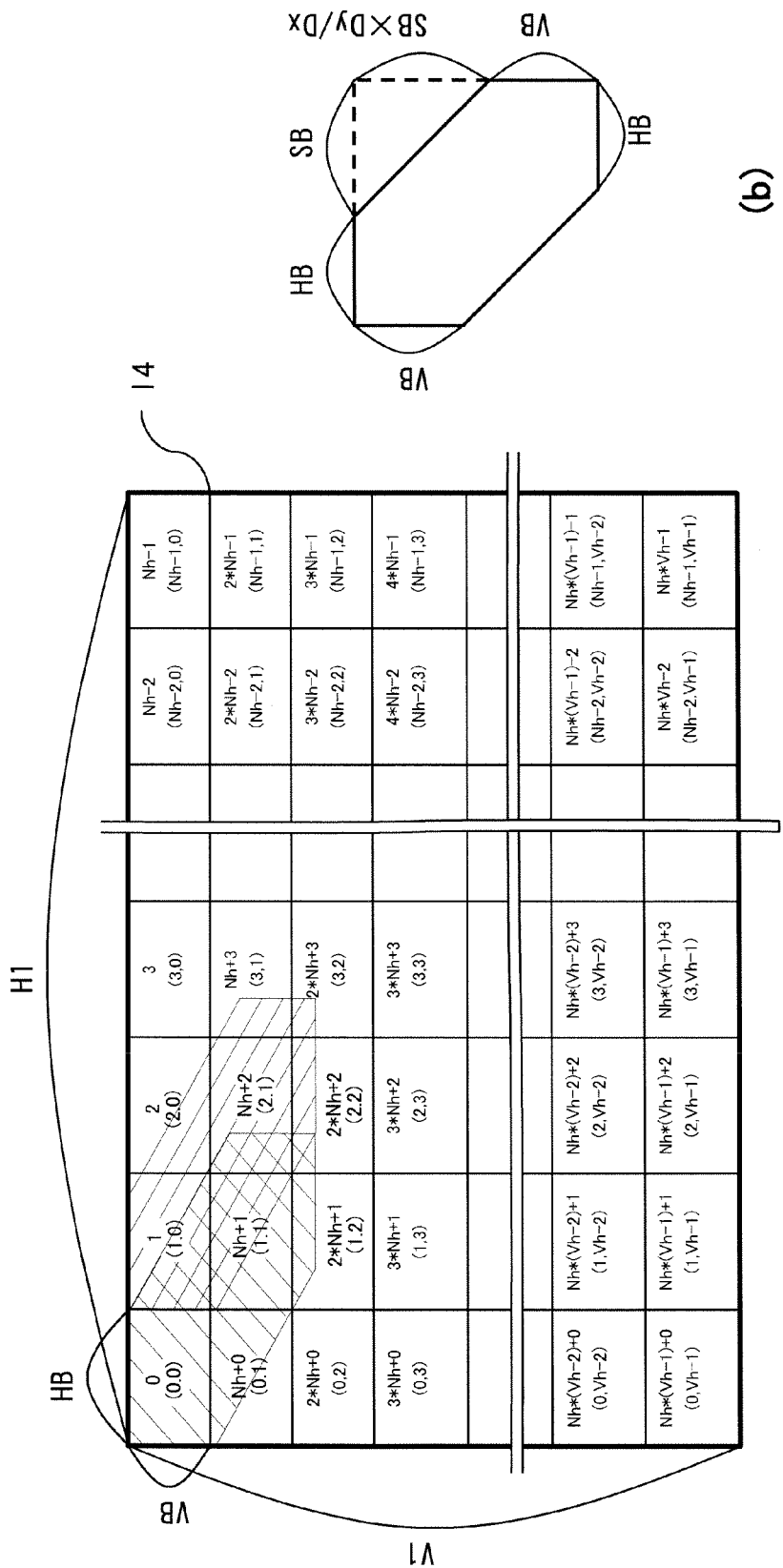
FIG. 23 is a diagram for explaining divided blocks and calculation order of the fourth image pickup signal in the parallax calculation utilizing the first image pickup signal and the fourth image pickup signal in the image pickup apparatus according to Embodiment 1 of the present invention.

In Step S1530, a block is selected. The block division of the first image pickup signal is the same as in Step S1320, so that an explanation thereof is omitted. FIG. 23 is a diagram for explaining divided blocks and calculation order of the fourth image pickup signal in the parallax calculation utilizing the first image pickup signal and the fourth image pickup signal in the image pickup apparatus according to Embodiment 1 of the present invention. In FIG. 23, the fourth image pickup signal I4 is divided into blocks each having (HB+SB)*(VB+SB*Dy/Dx)−SB*SB*Dy/Dx pixels as in FIG. 23(*b*). Adjacent blocks are arranged so as to be displaced from each other by HB pixels in the x-axis direction and VB pixels in the y-axis direction. The fourth image pickup signal I4 has Nh blocks in the x-axis direction and Nv blocks in the y-axis direction. Moreover, in FIG. 23, regarding the block (upper right, lower right, and lower left blocks for example) which cannot have the shape of the block shown in FIG. 23(*b*), a part of the block is suitably omitted (for example, the upper right block becomes a rectangular block of HB*VB pixels). Hereinafter, Embodiment 1 will explain an example in which HB is 32 and VB is 32. Moreover, in the fourth image pickup signal I4, the length of the block in the x-axis direction and the length of the block in the y-axis direction are set to be different from each other. This is because an interval between the lenses in the x-axis direction and an interval between the lenses in the y-axis direction are different from each other, and a ratio of the parallax in the x-axis direction to the parallax in the y-axis direction becomes Dx:Dy.

In FIG. 23, a number shown on the upper level of each block denotes the block index ib. Moreover, in FIG. 23, coordinates (ibx, iby) shown on the lower level of each block denote that the block is an ibx-th block in the x-axis direction and an iby-th block in the y-axis direction. Here, ibx is from 0 to Nh−1, and iby is from 0 to Vh−1. In Step S1530, the block B(ib) (block B(ibx, iby) shown by coordinates (ibx, iby)) shown by the block index ib in FIG. 23 is selected. Next, Step S1540 is executed.

In Step S1540, the image pickup signal is transferred. More specifically, the first image pickup signal I1 of the coordinates corresponding to the block B(ibx, iby) selected in Step S1530 is calculated using Formula (9), and the obtained signal is transferred to the first calculating buffer 141*a*. A value at the coordinates (x, y) of the first calculating buffer 141*a* is Bc1(x, y). Here, since HB is 32 and VB is 32, x is from 0 to 31, and y is from 0 to 31.

Moreover, the fourth image pickup signal I4 of the coordinates corresponding to the block B(ibx, iby) selected in Step S1530 is calculated using Formula (13), and the obtained signal is transferred to the second calculating buffer 141*b*. A value at the coordinates (x, y) of the second calculating buffer 141*b* is Bc2(x, y). Here, since HB is 32 and VB is 32, x is from 0 to 31+SB, and y is from 0 to 31+SB*Dy/Dx.

For example, when ib is 0, the image pickup signal I1 of 1024 pixels surrounded by the coordinates (0, 0) and the coordinates (31,31) is transferred to the first calculating buffer 141*a*, and the image pickup signal I4 of the region which is marked with diagonal lines extending in a diagonally lower right direction in FIG. 23 and surrounded by the coordinates (0, 0) and the coordinates (31+SB, 31+SB*Dy/Dx) is transferred to the second calculating buffer 141*b*.

Moreover, when ib is 1, the image pickup signal I1 of 1024 pixels surrounded by the coordinates (32, 0) and the coordinates (63, 31) is transferred to the first calculating buffer 141*a*. In this case, the second calculating buffer 141*b* requires the image pickup signal I4 of the region which is marked with diagonal lines extending in a diagonally lower right direction in FIG. 23 and surrounded by the coordinates (32, 0) and the coordinates (63+SB, 31+SB*Dy/Dx). However, since a portion which overlaps the block whose ib is 0 has already been transferred to the second calculating buffer 141*b*, this overlapping portion does not have to be transferred. Next, Step S1550 is executed.

Figure 24:
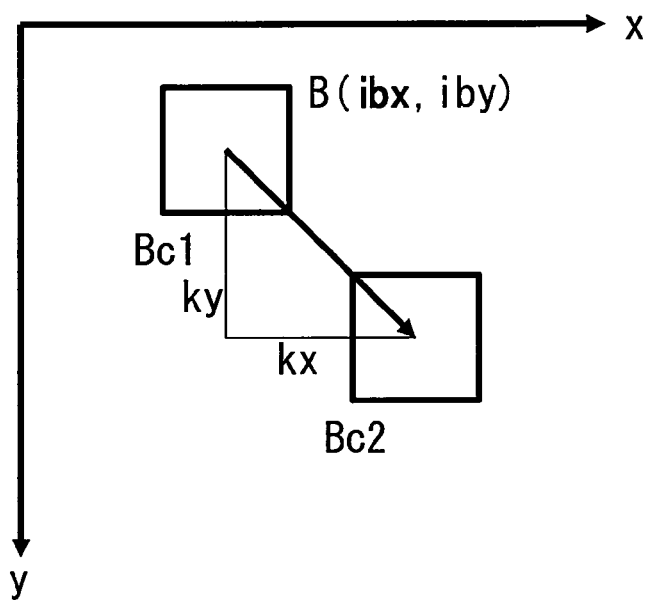
FIG. 24 is a diagram for explaining the calculation region of the parallax evaluated value when the first image pickup signal and the fourth image pickup signal are utilized in the image pickup apparatus according to Embodiment 1 of the present invention.

In Step S1550, the parallax calculation is executed. First, the parallax evaluated value R(kx) is calculated. Here, kx denotes the displacement amount showing how much amount an image is displaced, and kx is changed to be 0, 1, 2, . . . , and SB. FIG. 24 is a diagram for explaining the calculation region of the parallax evaluated value when the first image pickup signal and the fourth image pickup signal are utilized in the image pickup apparatus according to Embodiment 1 of the present invention. As shown in FIG. 24, the region indicated by Bc1 is a region of the first calculating buffer 141*a*, and the region indicated by Bc2 is a region which is in the second calculating buffer 141*b* and is away from the block indicated by Bc1 by the displacement amount kx in the x-axis direction and the displacement amount ky in the y-axis direction. Then, the sum of absolute differences (SAD) shown by Formula (40) below is calculated in a case where the displacement amount kx is from 0 to SB, thereby obtaining the parallax evaluated value R(ky). Here, ΣΣ denotes the sum in the x-axis direction and the y-axis direction, and is changed from 0 to HB−1 (herein, 31) in the x-axis direction and 0 to VB−1 (herein, 31) in the y-axis direction. The lens portion 113*a* configured to form an image of the first image pickup signal I1 and the lens portion 113*d* configured to form an image of the fourth image pickup signal I4 are arranged so as to be spaced apart from each other by Dx in the x-axis direction and Dy in the y-axis direction, and the ratio of the parallax in the y-axis direction to the parallax in the x-axis direction becomes Dy/Dx. Therefore, the displacement amount ky in the y-axis direction is a value obtained by multiplying the displacement amount in the x-axis direction by Dy/Dx as shown by Formula (41) below.

$$R(k) = \Sigma\Sigma |Bc1(x,y) - Bc2(x+kx, y+ky)| \tag{40}$$

$$ky = kx*Dy/Dx \tag{41}$$

The parallax evaluated value R(kx) shows how much the data Bc1 of the first calculating buffer 141*a* and the data Bc2 of the second calculating buffer 141b in the region away from the data Bc1 by kx in the x-axis direction and ky in the y-axis direction are correlated to each other. The smaller the parallax evaluated value R(kx) is, the stronger the correlation therebetween is (that is, in a case where the parallax evaluated value R(kx) is small, the data Bc1 and the data Bc2 are similar to each other). Here, since the data Bc1 of the first calculating buffer 141a is the transferred first image pickup signal I1, and the data Bc2 of the second calculating buffer 141b is the transferred fourth image pickup signal I4, this parallax evaluated value R(kx) shows how much the first image pickup signal I1 and the corresponding fourth image pickup signal I4 are correlated to each other.

Figure 25:
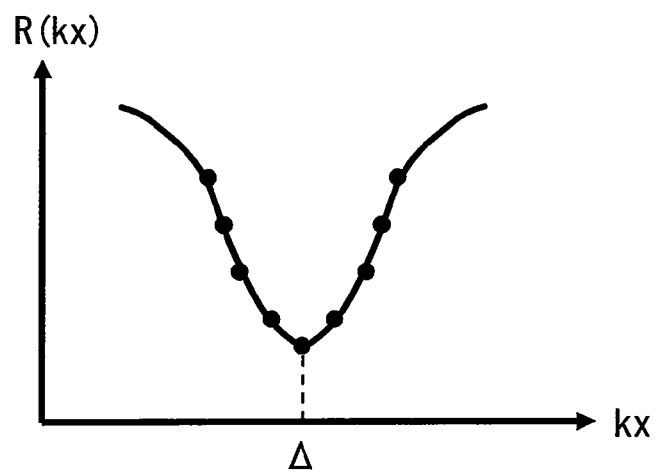
FIG. 25 is a diagram for explaining the relation between the parallax and the parallax evaluated value in the parallax calculation utilizing the first image pickup signal and the fourth image pickup signal in the image pickup apparatus according to Embodiment 1 of the present invention.

FIG. 25 is a diagram for explaining the relation between the parallax and the parallax evaluated value in the parallax calculation utilizing the first image pickup signal and the fourth image pickup signal in the image pickup apparatus according to Embodiment 1 of the present invention. As shown in FIG. 25, the parallax evaluated value R(kx) changes depending on the value of the displacement amount kx and becomes a minimal value when the displacement amount kx is Δ. This shows that the data Bc1 of the first calculating buffer 141a is most strongly correlated to (is most similar to) the data Bc2 of the second calculating buffer 141b which is located in the region away from the data Bc1 of the first calculating buffer 141a by Δ in the x-axis direction and Δ×Dy/Dx in the y-axis direction. Therefore, it is found that the parallax in the x-axis direction between the data Bc1 of the first calculating buffer 141a and the data Bc2 of the second calculating buffer 141b is Δ (the parallax in the y-axis direction therebetween is Δ×Dy/Dx). Then, this parallax Δ is stored as a parallax value Δ14(ibx, iby) of the block B(ibx, iby) in the case of utilizing the first image pickup signal and the fourth image pickup signal.

Figure 26:
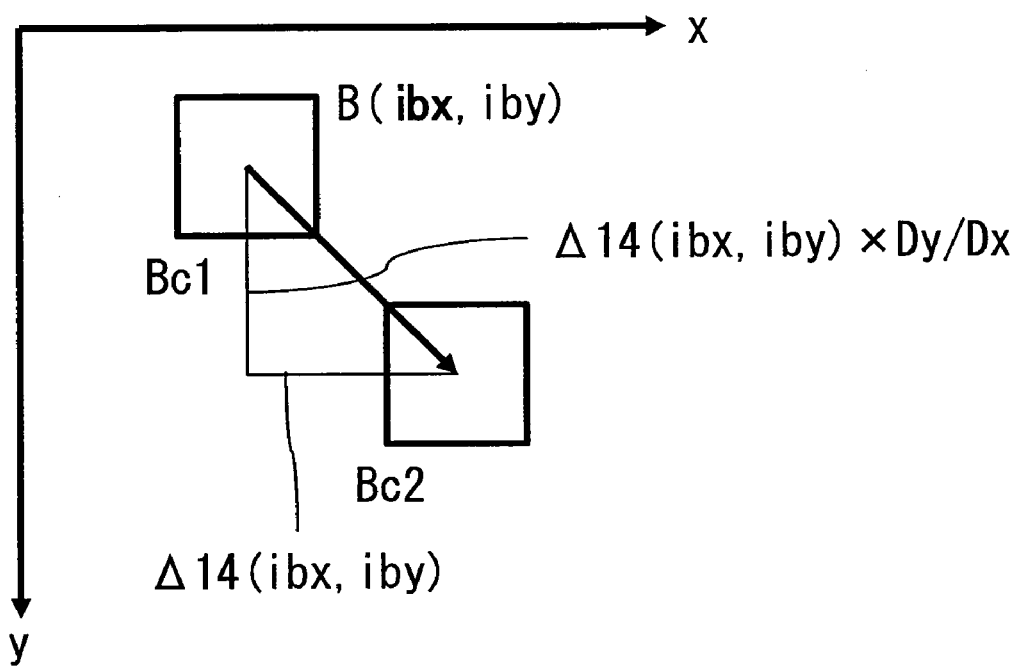
FIG. 26 is a diagram for explaining the calculation region of the reliability of the parallax evaluated value in the parallax calculation utilizing the first image pickup signal and the fourth image pickup signal in the image pickup apparatus according to Embodiment 1 of the present invention.

Next, the reliability of the parallax value Δ14(ibx, iby) of the block B(ibx, iby) in the case of utilizing the first image pickup signal and the fourth image pickup signal is calculated. FIG. 26 is a diagram for explaining the calculation region of the reliability of the parallax evaluated value in the parallax calculation utilizing the first image pickup signal and the fourth image pickup signal in the image pickup apparatus according to Embodiment 1 of the present invention. The data Bc1 is data stored in the region of the first calculating buffer 141a. The data Bc2 is data which is in the second calculating buffer 141b and is away from the data Bc1 by Δ14(ibx, iby) in the x-axis direction and Δ14(ibx, iby) × Dy/Dx in the y-axis direction. As shown by Formula (42) below, regarding the data Bc1(x, y) and the data Bc2(x+Δ14(ibx, iby), y+Δ14(ibx, iby)×Dy/Dx) in respective regions, a normalized correlation coefficient is regarded as reliability E14(ibx, iby) of the block B(ibx, iby) in the case of utilizing the first image pickup signal and the fourth image pickup signal. ΣΣ denotes the sum in the x-axis direction and the y-axis direction, and is changed from 0 to HB−1 (herein, 31) in the x-axis direction and 0 to VB−1 (herein, 31) in the y-axis direction. Next, Step S1560 is executed.

$$E14(ibx,iby)=\Sigma\Sigma(Bc1(x,y)-avg1)(Bc2(x+\Delta14(ibx,iby),\\y+\Delta14(ibx,iby)*Dy/Dx)-avg2)/\Sigma\Sigma(Bc1(x,y)-\\avg1)(Bc1(x,y)-avg1)/\Sigma\Sigma(Bc2(x+\Delta14(ibx,iby),y+\\\Delta14(ibx,iby)*Dy/Dx)-avg2)(Bc2(x+\Delta14(ibx,iby),\\y+\Delta14(ibx,iby)*Dy/Dx)-avg2)$$

$$avg1=\Sigma\Sigma Bc1(x,y)/(HB*VB)$$

$$avg2=\Sigma\Sigma Bc2(x+\Delta14(ibx,iby),y+\Delta14(ibx,iby))/\\(HB*VB) \quad (42)$$

In Step S1560, 1 is added to the block index ib. Next, Step S1570 is executed.

In Step S1570, whether or not the parallax calculation utilizing the first image pickup signal and the fourth image pickup signal is terminated is determined. When the block index ib is less than Nh*Nv (NO in S1570), the process returns to Step S1530 to calculate the parallax of the next block. In contrast, when the block index ib is Nh*Nv or more (YES in S1570), it is determined that the parallaxes of all the blocks are calculated, and next, Step S1580 is executed.

In Step S1580, the parallax calculation utilizing the first image pickup signal and the fourth image pickup signal is terminated, and the process returns to the upper routine.

Thus, in the parallax calculation utilizing the first image pickup signal and the fourth image pickup signal, the parallax value Δ14(ibx, iby) of the block B(ibx, iby) shown by the block index ib and having 32*32 pixels and the reliability E14(ibx, iby) are calculated. Here, 14 denotes that the first image pickup signal and the fourth image pickup signal are utilized, and (ibx, iby) denotes the coordinates shown on the lower level in each block in FIG. 12 (ibx changes from 0 to Nh−1, and iby changes from 0 to Vh−1). Next, Step S1250 of FIG. 10 is executed.

In Step S1250, the parallax is selected. In each block, the reliabilities E12(ibx, iby), E13(ibx, iby), and E14(ibx, iby) are compared to one another, and the parallax which gives the highest reliability is regarded as the parallax Δ(ibx, iby) of the block. Formula (43) below is converted to correspond to the parallax in the x-axis direction. Next, Step S1260 is executed.

$$\Delta(ibx,iby)=\Delta12(ibx,iby)\text{ when }E12(ibx, iby)\text{ is highest}$$

$$\Delta(ibx,iby)=\Delta13(ibx,iby)*Dx/Dy\text{ when }E13(ibx,iby)\text{ is highest}$$

$$\Delta(ibx,iby)=\Delta14(ibx,iby)\text{ when }E14(ibx,iby)\text{ is highest} \quad (43)$$

In Step S1260, the distance calculating portion 143 carries out the distance calculation and sequentially transfers the result as the distance data to the second output buffer 137b. As described above, the distance is calculated based on Formula (7). To be specific, the distance L(ibx, iby) of the subject in the block having the parallax Δ(ibx, iby) is calculated as shown by Formula (44) below. Note that f denotes the focal length of the lens portion 113, Dx denotes the interval in the x-axis direction between the lens portions 113a to 113d, and p denotes an element pitch of the image pickup element. Next, Step S1270 is executed.

$$L(ibx,iby)=f\times Dx/p/\Delta(ibx,iby) \quad (44)$$

In Step S1270, the calculation operation is terminated, and the process returns to the upper routine. Next, Step S1910 is executed.

The following effects can be obtained by configuring the image pickup apparatus of the present embodiment as above and causing the image pickup apparatus of the present embodiment to operate as above.

As above, in the image pickup apparatus of Embodiment 1, the temperature sensor 126 measures the ambient temperature of the lens array 113 and inputs the ambient temperature as the temperature value Th. Since the lens array 113 has a substantially circular shape, it expands isotropically. By utilizing this, the interval between the optical axes of the lens portions of the lens array 113 is calculated using Formulas (14) and (15). On the assumption that the optical axis changes by half the interval, the coordinate transformation tables are generated. With this, even if the lens array 113 deforms due to the temperature change, the position of the optical axis can be accurately compensated. Therefore, it is possible to obtain the parallax which is less affected by the temperature. Based on this parallax, the distance measurement can be carried out accurately. Moreover, the image is corrected such that: the amount of change in the interval between the lens portions is calculated based on the temperature detected by the temperature sensor 126; and each of the origin points of the optical axes of the plurality of lenses is moved by half the amount of change to cancel the distortion around the origin point of the optical axis. With this, the influences of the distortion can be reduced properly. Therefore, the detection of the parallax and the distance measurement can be carried out with high accuracy.

In a case where the position of the optical axis of the lens portion changes due to the temperature, the image taken by the image pickup apparatus moves. For example, in a case where the image pickup apparatus is utilized to monitor a view in front of a vehicle, and even if the center of the image taken by the image pickup apparatus and the center of the image viewed by a driver are caused to coincide with each other, the center of the image is displaced due to the temperature change. Therefore, the driver feels uncomfortable. In contrast, in the case of the image pickup apparatus of Embodiment 1, even if the temperature changes, the change in the center of the image can be suppressed. Therefore, it is possible to realize the image pickup apparatus suitable for monitoring the view in front of a vehicle.

As the position is farther from the center of the optical axis, the distortion becomes significant, and the accuracy of distance measurement generally deteriorates. In accordance with the image pickup apparatus of the present embodiment, an effect of avoiding utilizing a region where the distortion is significant can be expected by compensating the optical axis as above.

In the case of a subject having a shape extending in parallel with a straight line connecting the centers of the optical axes of a pair of lens portions, the shape of the subject becomes the same between the image pickup signals obtained by the pair of lens portions. Therefore, the parallax cannot be calculated. In accordance with the image pickup apparatus of Embodiment 1, three pairs of image pickup signals (the first image pickup signal I1 and the second image pickup signal I2, the first image pickup signal I1 and the third image pickup signal I3, and the first image pickup signal I1 and the fourth image pickup signal I4) are selected, and the parallaxes $\Delta 12(ibx, iby)$, $\Delta 13(ibx, iby)$, and $\Delta 14(ibx, iby)$ of respective pairs are obtained. With this, even if the parallax cannot be obtained accurately by one pair, it can be obtained accurately by the other pairs. Therefore, the image pickup apparatus of Embodiment 1 can measure the distance based on the parallax. For example, in a case where the subject has a horizontally linear shape, the distance thereof cannot be obtained by a pair of image pickup signals (the first image pickup signal I1 and the second image pickup signal I2) lined up in the horizontal direction, but it can be obtained by a pair of image pickup signals (the first image pickup signal I1 and the third image pickup signal I3, or the second image pickup signal I2 and the fourth image pickup signal I4) lined up in the vertical direction or a pair of image pickup signals (the first image pickup signal I1 and the fourth image pickup signal I4) lined up in the diagonal direction. Therefore, the image pickup apparatus of Embodiment 1 can deal with subjects of various shapes.

Moreover, in accordance with the image pickup apparatus of Embodiment 1, the reliabilities ($E12(ibx, iby)$, $E13(ibx, iby)$, and $E14(ibx, iby)$) of the plurality of parallaxes are calculated, and for each block $B(ibx, iby)$, the parallax $\Delta(ibx, iby)$ having the highest reliability is specified from the parallaxes ($\Delta 12(ibx, iby)$, $\Delta 13(ibx, iby)$, and $\Delta 14(ibx, iby)$). Then, the image pickup apparatus of Embodiment 1 calculates the distance based on the parallax $\Delta(ibx, iby)$ having the highest reliability. As above, since the parallax calculation is carried out based on the parallax $\Delta(ibx, iby)$ having the highest reliability, highly reliable distance measurement can be carried out. Moreover, the distance calculation is not carried out for the parallaxes ($\Delta 12(ibx, iby)$, $\Delta 13(ibx, iby)$, and $\Delta 14(ibx, iby)$) of all the pairs, but it is carried out for only the parallax ($\Delta(ibx, iby)$) having the highest reliability. Therefore, the image pickup apparatus of Embodiment 1 can quickly measure the distance.

In the image pickup apparatus according to Embodiment 1, the temperature sensor 126 is disposed on the substrate 121. In a case where the temperature sensor 126 is disposed on the substrate 121, the temperature sensor 126 and the temperature sensor signal input portion 139a may be connected to each other using the wire on the substrate 121. Therefore, there is an advantage that it is easy to mount the temperature sensor 126. However, the present embodiment is not limited to this. Although the temperature sensor 126 detects the temperature of the substrate 121 in the vicinity of the lens array 113, an object thereof is to detect the temperature of the lens array 113. The temperature of the lens array 113 may be detected directly or indirectly. To detect the temperature of the lens array 113 indirectly, a temperature correlated to the temperature of the lens array 113 or a physical quantity correlated to the temperature of the lens array 113 other than the temperature may be detected. Then, the obtained temperature or physical quantity is corrected as the temperature of the lens array 113, or the difference between the obtained temperature or physical quantity or the temperature of the lens array 113 is considered. With this, the obtained temperature may be used instead of the directly detected temperature of the lens array 113. From this point of view, in the present embodiment, the temperature of the substrate 121 in the vicinity of the lens array 113 is detected. Therefore, other than the above, for example, the temperature sensor 126 may be disposed inside the package 122 so as to be in parallel with the image pickup element 123. In this case, since the temperature sensor 126 is disposed in the vicinity of the image pickup element 123, it is necessary to prevent dusts and the like from adhering to the image pickup element 123 when mounting the temperature sensor 126. However, since the temperature sensor 126 is disposed closer to the lens array 113, the accuracy of the temperature detection improves. As a result, the change in the optical axis can be corrected more accurately, and the distortion can be corrected more accurately. Therefore, the accuracy of distance measurement can be improved.

Moreover, the SLSI 125 may be manufactured by using such a manufacturing process that a part of the SLSI 125 serves as the temperature sensor 126. In this case, since it is unnecessary to mount the temperature sensor 126, cost for mounting can be reduced.

Moreover, the temperature sensor 126 may be attached to an outer wall or inner wall of the barrel 111. In this case, it is necessary to consider the wiring of the temperature sensor 126. However, since the temperature sensor 126 can be disposed on the barrel 111 in the vicinity of the lens array 113, the accuracy of temperature detection improves. As a result, the change in the optical axis can be corrected more accurately, and the distortion can be corrected more accurately. Therefore, the accuracy of distance measurement can be improved. Moreover, the temperature sensor 126 may be embedded in the barrel 111. In this case, it is necessary to consider the wiring of the temperature sensor 126 and a method for manufacturing the barrel 111. However, since the temperature sensor 126 can be disposed inside the barrel 111 in the vicinity of the lens array 113, the accuracy of distance measurement can be improved as above.

Moreover, the temperature sensor 126 may be disposed on a suitable position of the lens array 113 and be connected via a suitable wire. In this case, it is necessary to consider the wiring of the temperature sensor 126. However, since the temperature sensor 126 is directly disposed on the lens array 113, the accuracy of temperature detection further increases. As a result, the accuracy of distance measurement can be improved. Moreover, the temperature sensor 126 may be embedded in the lens portion. In this case, it is necessary to consider the wiring of the temperature sensor 126 and a method for manufacturing the lens array 113. However, since the temperature sensor 126 is disposed inside the lens array 113, the accuracy of temperature detection further increases. Therefore, the accuracy of distance measurement can be improved.

Figure 27:
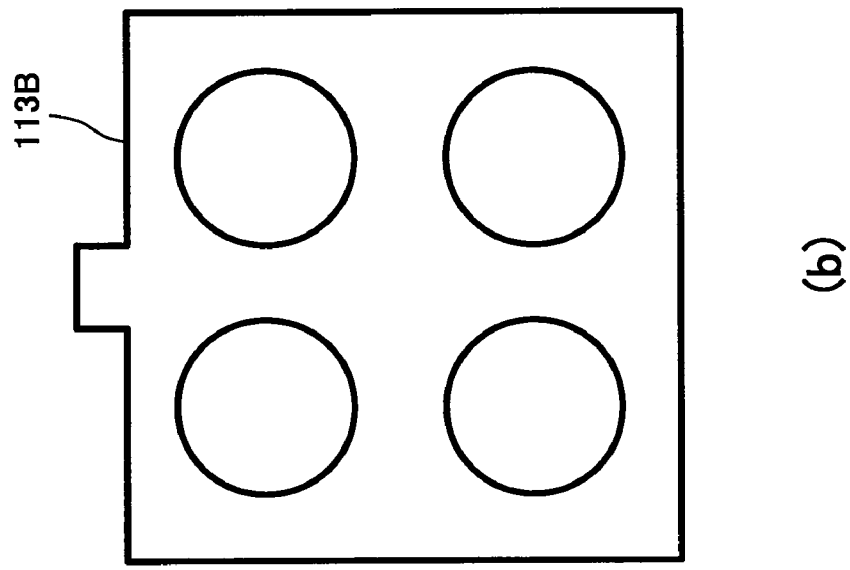
FIG. 27 is a plan view showing the configuration of the lens array of the image pickup apparatus according to Modification Example of Embodiment 1.
Figure 27:
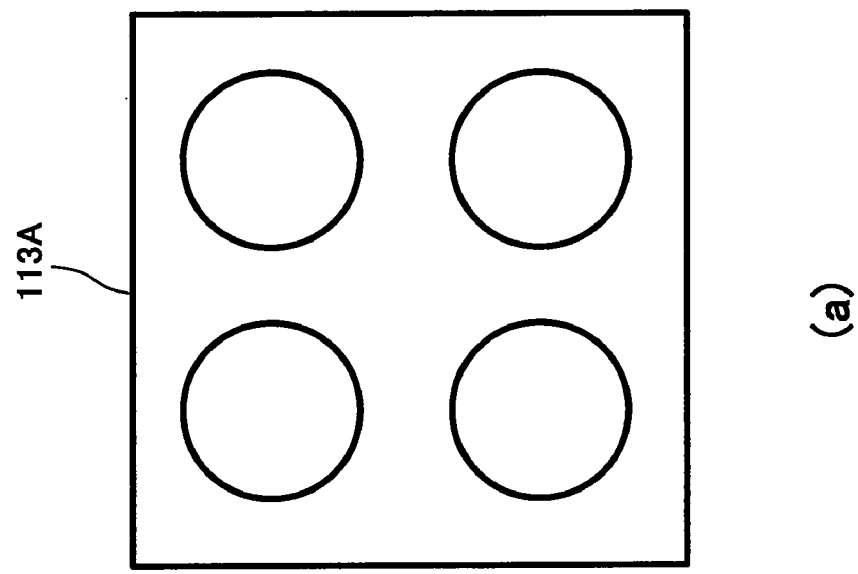

Moreover, in the image pickup apparatus according to Embodiment 1, the lens array 113 is formed to have a substantially circular shape. However, the present embodiment is not limited to this. FIG. 27 is a plan view showing the configuration of the lens array of the image pickup apparatus according to Modification Example of Embodiment 1. As with a lens array 113A shown in FIG. 27(a), the lens array 113 may be formed to have a rectangular shape. Further, as with a lens array 113B shown in FIG. 27(b), the lens array 113 may be provided with, for example, a projection extending in a planar direction at, for example, an end surface of the lens array 113. Even in a case where the lens array does not have a substantially circular shape, the lens portion expands substantially isotropically. Therefore, the same effects as in Embodiment 1 can be obtained by the same operations as in Embodiment 1.

Embodiment 2

In the image pickup apparatus according to Embodiment 1 of the present invention, the lens array 113 is formed to have a substantially circular shape, and the lens portions (the first lens portion 113a, the second lens portion 113b, the third lens portion 113c, and the fourth lens portion 113d) are arranged such that the distance from the center of the lens array 113 to each lens portion is constant. Then, the image pickup apparatus according to Embodiment 1 corrects the image such that: the amount of change in the interval between the optical axes of the lens portions of the lens array 113 is calculated based on the temperature detected by the temperature sensor 126; and each of the origin points of the optical axes of the lens portions is moved by half the amount of change to cancel the distortion around the origin point of the optical axis. With this, the image pickup apparatus is realized, which can accurately reduce the influences of the distortion even if the temperature changes, detect highly accurate parallaxes, and therefore measure the distance with high accuracy. Moreover, the image pickup apparatus is realized, by which the center of the image does not change even if the temperature changes.

In contrast, the image pickup apparatus according to Embodiment 2 of the present invention includes the lens portions arranged such that the distance from the center of the lens array to each lens portion is not constant. Even in a case where the lens portions are arranged such that the distance from the center of the lens array to each lens portion is not constant, highly accurate parallaxes can be detected without being affected by the temperature change, and therefore, the distance measurement can be carried out with high accuracy, and the change in the center of the image can be suppressed.

The image pickup apparatus of Embodiment 2 is configured such that the lens array 113 of Embodiment 1 is replaced with a lens array 213, and the temperature compensating portion 139b of Embodiment 1 is replaced with a temperature compensation calculating portion 239b. The other components of Embodiment 2 are the same as those of Embodiment 1. The same reference numbers are used for the same components, and explanations thereof are omitted.

Figure 28:
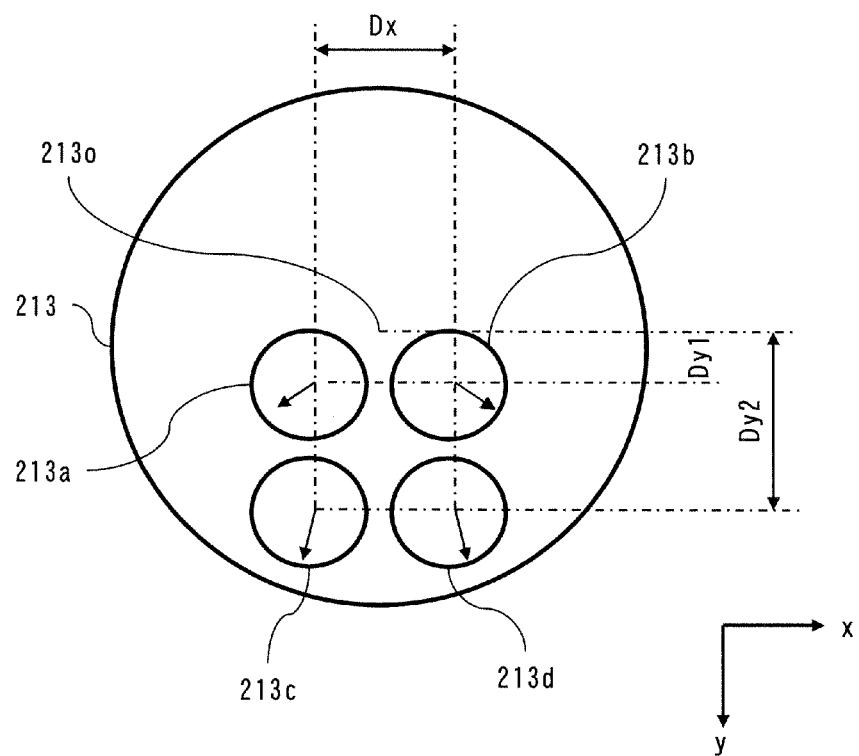
FIG. 28 is a plan view showing the configuration of the lens array of the image pickup apparatus according to Embodiment 2 of the present invention.

FIG. 28 is a plan view showing the configuration of the lens array of the image pickup apparatus according to Embodiment 2 of the present invention. The lens array 213 has a substantially disc shape and is formed by an optical glass material, a transparent resin, or the like. In the lens array 213, a first lens portion 213a, a second lens portion 213b, a third lens portion 213c, and a fourth lens portion 213d are arranged in a grid pattern. As shown in FIG. 28, x-axis and y-axis are set along directions in which the first to fourth lens portions 213a to 213d are arranged. In the first lens portion 213a, the second lens portion 213b, the third lens portion 213c, and the fourth lens portion 213d, light incident from a subject side is emanated toward the image pickup element 123 side, and four images are formed on the image pickup element 123. As shown in FIG. 28, the optical axis of the first lens portion 213a and the optical axis of the second lens portion 213b are spaced apart from each other by Dx in the horizontal direction (x-axis direction) and coincide with each other in the vertical direction (y-axis direction). Moreover, the optical axis of the first lens portion 213a and the optical axis of the second lens portion 213b are arranged to be symmetrical about an axis passing through a center 213o of the lens array 213 and extending in the y-axis direction. Each of the optical axis of the first lens portion 213a and the optical axis of the second lens portion 213b is arranged to be spaced apart from the center 213o of the lens array 213 by Dy1 in the y-axis direction. Moreover, the optical axis of the third lens portion 213c and the optical axis of the fourth lens portion 213d are spaced apart from each other by Dx in the horizontal direction (x-axis direction) and coincide with each other in the vertical direction (y-axis direction). Moreover, the optical axis of the third lens portion 213c and the optical axis of the fourth lens portion 213d are arranged to be symmetrical about the axis passing through the center 213o of the lens array 213 and extending in the y-axis direction. Each of the optical axis of the third lens portion 213c and the optical axis of the fourth lens portion 213d is arranged to be spaced apart from the center 213o of the lens array 213 by Dy2 in the y-axis direction.

The temperature compensation calculating portion 139b generates based on the temperature value Th the coordinate transformation tables tx1(x, y), ty1(x, y), tx2(x, y), ty2(x, y), tx3(x, y), ty3(x, y), tx4(x, y), and ty4(x, y) utilized in the preprocessing portion 135. When the temperature of the lens array 213 increases, the lens array 213 expand. In this case, since the lens array 213 has a substantially circular shape, as shown by arrows in FIG. 28, the centers of the optical axes of the lens portions 213a to 213d move toward an outer side of the lens with respect to the center 213o of the lens array 213. The movement distance is substantially proportional to the distance from the center 213o of the lens array 213 to each of the optical axes of the lens portions 213a to 213d. To be specific, a movement distance dbx1 in the x-axis direction and a movement distance dby1 in the y-axis direction of the first lens portion 213a due to the expansion of the lens array 213 by the temperature increase can be shown by Formulas (45) and (46) below using the pixel pitch of the image pickup element 123 as a unit. Here, Dx/2 denotes a distance between an axis passing through the center 213o of the lens array 213 at the reference temperature Th0 and extending in the y-axis direction and the optical axis of the first lens portion 213a, and Dy1 denotes a distance between an axis passing through the center 213o of the lens array 213 at the reference temperature Th0 and extending in the x-axis direction and the optical axis of the first lens portion 213a. Moreover, aL denotes a linear thermal expansion coefficient of the lens array 213, aS denotes the linear thermal expansion coefficient of the image pickup element 123, Th denotes a temperature value, Th0 denotes the reference temperature, and p denotes the pixel pitch of the image pickup element 123.

A movement distance dbx2 in the x-axis direction and a movement distance dby2 in the y-axis direction of the second lens portion 213b due to the expansion of the lens array by the temperature increase can be shown by Formulas (47) and (48) below using the pixel pitch of the image pickup element 123 as a unit. Here, Dx/2 denotes a distance between the axis passing through the center 213o of the lens array 213 at the reference temperature Th0 and extending in the y-axis direction and the optical axis of the second lens portion 213b, and Dy1 denotes a distance between the axis passing through the center 213o of the lens array 213 at the reference temperature Th0 and extending in the x-axis direction and the optical axis of the second lens portion 213b. A movement distance dbx3 in the x-axis direction and a movement distance dby3 in the y-axis direction of the third lens portion 213c due to the expansion of the lens array by the temperature increase can be shown by Formulas (49) and (50) below using the pixel pitch of the image pickup element 123 as a unit. Here, Dx/2 denotes a distance between the axis passing through the center 213o of the lens array at the reference temperature Th0 and extending in the y-axis direction and the optical axis of the third lens portion 213c, and Dy2 denotes a distance between the axis passing through the center 213o of the lens array at the reference temperature Th0 and extending in the x-axis direction and the optical axis of the third lens portion 213c. A movement distance dbx4 in the x-axis direction and a movement distance dby4 in the y-axis direction of the fourth lens portion 213d due to the expansion of the lens array by the temperature increase can be shown by Formulas (51) and (52) using the pixel pitch of the image pickup element 123 as a unit. Here, Dx/2 denotes a distance between the axis passing through the center 213o of the lens array at the reference temperature Th0 and the optical axis of the fourth lens portion 213d, and Dy2 is a distance from the axis passing through the center 213o of the lens array at the reference temperature Th0 and extending in the x-axis direction and the optical axis of the fourth lens portion 213d.

$$dbx1 = (Dx/2) \times (aL-aS) \times (Th-Th0)/p \quad (45)$$

$$dby1 = Dy1 \times (aL-aS) \times (Th-Th0)/p \quad (46)$$

$$dbx2 = (Dx/2) \times (aL-aS) \times (Th-Th0)/p \quad (47)$$

$$dby2 = Dy1 \times (aL-aS) \times (Th-Th0)/p \quad (48)$$

$$dbx3 = (Dx/2) \times (aL-aS) \times (Th-Th0)/p \quad (49)$$

$$dby3 = Dy2 \times (aL-aS) \times (Th-Th0)/p \quad (50)$$

$$dbx4 = (Dx/2) \times (aL-aS) \times (Th-Th0)/p \quad (51)$$

$$dby4 = Dy2 \times (aL-aS) \times (Th-Th0)/p \quad (52)$$

The image pickup apparatus corrects each image pickup signal by the movement distance due to the above temperature increase. To be specific, the transformation tables tx1(x, y) and ty1(x, y) for the first image pickup signal I1(x, y) are generated as shown by Formulas (53), (54), and (55) below. Here, (x01, y01) denotes coordinates of the origin point in the image pickup signal I0 in a case where there is no distortion, (xc1, yc1) denotes coordinates of the center of the optical axis in the image pickup signal I1 (x, y) at the reference temperature Th0, (−dbx1, −dby1) denotes the movement distance of the center of the optical axis due to the temperature increase, and each of kd2 and kd4 denotes the distortion coefficient. In Formula (55), ^2 denotes the square value. The transformation tables tx2(x, y) and ty2(x, y) for the second image pickup signal I2(x, y) are generated as shown by Formulas (56), (57), and (58) below. Here, (x02, y02) denotes coordinates of the origin point in the image pickup signal I0 in a case where there is no distortion, (xc2, yc2) denotes coordinates of the center of the optical axis in the image pickup signal I2(x, y) at the reference temperature Th0, (+dbx2, −dby2) denotes the movement distance of the center of the optical axis due to the temperature increase, and each of kd2 and kd4 denotes the distortion coefficient. In Formula (58), ^2 denotes the square value. The transformation tables tx3(x, y) and ty3(x, y) for the third image pickup signal I3(x, y) are generated by Formulas (59), (60), and (61) below. Here, (x03, y03) denotes coordinates of the origin point in the image pickup signal I0 in a case where there is no distortion, (xc3, yc3) denotes coordinates of the center of the optical axis in the image pickup signal I3(x, y) at the reference temperature Th0, (−dbx3, +dby3) denotes the movement distance of the center of the optical axis due to the temperature increase, and each of kd2 and kd4 denotes the distortion coefficient. In Formula (61), ^2 denotes the square value. The transformation tables tx4(x, y) and ty4(x, y) for the fourth image pickup signal I4(x, y) are generated as shown by Formulas (62), (63), and (64) below. Here, (x04, y04) denotes coordinates of the origin point in the image pickup signal I0 in a case where there is no distortion, (xc4, yc4) denotes coordinates of the center of the optical axis in the image pickup signal I4(x, y) at the reference temperature Th0, (+dbx4, +dby4) denotes the movement distance of the center of the optical axis due to the temperature increase, and each of kd2 and kd4 denotes the distortion coefficient. In Formula (64), ^2 denotes the square value.

$$tx1(x,y) = x01 + xc1 + \{x - xc1 - dbx1\} \times (1 + kd2 \times r2 + kd4 \times r4) \quad (53)$$

$$ty1(x,y) = y01 + yc1 + \{y - yc1 - dby1\} \times (1 + kd2 \times r2 + kd4 \times r4) \quad (54)$$

$$r2 = \{x - xc1 - dbx1\}^2 + \{y - yc1 - dby1\}^2, r4 = r2^2 \quad (55)$$

$$tx2(x,y) = x02 + xc2 + \{x - xc2 + dbx2\} \times (1 + kd2 \times r2 + kd4 \times r4) \quad (56)$$

$$ty2(x,y) = y02 + yc2 + \{y - yc2 - dby2\} \times (1 + kd2 \times r2 + kd4 \times r4) \quad (57)$$

$$r2 = \{x - xc2 + dbx2\}^2 + \{y - yc2 - dby2\}^2, r4 = r2^2 \quad (58)$$

$$tx3(x,y) = x03 + xc3 + \{x - xc3 - dbx3\} \times (1 + kd2 \times r2 + kd4 \times r4) \quad (59)$$

$$ty3(x,y) = y03 + yc3 + \{y - yc3 + dby3\} \times (1 + kd2 \times r2 + kd4 \times r4) \quad (60)$$

$$r2 = \{x - xc3 - dbx3\}^2 + \{y - yc3 + dby3\}^2, r4 = r2^2 \quad (61)$$

$$tx4(x,y) = x04 + xc4 + \{x - xc4 + dbx4\} \times (1 + kd2 \times r2 + kd4 \times r4) \quad (62)$$

$$ty4(x,y) = y04 + yc4 + \{y - yc4 + dby4\} \times (1 + kd2 \times r2 + kd4 \times r4) \quad (63)$$

$$r2 = \{x - xc4 + dbx4\}^2 + \{y - yc4 + dby4\}^2, r4 = r2^2 \quad (64)$$

In a case where there is no distortion, the coordinate transformation carried out using the above coordinate transformation tables corresponds to an operation in which the images are cut out from the image pickup signal I0 (x, y) as shown by Formulas (65) to (68) below, and the parallel displacement is then carried out as shown by Formulas (69) to (72) below.

$$I1(x,y)=I0(x+x01,y+y01) \tag{65}$$

$$I2(x,y)=I0(x+x02,y+y02) \tag{66}$$

$$I3(x,y)=I0(x+x03,y+y03) \tag{67}$$

$$I4(x,y)=I0(x+x04,y+y04) \tag{68}$$

$$I1(x,y)=(x-dbx1,y-dby1) \tag{69}$$

$$I2(x,y)=I2(x+dbx2,y-dby2) \tag{70}$$

$$I3(x,y)=I3(y-dbx3,x+dby3) \tag{71}$$

$$I4(x,y)=I4(x+dbx4,y+dby4) \tag{72}$$

The same effects as in Embodiment 1 can be obtained by configuring the image pickup apparatus of the present embodiment as above and causing the image pickup apparatus of the present embodiment to operate as above.

Embodiment 3

The image pickup apparatus according to Embodiment 3 of the present invention corrects the image to cancel the distortion around the origin point of the optical axis such that: coefficients corresponding to respective temperatures are stored; the amount of change in the interval between the optical axes of the lenses is calculated based on the temperature detected by the temperature sensor; and each of the origin points of the optical axes of the lenses is moved by half the amount of change. With this, the influences of the distortion can be appropriately reduced by a small-scale circuit. Therefore, the image pickup apparatus can detect highly accurate parallaxes and measure distances with high accuracy at low cost.

The image pickup apparatus of Embodiment 3 is configured such that the system LSI 125 of the image pickup apparatus 101 of Embodiment 1 is replaced with a system LSI 225. The other components of the image pickup apparatus of Embodiment 3 are the same as those of the image pickup apparatus of Embodiment 1, so that explanations thereof are omitted.

In accordance with the following method, The SLSI 225 drives the image pickup element 123, receives the electric information from the image pickup element 123, carries out various calculations, communicates with the host CPU, and outputs the image information, the distance information, and the like to outside. The SLSI 225 is connected to a power supply (3.3 V for example) and a ground (0 V for example).

Next, a principle of the temperature compensation of the center of the optical axis will be explained. As shown by the arrows in FIG. 2, the center of each optical axis moves toward an outer side of the lens by the expansion of the lens array 113 due to the temperature increase. Assuming that the lens array isotropically expands in proportion to the temperature increase, the interval between the centers of the optical axes can be shown by Formulas (109) and (110) below. Here, dbx denotes the amount of change in the interval between the optical axes in the x direction due to the temperature increase, and used as a unit thereof is a pitch of light receiving elements of the image pickup element 123. Moreover, dby denotes the amount of change in the interval between the optical axes in the y direction due to the temperature increase, and used as a unit thereof is the pitch of the light receiving elements of the image pickup element 122. Moreover, Dx denotes the interval between the optical axes of the lenses in the x direction at the reference temperature Th0, Dy denotes the interval between the optical axes of the lenses in the y direction at the reference temperature Th0, aL denotes the linear thermal expansion coefficient of the lens array 113, aS denotes the linear thermal expansion coefficient of the image pickup element 123, T denotes a temperature, Th0 denotes the reference temperature, and p denotes the pitch of the light receiving elements of the image pickup element 123.

$$dbx=Dx*(aL-aS)*(T-Th0)/p \tag{109}$$

$$dby=Dy*(aL-aS)*(T-Th0)/p \tag{110}$$

Since the centers of the optical axes of the lens portions isotropically expand due to the temperature increase, as shown in FIG. 2, each of the centers of the optical axes of the lens portions is moved by half the change in the interval between the optical axes of the lenses due to the temperature increase (p*dbx/2 in the x direction and p*dby/2 in the y direction). To be specific, the center of the optical axis of the first lens portion 113a is moved by −p*dbx/2 in the x direction and −p*dby/2 in the y direction. The center of the optical axis of the second lens portion 113b is moved by +p*dbx/2 in the x direction and −p*dby/2 in the y direction. The center of the optical axis of the third lens portion 113c is moved by −p*dbx/2 in the x direction and +p*dby/2 in the y direction. The center of the optical axis of the fourth lens portion 113d is moved by +p*dbx/2 in the x direction and +p*dby/2 in the y direction.

Therefore, the temperature T is detected, the changes dbx and dby in the interval between the optical axes of the lenses of the lens array 113 are calculated based on the temperature T, and the optical axes of the lenses of the lens array 113 are compensated on the assumption that each of the optical axes moves by half the change dbx and half the change dby. With this, the influences of the expansion of the lens array 113 due to the temperature change can be reduced, and the accurate parallax can be calculated. Therefore, the accurate distance can be obtained.

Next, the temperature compensation of the focal length will be explained. In a case where the lens array 113 is made of resin, a refractive index becomes low due to the temperature increase. Therefore, the focal length becomes large, the image formed on the image pickup element 123 becomes large (magnification becomes high), and the parallax becomes long. Therefore, the temperature T is detected, and the change in the focal length is estimated based on the temperature T, and the estimated focal length f is substituted into Formula (7). With this, the influences of the change in the focal length of the lens array 113 due to the temperature change can be reduced, and the accurate parallax can be obtained. Therefore, the accurate distance can be obtained. The image pickup signal may be corrected on the assumption that the focal length f of Formula (7) is constant and the magnification of the image changes instead of the change in the focal length.

Next, the temperature compensation of the extension of the barrel will be explained. In a case where the barrel 111 is made of resin, the barrel 111 extends due to the temperature increase. Therefore, a distance from a principal point of the lens array 113 to the light receiving surface of the image pickup element 123 becomes long, the image formed on the image pickup element 123 becomes large (magnification becomes high), and the parallax becomes large. Therefore, the temperature T is detected, the change in the length of the barrel 111 is estimated based on the temperature T, the change in the magnification is estimated, and the compensation is carried out. With this, the influences of the extension of the barrel 111 due to the temperature change can be reduced, and the accurate parallax can be obtained. Therefore, the accurate distance can be obtained.

Figure 29:
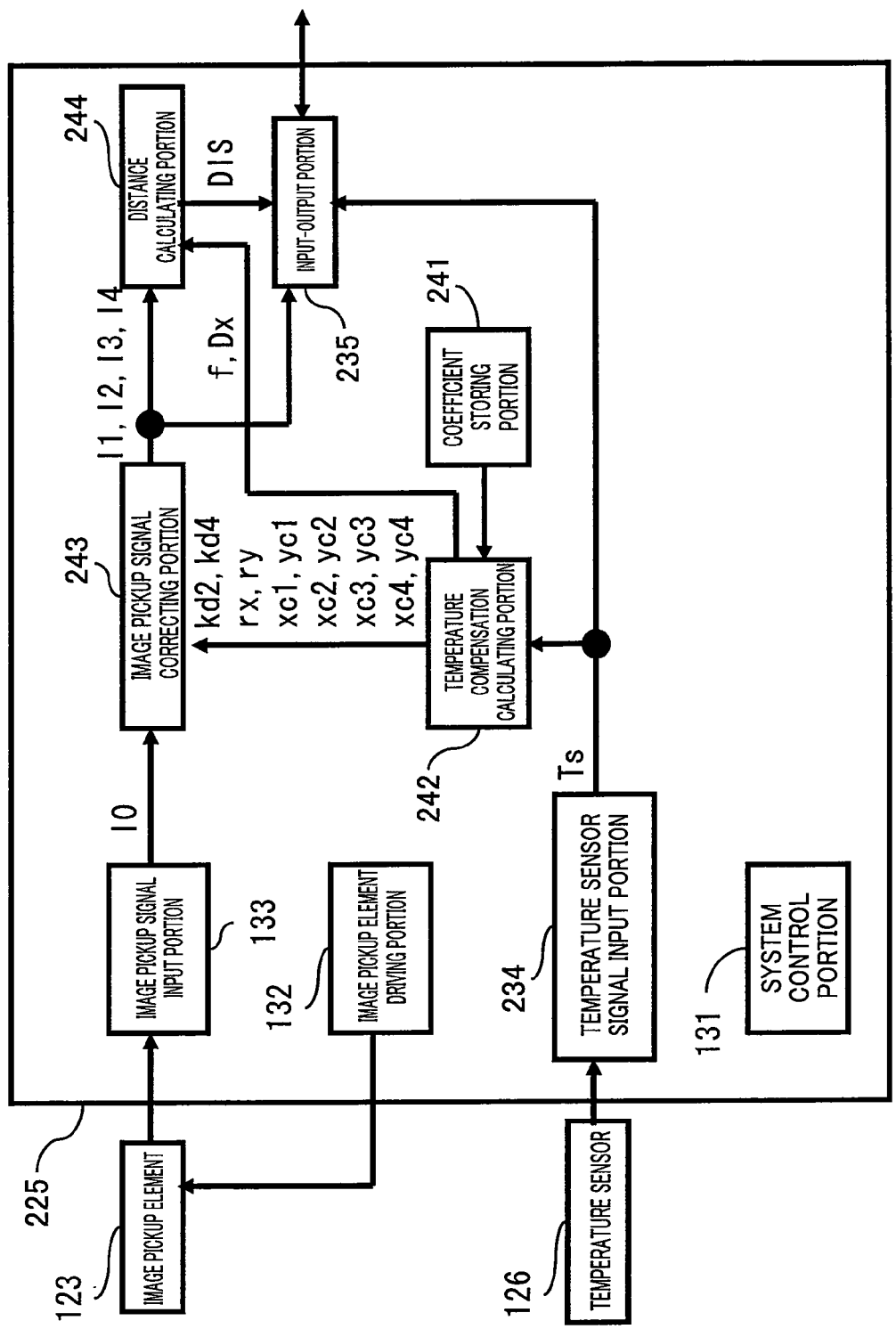
FIG. 29 is a block diagram showing the configuration of the image pickup apparatus according to Embodiment 3 of the present invention.

Next, the operation of the image pickup apparatus according to Embodiment 3 of the present invention will be explained. FIG. 29 is a block diagram showing the configuration of the image pickup apparatus according to Embodiment 3 of the present invention. The SLSI 225 includes the system control portion 131, the image pickup element driving portion 132, the image pickup signal input portion 133, a temperature sensor signal input portion 234, an input-output portion 235, a coefficient storing portion 241, a temperature compensation calculating portion 242, an image pickup signal correcting portion 243, and a distance calculating portion 244. Here, the temperature compensation calculating portion 242 and the image pickup signal correcting portion 243 constitute the temperature compensating and image pickup signal correcting portion.

The system control portion 131 is constituted by a CPU (Central Processing Unit), a logic circuit, or the like, and controls the entire SLSI 225.

Figure 30:
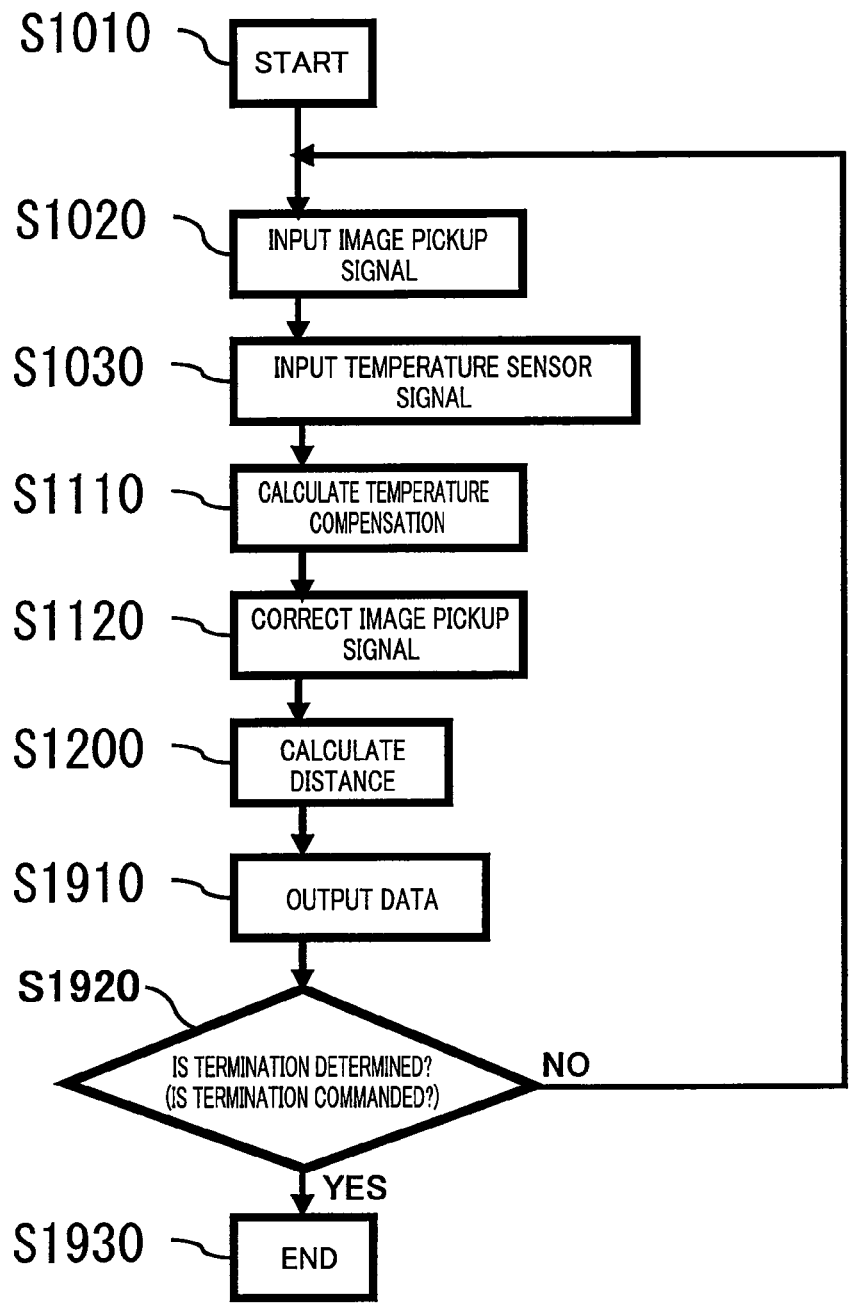
FIG. 30 is a flow chart showing an operation of the image pickup apparatus according to Embodiment 3 of the present invention.

FIG. 30 is a flow chart showing the operation of the image pickup apparatus according to Embodiment 3 of the present invention. The image pickup apparatus is operated by the system control portion 131 of the SLSI 225 in accordance with the flow chart of FIG. 30. In FIG. 30, the same reference numbers are used for the same or corresponding steps as in the flow chart of FIG. 9A of Embodiment 1.

In Step S1010, the image pickup apparatus 101 starts operating. For example, the host CPU (not shown) commands the image pickup apparatus 101 via the input-output portion 235 to start operating. Thus, the image pickup apparatus 101 starts operating. Next, Step S1020 is executed.

In Step S1020, the image pickup signal is input. The image pickup element driving portion 132 is constituted by, for example, a logic circuit. By the command of the system control portion 131, the image pickup element driving portion 132 generates a signal for driving the image pickup element 123 to carry out the operation of the electronic shutter and the transfer of the signal, and applies to the image pickup element 122 a voltage corresponding to this signal. The image pickup signal input portion 133 is configured such that the CDS circuit (Correlated Double Sampling Circuit), the AGC (Automatic Gain Controller), and the ADC (Analog Digital Converter) are connected in series. When the electric signal is input from the image pickup element 123 to the image pickup signal input portion 133, the image pickup signal input portion 133 removes the fixed noise by the CDS circuit, adjusts the gain by the AGC, and converts the analog signal into the digital value by the ADC to output the image pickup signal I0. Here, the image pickup signal input portion 133 outputs H0 pixels in the x direction and V0 pixels in the y direction as the image pickup signal I0 (x, y) in order of I0(0, 0) ((x, y)=(0, 0)), I0(1,0), I0(2,0), . . . , and I0(H0−1, V0−1). Next, Step S1030 is executed.

In Step S1030, the temperature sensor signal is input. The temperature sensor signal input portion 234 is constituted by, for example, an ADC (Analog Digital Converter). The temperature sensor signal input portion 234 receives the temperature sensor signal that is the analog voltage signal from the temperature sensor 126, converts the analog signal into the digital value, and outputs the digital value as a temperature sensor signal Ts. In the case of using a 12-bit ADC for example, the temperature sensor signal Ts has a value in a range from 0 to 4095. The following will be explained on the basis that the temperature sensor signal Ts is generated by the 12-bit ADC. Next, Step S1110 is executed.

In Step S1110, the temperature compensation of various coefficients is carried out. The temperature compensation calculating portion 242 receives the temperature sensor signal Ts and uses data stored in the coefficient storing portion 241 to output the distortion coefficients kd2 and kd4, magnification (rx, ry), the center (xc1, yc1) of the optical axis of the first lens portion 113a, the center (xc2, yc2) of the optical axis of the second lens portion 113b, the center (xc3, yc3) of the optical axis of the third lens portion 113c, the center (xc4, yc4) of the optical axis of the fourth lens portion 113d, the focal length f, and the distance Dx in the x direction between the optical axes of the lens portions.

FIG. 31 is a diagram for explaining the coefficient storing portion according to Embodiment 3 of the present invention. For simplicity, FIG. 31 shows only an x coordinate xc1 of the center of the optical axis of the first lens portion 113a. As shown in FIG. 31, the x coordinates xc1 of the center of the optical axis when the sensor temperature signal Ts is 0, 256, 512, 768, 1024, . . . , 3840, and 4096 are stored in the coefficient storing portion 241 as xc1_0, xc1_256, xc1_512, xc1_768, xc1_1024, . . . , xc1_3040, and xc1_4096, respectively. Then, the temperature compensation calculating portion 242 generates the x coordinate xc1 of the center of the optical axis corresponding to the temperature sensor value Ts through interpolation. For example, in a case where the temperature sensor value Ts is not less than 512 and less than 768, the x coordinate xc1 is generated by carrying out the interpolation as in Formula (111) below using the x coordinates xc1_512 and xc1_768 of the center of the optical axis when the temperature sensor signal Ts is 512 and 768. The other coefficients are generated in the same manner. To be specific, regarding each of a y coordinate yc1 of the center of the optical axis of the first lens portion 113a, the center (xc2, yc2) of the optical axis of the second lens portion 113b, the center (xc3, yc3) of the optical axis of the third lens portion 113c, the center (xc4, yc4) of the optical axis of the fourth lens portion 113d, the distortion coefficients k2 and k4, the magnification (rx, ry), the focal length f, and the distance Dx in the x direction between the optical axes of the lens portions, values thereof at respective temperatures are stored in the coefficient storing portion 241, and these coefficients are generated through the interpolation regarding the temperature sensor signal Ts.

$$xc1 = xc1\_512 + (Ts - 512)/(768 - 512) * (xc\_768 - xc1\_512) \quad (111)$$

The coefficients stored in the coefficient storing portion 241 are generated and stored in the following manner. The center of the optical axis of each lens portion is generated such that: as shown by Formulas (112) and (113) below, the amount of change dbx in the interval between the optical axes in the x direction due to the temperature increase and the amount of change dby in the interval between the optical axes in the y direction due to the temperature increase are calculated based on Formulas (109) and (110); and the center of the optical axis of each lens portion is moved by half the amount of change dbx and half the amount of change dby (p*dbx/2 in the x direction and p*dby/2 in the y direction). Here, T(Ts) denotes a physical temperature corresponding to the temperature sensor signal Ts that is the digital value converted by the ADC. Specifically, as shown by Formulas (114) and (115) below, the center (xc1, yc1) of the optical axis of the first lens portion 113a is generated so as to be moved by −dbx/2 in the x direction and −dby/2 in the y direction from the center (xc10, yc10) of the optical axis at the reference temperature Th0. As shown by Formulas (116) and (117) below, the center (xc2, yc2) of the optical axis of the second lens portion 113b is generated so as to be moved by +dbx/2 in the x direction and −dby/2 in the y direction from the center (xc20, yc20) of the optical axis at the reference temperature Th0. As shown by Formulas (118) and (119) below, the center (xc3, yc3) of the optical axis of the third lens portion 113c is generated so as to be moved by −dbx/2 in the x direction and +dby/2 in the y direction from the center (xc30, yc30) of the optical axis at the reference temperature Th0. The center (xc4, yc4) of the optical axis of the fourth lens portion 113d is generated so as to be moved by +dbx/2 in the x direction and +dby/2 in the y direction from the center (xc40, yc40) of the optical axis at the reference temperature Th0.

$$dbx = Dx^*(aL-aS)^*(T(Ts)-Th0)/p \quad (112)$$

$$dby = Dy^*(aL-aS)^*(T(Ts)-Th0)/p \quad (113)$$

$$xc1 = xc10 - dbx/2 \quad (114)$$

$$yc1 = yc10 - dby/2 \quad (115)$$

$$xc2 = xc20 + dbx/2 \quad (116)$$

$$yc2 = yc20 - dby/2 \quad (117)$$

$$xc3 = xc30 - dbx/2 \quad (118)$$

$$yc3 = yc30 + dby/2 \quad (119)$$

$$xc4 = xc40 + dbx/2 \quad (120)$$

$$yc4 = yc40 + dby/2 \quad (121)$$

Values of the distortion coefficients k2 and k4 at respective temperatures are calculated and generated through optical analysis, experiment, or the like.

A length lk of the barrel is estimated as shown by Formula (122) below. Here, Th0 denotes the reference temperature, lk0 denotes the length of the barrel at the reference temperature Th0, kk denotes a linear thermal expansion coefficient of the barrel, and T(Ts) denotes the physical temperature of the temperature sensor indicated by the temperature sensor signal Ts. Here, a ratio of change in length of the barrel is regarded as magnification. Specifically, magnification rx in the x direction and magnification ry in the y direction are generated as shown by Formulas (123) and (124) below.

$$lk = lk0^*\{1 + kk^*(T(Ts)-Th0)\} \quad (122)$$

$$rx = \{1 + kk^*(T(Ts)-Th0)\} \quad (123)$$

$$ry = \{1 + kk^*(T(Ts)-Th0)\} \quad (124)$$

Values of the focal length f at respective temperatures are calculated and generated through optical analysis, experiment, or the like.

The distance Dx between the optical axes in the x direction is generated as shown by Formula (125) below using the dbx of Formula (112) showing the amount of change in the distance between the optical axes in the x direction.

$$Dx = Dx0 + dbx^*p \quad (125)$$

The coefficients measured through various methods at respective temperatures may be stored. Next, Step S1120 is executed.

In Step S1120, an image is corrected and cut out. The image pickup signal correcting portion 243 receives the image pickup signal I0, the distortion coefficients kd2 and kd4, the magnification (rx, ry), the center (xc1, yc1) of the optical axis of the first lens portion 113a, the center (xc2, yc2) of the optical axis of the second lens portion 113b, the center (xc3, yc3) of the optical axis of the third lens portion 113c, and the center (xc4, yc4) of the optical axis of the fourth lens portion 113d. Then, the image pickup signal correcting portion 243 cut out from the image pickup signal I0 an image of the subject image formed by the lens portion and carries out correction processing, such as the distortion correction. Thus, the image pickup signal correcting portion 243 outputs the first image pickup signal I1(x, y) corresponding to the first lens portion 113a, the second image pickup signal I2(x, y) corresponding to the second lens portion 113b, the third image pickup signal I3(x, y) corresponding to the third lens portion 113c, and the fourth image pickup signal I4(x, y) corresponding to the fourth lens portion 113d.

Figure 32:
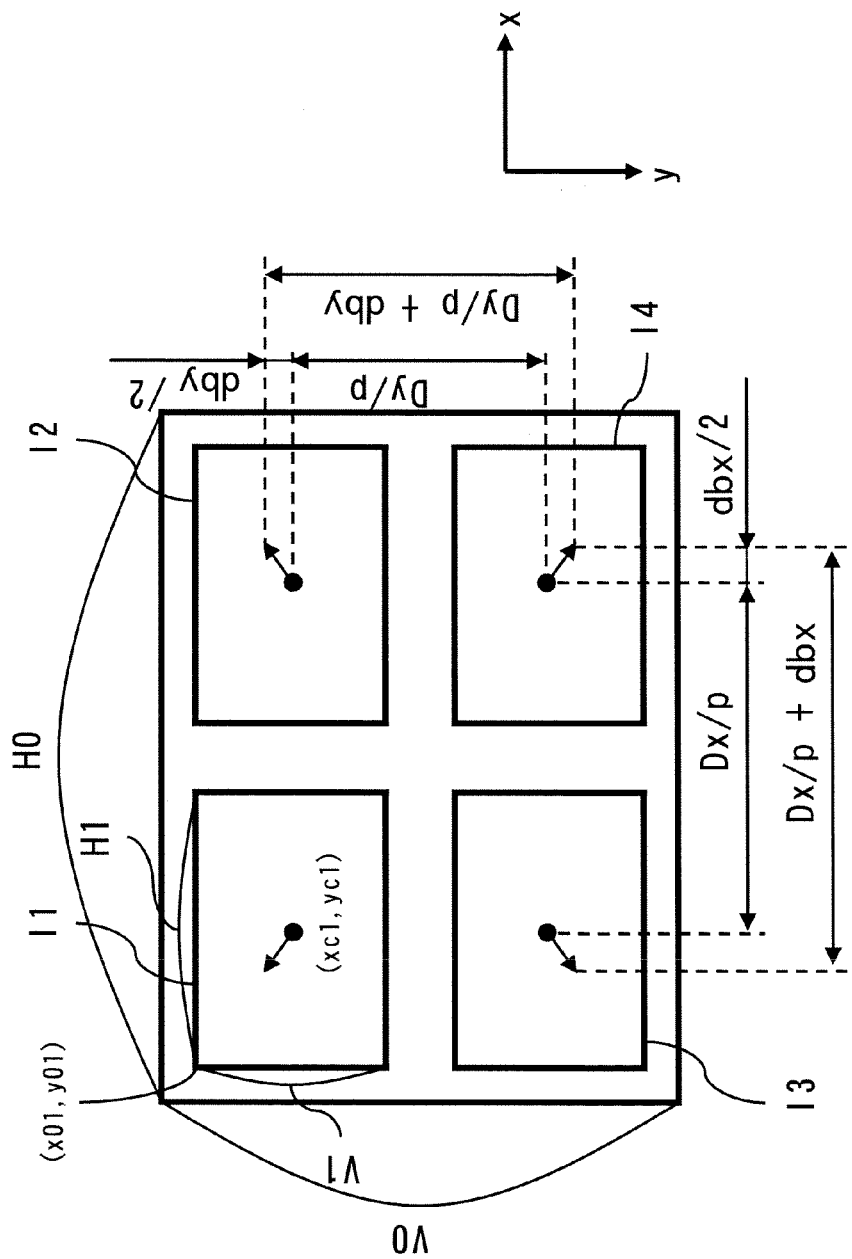
FIG. 32 is a diagram for explaining the cut-out position of the image pickup signal of the image pickup apparatus according to Embodiment 3 of the present invention.

FIG. 32 is a diagram for explaining a cut-out position of the image pickup signal in the image pickup apparatus according to Embodiment 3 of the present invention. In a case where there is no distortion and no expansion of the lens due to the temperature, as shown in FIG. 32, the first image pickup signal I1(x, y) is an image of a region cut out from the image pickup signal I0 and having the origin point (x01, y01), H1 pixels in the x direction, and V1 pixels in the y direction, the second image pickup signal I2(x, y) is an image of a region cut out from the image pickup signal I0 and having the origin point (x02, y02), H1 pixels in the x direction, and V1 pixels in the y direction, the third image pickup signal I3(x, y) is an image of a region cut out from the image pickup signal I0 and having the origin point (x03, y03), H1 pixels in the x direction, and V1 pixels in the y direction, and the fourth image pickup signal I4(x, y) is an image of a region cut out from the image pickup signal I0 and having the origin point (x04, y04), H1 pixel in the x direction, and V1 pixels in the y direction. The image pickup apparatus of Embodiment 3 carries out the following processing in consideration of the movement of the center of the optical axis due to the thermal expansion, the distortion correction, and magnification correction.

As shown by Formulas (126), (127), and (128) below, reference coordinates (tx1, ty1) for the first image pickup signal are calculated using the distortion coefficients kd2 and kd4, the magnification (rx, ry), and the center (xc1, yc1) of the optical axis of the first lens portion 113a. As shown by Formula (129) below, the first image pickup signal (x, y) is calculated from the image pickup signal I0 using the reference coordinates (tx1, ty1) for the first image pickup signal. The reference coordinates (tx1, ty1) for the first image pickup signal may have a decimal point. In this case, an integer portion of the reference coordinates (tx1, ty1) for the first image pickup signal is shown by (tx1i, ty1i), and a fractional portion of the reference coordinates (tx1, ty1) for the first image pickup signal is shown by (tx1f, ty1f). Thus, the first image pickup signal I1 (x, y) is calculated using four pixels as shown by Formula (130) below. In Formulas (126), (127), (128), (129), and (130), calculations are carried out in cases where x is from 0 to H1−1 and y is from 0 to V1−1. Similarly, as shown by Formulas (131), (132), and (133) below, reference coordinates (tx2, ty2) for the second image pickup signal are calculated using the distortion coefficients kd2 and kd4, the magnification (rx, ry), and the center (xc2, yc2) of the optical axis of the second lens portion 113b. As shown by Formula (134) below, the second image pickup signal I2(x, y) is calculated from the image pickup signal I0 using the reference coordinates (tx2, ty2) for the second image pickup signal. As shown by Formulas (135), (136), and (137) below, reference coordinates (tx3, ty3) for the third image pickup signal are calculated using the distortion coefficients kd2 and kd4, the magnification (rx, ry), and the center (xc3, yc3) of the optical axis of the third lens portion 113c. As shown by Formula (138) below, the third image pickup signal I3(x, y) is calculated from the image pickup signal I0 using the reference coordinates (tx3, ty3) for the third image pickup signal. As shown by Formulas (139), (140), and (141) below, reference coordinates (tx4, ty4) for the fourth image pickup signal are calculated using the distortion coefficients kd2 and kd4, the magnification (rx, ry), and the center (xc4, yc4) of the optical axis of the fourth lens portion 113d. As shown by Formula (142) below, the fourth image pickup signal I4(x, y) is calculated from the image pickup signal I0 using the reference coordinates (tx4, ty4) for the fourth image pickup signal. In Formulas below, ^2 denotes a square, and ^4 denotes a fourth power.

$$tx1=x01+xc1+(x-xc1)*(1+kd2*r1^2+kd4*r1^4)*rx \quad (126)$$

$$ty1=y01+yc1+(y-yc1)*(1+kd2*r1^2+kd4*r1^4)*ry \quad (127)$$

$$r1^2=(x-xc1)^2+(y-yc1)^2, r1^4=(r1^2)^2 \quad (128)$$

$$I1(x,y)=I0(tx1,ty1) \quad (129)$$

$$I1(x,y)=(1-tx1f)*(1-ty1f)*I0(tx1i,ty1i)+tx1f*(1-ty1f)\\*I0(tx1i+1,ty1i)+(1-tx1f)*ty1f*I0(tx1i,ty1i+1)+\\tx1f*ty1f*I0(tx1i+1,ty1i+1) \quad (130)$$

$$tx2=x02+xc2+(x-xc2)*(1+kd2*r2^2+kd4*r2^4)*rx \quad (131)$$

$$ty2=y02+yc2+(y-yc2)*(1+kd2*r2^2+kd4*r2^4)*ry \quad (132)$$

$$r2^2=(x-xc2)^2+(y-yc2)^2, r2^4=(r2^2)^2 \quad (133)$$

$$I2(x,y)=I0(tx2,ty2) \quad (134)$$

$$tx3=x03+xc3+(x-xc3)*(1+kd2*r3^2+kd4*r3^4)*rx \quad (135)$$

$$ty3=y03+yc3+(y-yc3)*(1+kd2*r3^2+kd4*r3^4)*ry \quad (136)$$

$$r3^2=(x-xc3)^2+(y-yc3)^2, r2^4=(r2^2)^2 \quad (137)$$

$$I3(x,y)=I0(tx3,ty3) \quad (138)$$

$$tx4=x04+xc4+(x-xc4)*(1+kd2*r4^2+kd4*r4^4)*rx \quad (139)$$

$$ty4=y04+yc4+(y-yc4)*(1+kd2*r4^2+kd4*r4^4)*ry \quad (140)$$

$$r4^2=(x-xc4)^2+(y-yc4)^2, r2^4=(r2^2)^2 \quad (141)$$

$$I4(x,y)=I0(tx4,ty4) \quad (142)$$

In a case where there is no distortion and the magnification is not corrected, the above transformation corresponds to an operation in which the images are cut out from the image pickup signal I0 (x, y) as shown by Formulas (143), (144), (145), and (146) below, and the parallel displacement is then carried out as shown by Formulas (147), (148), (149), and (150). Next, Step S1200 is executed.

$$I1(x,y)=I0(x+x01,y+y01) \quad (143)$$

$$I2(x,y)=I0(x+x02,y+y02) \quad (144)$$

$$I3(x,y)=I0(x+x03,y+y03) \quad (145)$$

$$I4(x,y)=I0(x+x04,y+y04) \quad (146)$$

$$I1(x,y)=I0(x-dbx/2,y-dby/2) \quad (147)$$

$$I2(x,y)=I2(x+dbx/2,y-dby/2) \quad (148)$$

$$I3(x,y)=I3(y-dbx/2,x+dby/2) \quad (149)$$

$$I4(x,y)=I4(x+dbx/2,y+dby/2) \quad (150)$$

In Step S1200, the distance is calculated. The distance calculating portion 244 receives the first image pickup signal I1, the second image pickup signal I2, the third image pickup signal I3, the fourth image pickup signal I4, the focal length f, and the distance Dx between the optical axes in the x direction, calculates the distance, and outputs distance data DIS.

Figure 33:
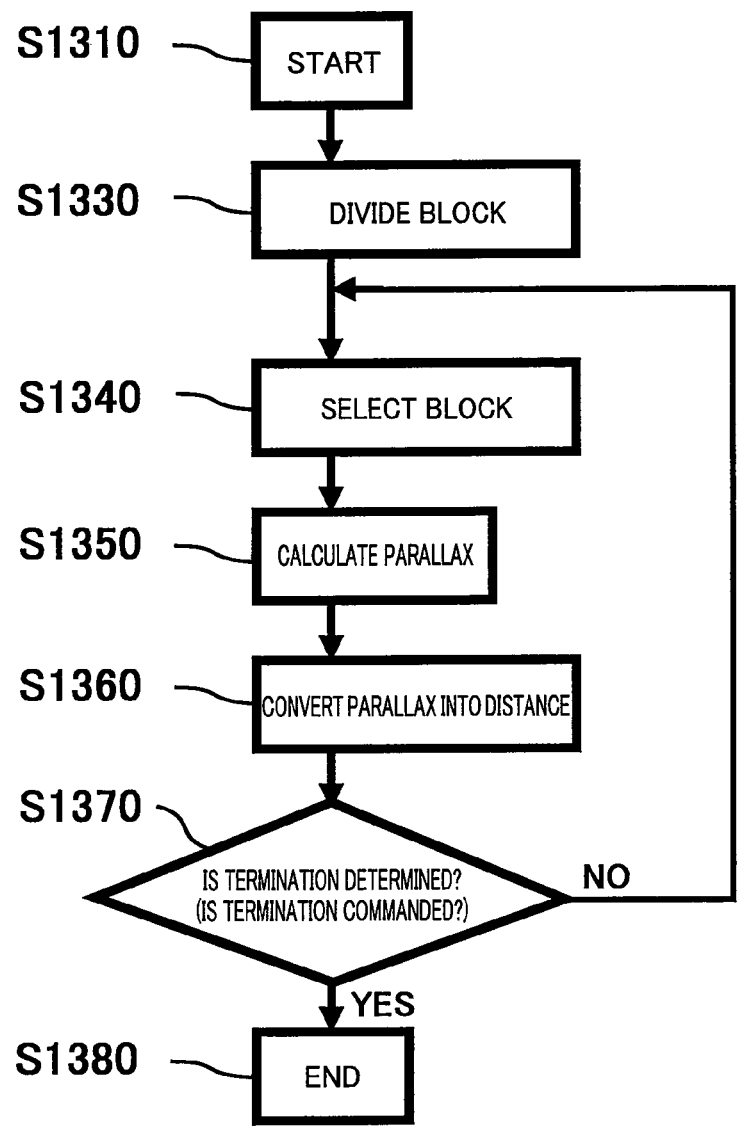
FIG. 33 is a flow chart showing an operation of a distance calculating portion of the image pickup apparatus according to Embodiment 3 of the present invention.

FIG. 33 is a flow chart showing the operation of the distance calculating portion in the image pickup apparatus according to Embodiment 3 of the present invention. The flow chart of FIG. 33 shows details of the operation of Step S1200. In the calculation of Step S1200, first, Step S1310 is executed.

In Step S1310, the operation of the calculation starts. Next, Step S1330 is executed.

In Step S1330, a block is divided.

Figure 34:
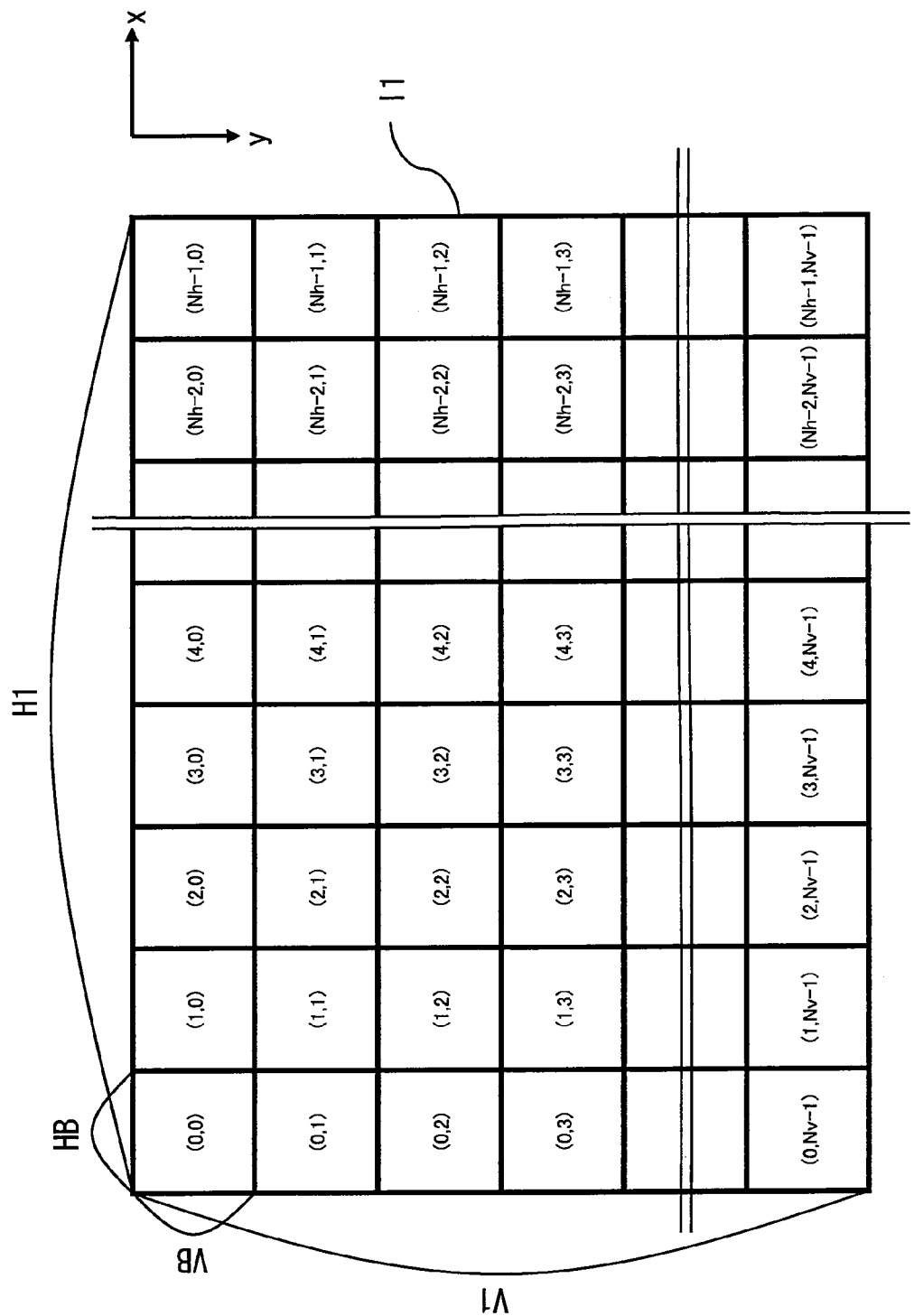
FIG. 34 is a diagram for explaining block division in the image pickup apparatus according to Embodiment 3 of the present invention.

FIG. 34 is a diagram for explaining the block division in the image pickup apparatus according to Embodiment 3 of the present invention. In FIG. 34, the first image pickup signal I1 is divided into rectangular blocks each having HB pixels in the x direction and VB pixels in the y direction, and has Nh blocks in the x direction and Nv blocks in the y direction. Next, Step S1340 is executed.

In Step S1340, a block is selected. When executing Step S1340 for the first time after Step S1310 (FIG. 33) is executed, the block indicated by (0, 0) is selected. After that, when executing Step S1340, a block on the right side of the previous block is selected. After the block (block indicated by (Nh−1,0), (Nh−1,1), . . . ) on the right end in FIG. 34 is selected, the block (block indicated by (0, 1), (0, 2), . . . ) on the left end in a row under the previous block is selected. To be specific, in a case where a first execution of Step S1340 after the execution of Step S1310 is regarded as a 0-time execution, a block indicated by (i % Nh, int(i/Nh)) is selected at the time of an i-th-time execution of Step S1340. Here, i % Nh denotes a residue in a case where i is divided by Nh, and int(i/Nh) denotes an integer portion of a quotient when i is divided by Nh. Hereinafter, this block is referred to as a selected block B(ih, iv). Next, Step S1350 is executed.

In Step S1350, the parallax calculation is carried out. First, the parallax between the first lens image pickup signal I1 and the second lens image pickup signal I2 and the reliability of the parallax are calculated. First, a parallax evaluated value R12(kx) regarding the first lens image pickup signal I1 and the second lens image pickup signal I2 is calculated. Here, kx denotes the displacement amount showing how much amount an image is displaced, and kx is changed to be 0, 1, 2, . . . , and SB.

Figure 35:
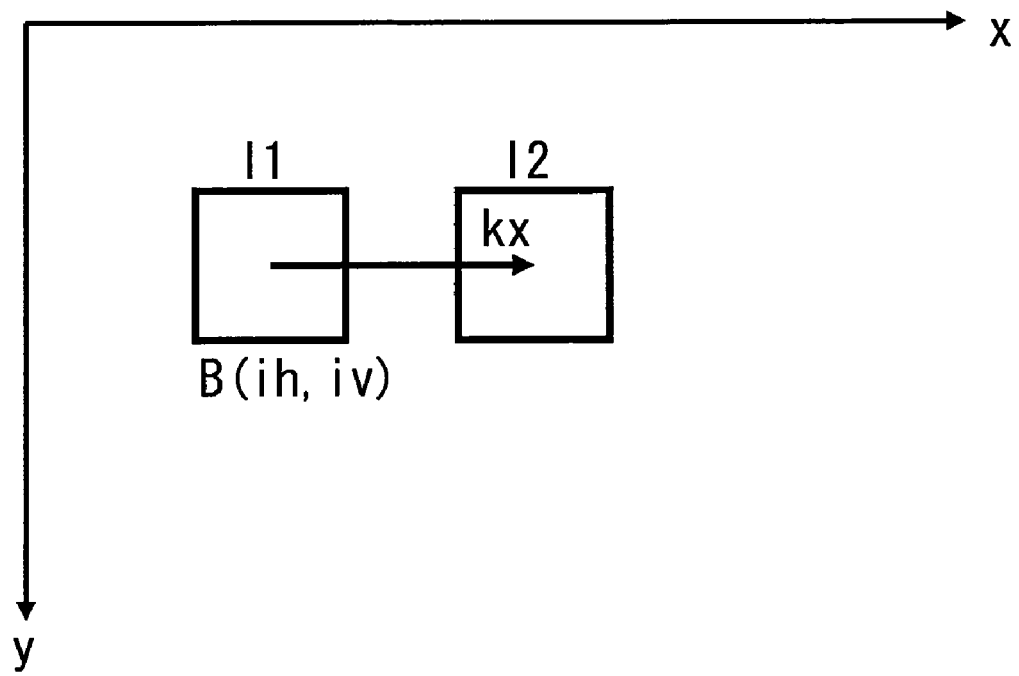
FIG. 35 is a diagram for explaining the calculation region of the parallax evaluated value in the parallax calculation utilizing the first image pickup signal and the second image pickup signal in the image pickup apparatus according to Embodiment 3 of the present invention.

FIG. 35 is a diagram for explaining the calculation region of the parallax evaluated value in the parallax calculation utilizing the first image pickup signal and the second image pickup signal in the image pickup apparatus according to Embodiment 3 of the present invention. In FIG. 35, a region indicated by I1 is a region selected by the selected block B(ih, iv) of the first lens image pickup signal I1, and a region indicated by I2 is the second lens image pickup signal I2 in a region away from the coordinates of the selected block by kx in the x direction. In cases where the displacement amount kx is from 0 to SB, the sum of absolute differences (SAD) shown by Formula (151) below is calculated, thereby obtaining the parallax evaluated value R12(kx). To be specific, the parallax evaluated value R12(kx) is calculated using the first lens image pickup signal I1 as a reference.

$$R12(kx)=\Sigma\Sigma|I1(x,y)-I2(x+kx,y)| \quad (151)$$

The parallax evaluated value R12(kx) shows how much the first lens image pickup signal I1 of the selected block B(ih, iv) and the second lens image pickup signal I2 in the region away from the selected block by kx in the x direction are correlated to each other. The smaller the parallax evaluated value R12 (kx) is, the stronger the correlation therebetween is (that is, in a case where the parallax evaluated value R12(kx) is small, the first lens image pickup signal I1 and the second lens image pickup signal I2 are similar to each other).

Figure 36:
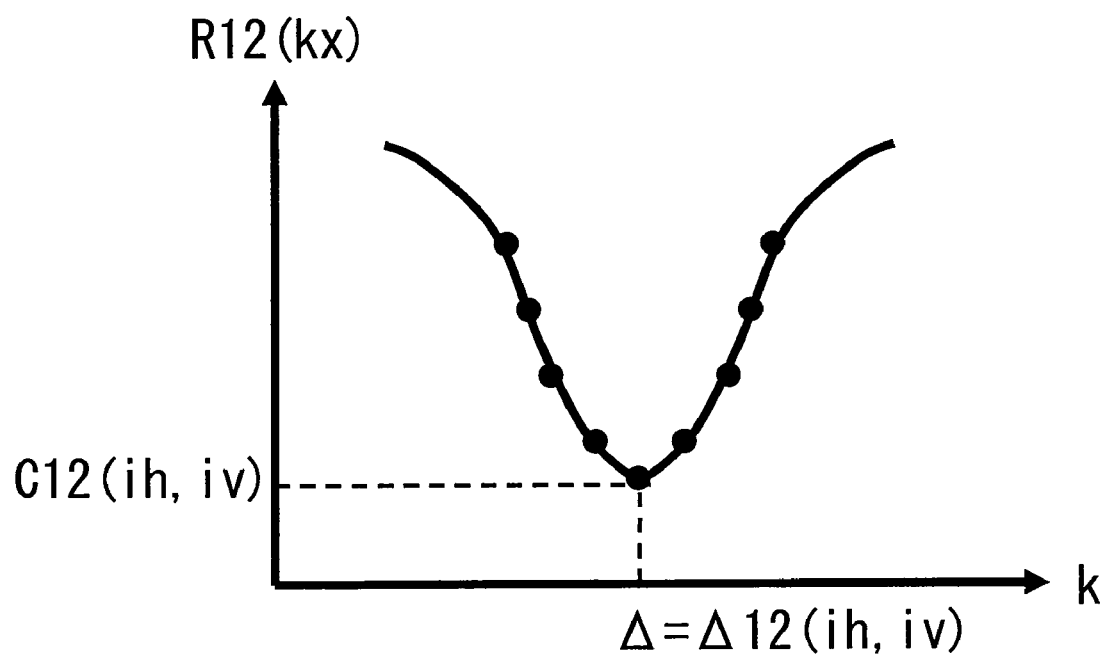
FIG. 36 is a diagram for explaining a relation between a displacement amount and the parallax evaluated value in the parallax calculation utilizing the first image pickup signal and the second image pickup signal in the image pickup apparatus according to Embodiment 3 of the present invention.

FIG. 36 is a diagram for explaining a relation between the displacement amount and the parallax evaluated value in the parallax calculation utilizing the first image pickup signal and the second image pickup signal in the image pickup apparatus according to Embodiment 3 of the present invention. As shown in FIG. 36, the parallax evaluated value R12(kx) changes depending on the value of the displacement amount kx and becomes a minimal value when the displacement amount kx is Δ. This shows that the first lens image pickup signal I1 of the selected block B(ih, iv) and the second lens image pickup signal I2 in the region away from the selected block by Δ in the x direction are most strongly correlated to each other, that is, most similar to each other. Therefore, it is found that the parallax between the first lens image pickup signal I1 and the second lens image pickup signal I2 in the selected block B(ih, iv) is Δ. As shown by Formula (152) below, the parallax Δ is regarded as a parallax value Δ12(ih, iv) between the first lens image pickup signal I1 and the second lens image pickup signal I2 in the selected block B(ih, iv). As shown by Formula (153) below, the parallax evaluated value R12(Δ) is regarded as a reliability C12(ih, iv) of the parallax between the first lens image pickup signal I1 and the second lens image pickup signal I2 in the selected block B(ih, iv).

$$\Delta 12(ih,iv)=\Delta \quad (152)$$

$$C12(ih,iv)=R12(\Delta) \quad (153)$$

Next, the parallax between the first lens image pickup signal I1 and the third lens image pickup signal I3 and the reliability of the parallax are calculated in the same manner as above. Note that a displacing direction is changed to the y direction, and the displacement amount is ky. As shown by Formula (154), a parallax evaluated value R13(ky) regarding the first lens image pickup signal I1 and the third lens image pickup signal I3 in the selected block B(ih, iv) is calculated. To be specific, the parallax evaluated value R13(ky) is calculated using the first lens image pickup signal I1 as a reference. As shown by Formula (155) below, the displacement amount which gives a minimum value, i.e., the parallax Δ is regarded as a parallax value Δ13(ih, iv) between the first lens image pickup signal I1 and the third lens image pickup signal I3 in the selected block B(ih, iv). As shown by Formula (156) below, the parallax evaluated value R13(Δ) is regarded as a reliability C13(ih, iv) of the parallax between the first lens image pickup signal I1 and the third lens image pickup signal I3 in the selected block B(ih, iv).

$$R13(ky)=\Sigma\Sigma|I1(x,y)-I3(x,y+ky)| \quad (154)$$

$$\Delta 13(ih,iv)=\Delta \quad (155)$$

$$C13(ih,iv)=R13(\Delta) \quad (156)$$

Next, the parallax between the first lens image pickup signal I1 and the fourth lens image pickup signal I4 and the reliability of the parallax are calculated in the same manner as above. Note that the displacing direction is changed to an oblique direction (direction in which the optical axis of the first lens portion 113a and the optical axis of the fourth lens portion 113d are opposite to each other), and the displacement amount is kx in the x direction and kx*Dy/Dx in the y direction. As shown by Formula (157) below, a parallax evaluated value R14(kx) regarding the first lens image pickup signal I1 and the fourth lens image pickup signal I4 in the selected block B(ih, iv) is calculated. To be specific, the parallax evaluated value R14(kx) is calculated using the first lens image pickup signal I1 as a reference. As shown by Formula (158) below, the displacement amount which gives a minimum value, i.e., the parallax Δ is regarded as a parallax value Δ14(ih, iv) between the first lens image pickup signal I1 and the fourth lens image pickup signal I4 in the selected block B(ih, iv). As shown by Formula (159) below, the parallax evaluated value R14(Δ) is regarded as a reliability C14(ih, iv) of the parallax between the first lens image pickup signal I1 and the fourth lens image pickup signal I4 in the selected block B(ih, iv). In a case where the coordinates (x+kx, y+kx*Dy/Dx) becomes a decimal number in Formula (157), the lens image pickup signal I4 is calculated through linear interpolation using peripheral pixels. As in FIG. 2, Dx and Dy respectively denote the interval between the first lens portion 113a and the fourth lens portion 113d in the x direction and the interval between the first lens portion 113a and the fourth lens portion 113d in the y direction.

$$R14(ky)=\Sigma\Sigma|I1(x,y)-I4(x+kx,y+kx^*Dy/Dx)| \quad (157)$$

$$\Delta 14(ih,iv)=\Delta \quad (158)$$

$$C14(ih,iv)=R14(\Delta) \quad (159)$$

Then, the above three reliabilities are compared to one another, and the most reliable parallax value is regarded as the parallax value of this block. To be specific, as shown by Formula (160) below, three reliabilities C12(ih, iv), C13(ih, iv), and C14(ih, iv) are compared to one another. When the reliability C12(ih, iv) is the smallest, Δ12(ih, iv) is regarded as the parallax value Δ(ih, iv) of the block B(ih, iv). When the reliability C13(ih, iv) is the smallest, Δ13(ih, iv) is regarded as the parallax value Δ(ih, iv) of the block B(ih, iv). When the reliability C14(ih, iv) is the smallest, Δ14(ih, iv) is regarded as the parallax value Δ(ih, iv) of the block B(ih, iv). Herein, the sum of absolute differences (Formulas (53), (56), and (59)) is used as the reliability (C12, C13, and C14). However, the normalized correlation coefficient may be used. In this case, the parallax value which gives the highest reliability is selected. Here, in the case of adopting Δ13(ih, iv), Dx/Dy that is the ratio of the intervals of the lens portions is multiplied to unify the parallax values in the x direction. Next, Step S1360 is executed.

$$\Delta(ih,iv)=\Delta 12(ih,iv)\text{(when }C12(ih,iv)\text{is the smallest)}$$

$$=\Delta 13(ih,iv)^*Dx/Dy\text{(when }C13(ih,iv)\text{is the smallest)}$$

$$=\Delta 14(ih,iv)\text{(when }C14(ih,iv)\text{is the smallest)} \quad (160)$$

In Step S1360, the distance is calculated based on the parallax. Since Formula (8) is obtained by solving Formula (7) regarding a distance A, the distance DIS(x, y) of the region in the block B(ih, iv) is shown by Formula (161) below. Here, f denotes the focal length, Dx denotes the distance between the optical axes in the x direction, and p denotes the pitch of the light receiving elements of the image pickup element 123. Since the parallax value Δ is a pixel unit, the parallax value Δ is multiplied by p to be converted into the same unit system as the focal length f and the like. Next, Step S1370 is executed.

$$DIS(x,y)=\{f^*Dx\}/\{p^*\Delta(ih,iv)\}((x,y)\text{ is in a range of }B(ih,iv)) \quad (161)$$

In Step S1370, whether or not the distance calculation is terminated is determined. In a case where all the blocks are selected (in a case where the selected block is B(Nh−1, Nv−1)), it is determined that the distance calculation is terminated, and next, Step S1380 is executed. In contrast, in a case where all the blocks are not selected (in a case where the selected block is not B(Nh−1, Nv−1)), it is determined that the distance calculation is continued, and next, Step S1340 is executed.

In Step S1380, the distance calculation is terminated, and the process returns to the upper routine. Thus, the distance DIS(x, y) at the coordinates (x, y) after cutting is calculated. Next, Step S1910 (FIG. 30) is executed.

In Step S1910, the input-output portion 235 outputs the image data, the distance data, and the temperature data to outside the image pickup apparatus 101. The image pickup signal I0 or the first image pickup signal I1 is output as the image data. The distance DIS is output as the distance data. The temperature sensor signal Ts is output as the temperature data. Next, Step S1920 is executed.

In Step S1920, whether or not the operation is terminated is determined. For example, the system control portion 131 communicates with the host CPU (not shown) via the input-output portion 235 and requests a command regarding whether or not the operation is terminated. In a case where the host CPU commands the termination, the operation is terminated, and next, Step S1930 is executed. In contrast, in a case where the host CPU does not command the termination, the operation is continued, and next, Step S1020 is executed. To be specific, as long as the host CPU does not command the termination, a loop of Steps S1020, S1030, S1110, S1120, S1200, and S1910 is continuously executed.

In Step S1930, the operation of the image pickup apparatus 101 is terminated.

The following effects can be obtained by configuring the image pickup apparatus of the present embodiment as above and causing the image pickup apparatus of the present embodiment to operate as above.

As above, in the image pickup apparatus of Embodiment 3, the temperature sensor 126 measures the ambient temperature of the lens array 113 and inputs the ambient temperature as the temperature sensor signal Ts. Since the lens array 113 has a substantially circular shape, it expands isotropically. By utilizing this, the amount of change dbx in the interval between the optical axes in the x direction due to the temperature increase of the lens array 113 and the amount of change dby in the interval between the optical axes in the y direction due to the temperature increase of the lens array 113 are calculated by Formulas (112) and (113). Then, the center (xc1, yc1) of the optical axis of the first lens portion 113a, the center (xc2, yc2) of the optical axis of the second lens portion 113b, the center (xc3, yc3) of the optical axis of the third lens portion 113c, and the center (xc4, yc4) of the optical axis of the fourth lens portion 113d are generated by Formulas (114) to (121) on the basis that the optical axis changes by half the interval. Based on these, the coordinate transformation is carried out. With this, the same effects as in Embodiment 1 can be obtained.

For example, in the case of the x coordinate xc1 of the center of the optical axis of the first lens portion 113a, the image pickup apparatus of Embodiment 3 stores plural sets of correction coefficients (xc1__0, xc1__256, xc1__512, xc1__768, xc1__1024, . . . , xc1__3840, and xc1__4096 that are values when the sensor temperature signal Ts is 0, 256, 512, 768, 1024, . . . , 3840, and 4096, respectively) corresponding to the temperature sensor signal Ts in the coefficient storing portion 241, and carries out interpolation regarding the temperature sensor signal Ts as shown by Formula (111) to generate the correction coefficient corresponding to the temperature sensor signal Ts. Similarly, regarding each of the y coordinates yc1 of the center of the optical axis of the first lens portion 113a, the center (xc2, yc2) of the optical axis of the second lens portion 113b, the center (xc3, yc3) of the optical axis of the third lens portion 113c, the center (xc4, yc4) of the optical axis of the fourth lens portion 113d, the distortion coefficients k2 and k4, the magnification (rx, ry), the focal length f, and the distance Dx between the optical axes of the lens portions in the x direction, values thereof at respective temperatures are stored in the coefficient storing portion 241, the interpolation is carried out using the temperature sensor signal Ts, and the correction coefficient corresponding to the temperature sensor signal Ts is generated.

With this, it becomes unnecessary to calculate the correction coefficient using the correction formula (to do calculations, such as Formulas (112) to (121)). Therefore, a calculating time and a calculating circuit become unnecessary. Thus, the low-cost image pickup apparatus can be realized. Moreover, regarding the correction coefficient which changes complexly nonlinearly depending on the temperature, values obtained through optical analysis, experiment, and the like are stored and used. With this, an error that is a difference between the change represented by the correction formula and the actual change is prevented, and the influences of the distortion can be reduced accurately. Therefore, the detection of the parallax and the distance measurement can be carried out with high accuracy.

Moreover, when the image pickup apparatus of Embodiment 3 prestores the correction coefficient corresponding to the temperature sensor signal Ts, it stores not the correction coefficients corresponding to all the temperature sensor signals Ts (that has digital values from 0 to 4095) but the correction coefficients corresponding to the temperature sensor signals Ts of every 256, and generates the correction coefficient interpolated with respect to the temperature. For example, in the case of the x coordinate xc1 of the center of the optical axis of the first lens portion 113a, the correction coefficients (xc1__0, xc1__256, xc1__512, xc1__768, xc1__1024, . . . , xc1__3840, xc1__4096 that are values when the sensor temperature signal Ts is 0, 256, 512, 768, 1024, . . . , 3840, and 4096, respectively) corresponding to the temperature sensor signals Ts of every 256 are stored, and the coefficients are used through interpolation regarding the temperature sensor signal Ts. With this, since the storage region can be reduced by 1/256 time, it is possible to realize the low-cost image pickup apparatus in which a circuit size is reduced.

Moreover, in the image pickup apparatus of Embodiment 3, based on the center (xc1, yc1) of the optical axis of the first lens portion 113a, the center (xc2, yc2) of the optical axis of the second lens portion 113b, the center (xc3, yc3) of the optical axis of the third lens portion 113c, the center (xc4, yc4) of the optical axis of the fourth lens portion 113d, the distortion coefficients k2 and k4, and the magnification (rx, ry), the image pickup signal correcting portion 243 obtains the reference coordinates (tx1, ty1) for the first image pickup signal using Formulas (126), (127), and (128), the reference coordinates (tx2, ty2) for the second image pickup signal using Formulas (131), (132), and (133), the reference coordinates (tx3, ty3) for the third image pickup signal using Formulas (135), (136), and (137), and the reference coordinates (tx4, ty4) for the fourth image pickup signal using Formulas (139), (140), and (141). Then, the image pickup signal correcting portion 243 carries out the interpolation as shown by Formulas (129), (130), (134), (138), and (142) in reference to a plurality of image pickup signals indicated by the reference coordinates to generate the first image pickup signal I1, the second image pickup signal I2, the third image pickup signal I3, and the fourth image pickup signal I4 that are corrected image pickup signals.

In the case of calculating and storing the reference coordinates in advance, the reference coordinates (the reference coordinates (tx1, ty1) for the first image pickup signal, the reference coordinates (tx2, ty2) for the second image pickup signal, the reference coordinates (tx3, ty3) for the third image pickup signal, and the reference coordinates (tx4, ty4) for the fourth image pickup signal) of all the pixels (the total number of pixels is 4*H1*V1) of the corrected image pickup signals (the first image pickup signal I1, the second image pickup signal I2, the third image pickup signal I3, and the fourth image pickup signal I4) become necessary. Therefore, a huge memory capacity is required, and this increases the cost. Especially, in a case where it is necessary to change the reference coordinates depending on the temperature, the reference coordinates corresponding to respective temperatures become necessary, and this requires a further huge memory capacity. By the configuration of the present embodiment, the reference coordinates (the reference coordinates (tx1, ty1) for the first image pickup signal, the reference coordinates (tx2, ty2) for the second image pickup signal, the reference coordinates (tx3, ty3) for the third image pickup signal, and the reference coordinates (tx4, ty4) for the fourth image pickup signal) are sequentially calculated from the correction coefficients (the center (xc1, yc1) of the optical axis of the first lens portion 113a, the center (xc2, yc2) of the optical axis of the second lens portion 113b, the center (xc3, yc3) of the optical axis of the third lens portion 113c, the center (xc4, yc4) of the optical axis of the fourth lens portion 113d, the distortion coefficients k2 and k4, and the magnification (rx, ry)) to generate the corrected image pickup signals (the first image pickup signal I1, the second image pickup signal I2, the third image pickup signal I3, and the fourth image pickup signal I4). With this, the storage region may be assigned to only the correction coefficients, and a large-capacity storage region is unnecessary. Therefore, the low-cost image pickup apparatus can be realized. Especially, this effect is significant in a case where the reference coordinates need to be changed based on the temperature.

Moreover, in the image pickup apparatus of Embodiment 3, the temperature compensation calculating portion 242 generates the focal length f based on the temperature sensor signal Ts, and the focal length f is utilized for the distance calculation in Formula (161) in the distance calculating portion 244. A refractive-index variation of the lens array 113 changes depending on the temperature change, and this changes the focal length f. Therefore, in the case of using a constant focal length f, the accuracy of distance measurement deteriorates by the temperature change of the focal length f. By the configuration of the present invention, the focal length f corresponding to the temperature change of the lens array 113 can be used in the distance calculation. Therefore, the highly accurate distance calculation can be realized.

Moreover, in the image pickup apparatus of Embodiment 3, the temperature compensation calculating portion 242 generates the magnification (rx, ry) based on the temperature sensor signal Ts, and the image pickup signal correcting portion 243 corrects the image pickup signal I0 based on the magnification (rx, ry) and the like to generate the corrected image pickup signals (the first image pickup signal I1, the second image pickup signal I2, the third image pickup signal I3, and the fourth image pickup signal I4). The length of the barrel 111 (the distance between the principal point of each of the lens portions (the first lens portion 113a, the second lens portion 113b, the third lens portion 113c, and the fourth lens portion 113d) of the lens array 113 and the light receiving surface of the image pickup element 123) changes depending on the temperature change, and this changes the magnification. Therefore, if the change in the magnification is not considered, the accuracy of distance measurement deteriorates by the change in length of the barrel due to the temperature. By the configuration of the present embodiment, since the image pickup signal is corrected by the magnification (rx, ry) corresponding to the change in length of the barrel 111 due to the temperature, the influences of the change in length of the barrel due to the temperature can be reduced. With this, the highly accurate parallax calculation can be realized, and the highly accurate distance calculation can be therefore realized.

In the image pickup apparatus of Embodiment 3, the focal length f is changed based on the temperature sensor signal Ts. However, the focal length f may be maintained constant, and the magnification (rx, ry) may be changed. Since the magnification changes in proportion to the change in the focal length f, a ratio of a focal length to the focal length at the reference temperature Th0 is regarded as a ratio of the change in the magnification regarding the focal length. Specifically, f denotes the focal length at the temperature T(Ts), and f0 denotes the focal length at the reference temperature Th0. A right side of each of Formulas (123) and (124) is multiplied by a ratio (f/f0) that is a ratio of the change in the focal length. Thus, the magnification (rx, ry) is calculated as shown by Formulas (162) and (163) below.

$$rx = \{1 + kk^*(T(Ts) - Tk0)\}^*(f/f0) \tag{162}$$

$$ry = \{1 + kk^*(T(Ts) - Tk0)\}^*(f/f0) \tag{163}$$

Moreover, in the image pickup apparatus of Embodiment 3, the lens array 113 includes four lens portions. However, the present embodiment is not limited to this. The number of lens portions may be changed.

Figure 37:
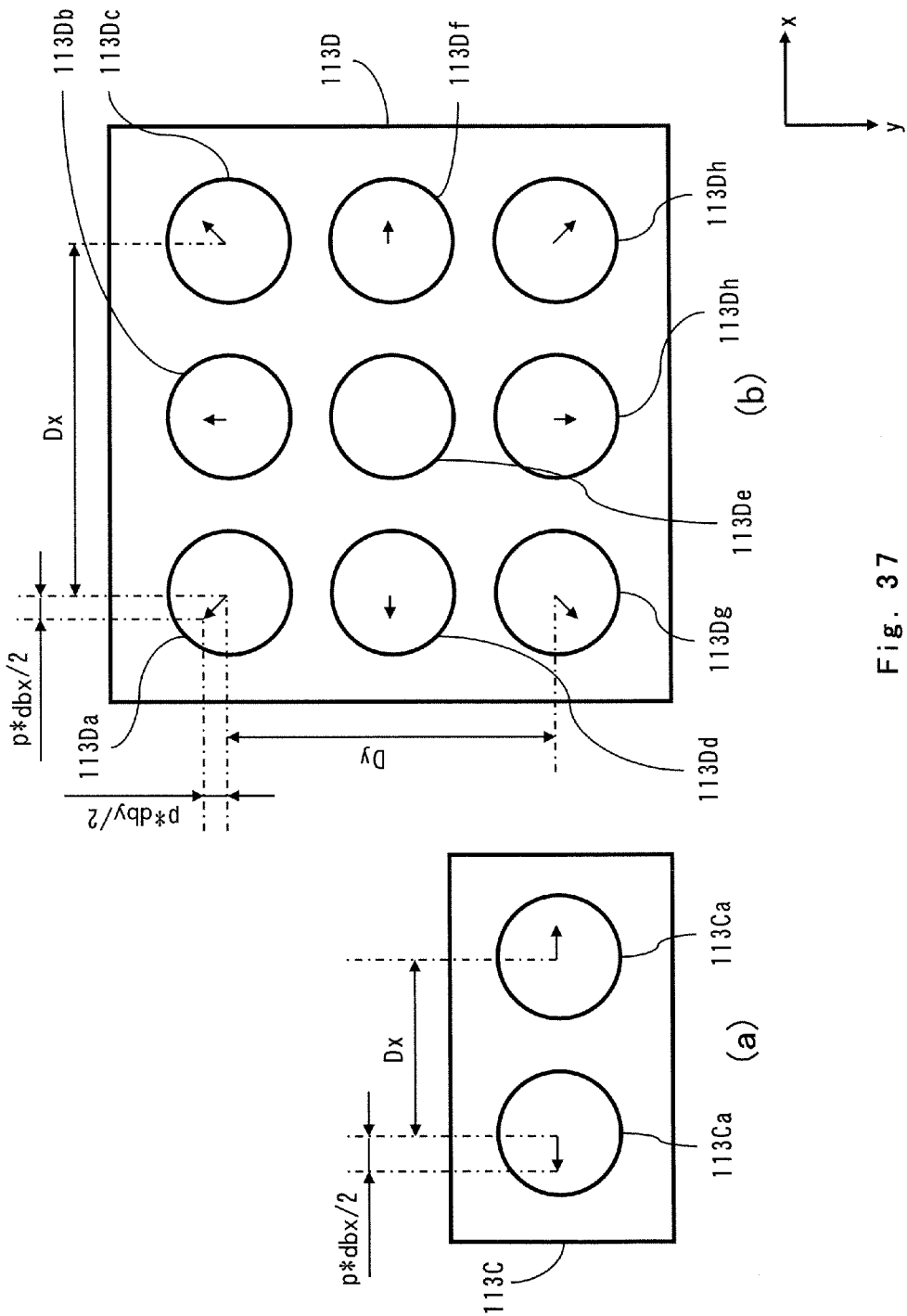
FIG. 37 is a plan view showing the configuration of the lens array of the image pickup apparatus according to Modification Example of Embodiment 3.
Figure 38:
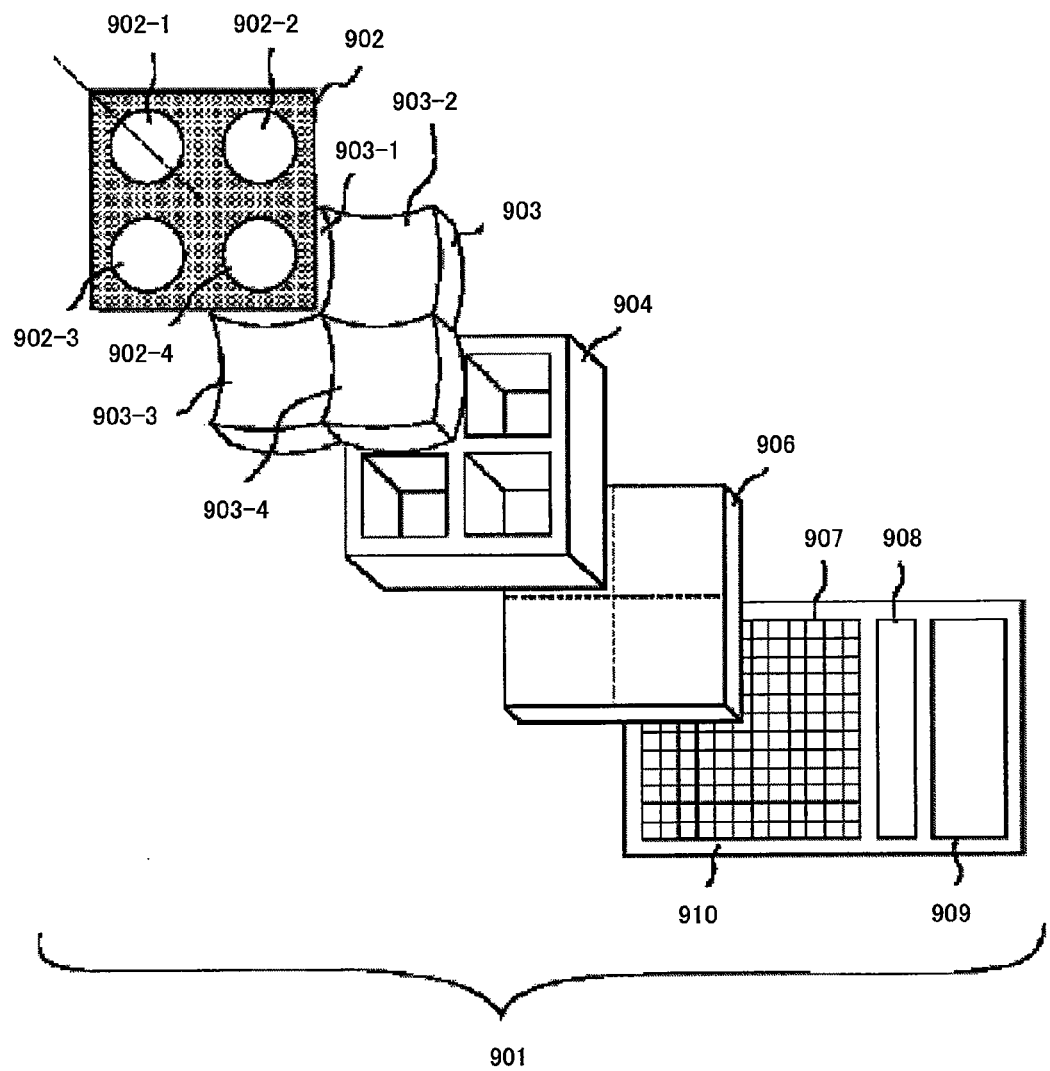
FIG. 38 is an exploded perspective view of a conventional image pickup apparatus.
Figure 39:
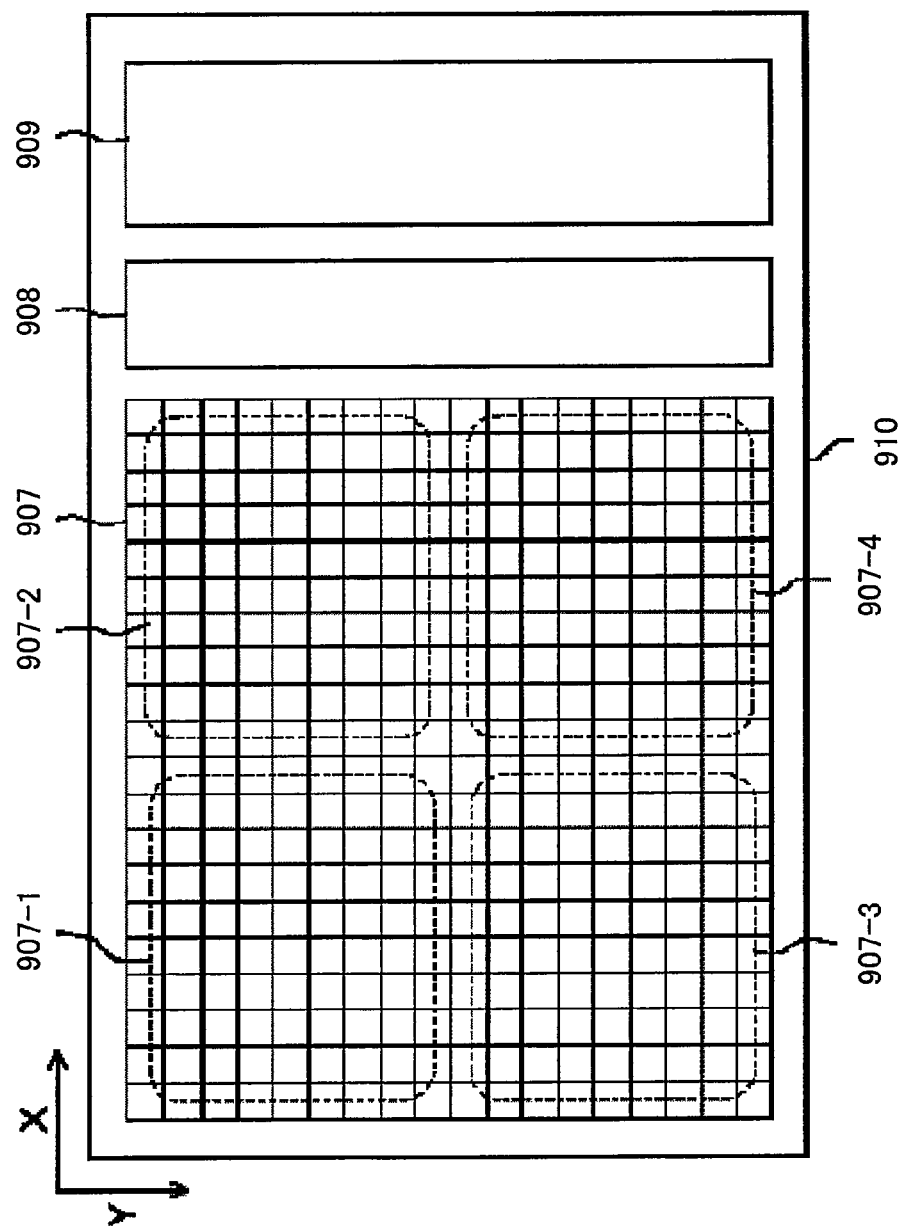
FIG. 39 is a diagram for explaining an image pickup block of the conventional image pickup apparatus.

FIG. 37 is a plan view showing the configuration of the lens array of the image pickup apparatus according to Modification Example of Embodiment 3. As shown by the lens array 113C in FIG. 37(a), two lens portions (a first lens portion 113Ca and a second lens portion 113Cb) may be arranged so as to be spaced apart from each other by Dx in the x direction. The centers of the optical axes of the lens portions are determined and stored in the coefficient storing portion 241 in the following manner. The centers of the optical axes of the lens portions are generated such that as shown by Formula (112), the amount of change dbx in the interval between the optical axes in the x direction due to the temperature increase is calculated, and each of the centers of the optical axes is moved by half the amount of change dbx (p*dbx/2 in the x direction). Specifically, as shown by Formulas (164) and (165) below, the center (xc1, yc1) of the optical axis of the first lens portion 113Ca is generated so as to be moved by −dbx/2 in the x direction from the center (xc10, yc10) of the optical axis at the reference temperature Th0. As shown by Formulas (166) and (167) below, the center (xc2, yc2) of the optical axis of the second lens portion 113Cb is generated so as to be moved by +dbx/2 in the x direction from the center (xc20, yc20) of the optical axis at the reference temperature Th0.

$$xc1 = xc10 - dbx/2 \tag{164}$$

$$yc1 = yc10 \tag{165}$$

$$xc2 = xc20 + dbx/2 \tag{166}$$

$$yc2 = yc20 \tag{167}$$

Moreover, as shown by a lens array 113D in FIG. 37(b), nine lens portions (a first lens portion 113Da, a second lens portion 113Db, a third lens portion 113Dc, a fourth lens portion 113Dd, a fifth lens portion 113De, a sixth lens portion 113Df, a seventh lens portion 113Dg, an eighth lens portion 113Dh, and a ninth lens portion 113Di, which are arranged at regular intervals in the x direction and the y direction) may be arranged such that two of the lens portions located at an outermost peripheral portion are spaced apart from each other by Dx in the x direction and Dy in the y direction. The centers of the optical axes of the lens portions are determined and stored in the coefficient storing portion 241 in the following manner.

The centers of the optical axes of the lens portions are generated such that as shown by Formulas (112) and (113), the amount of change dbx in the interval between the optical axes in the x direction due to the temperature increase and the amount of change dby in the interval between the optical axes in the y direction due to the temperature increase are calculated, and the centers of the optical axes are moved by half the amount of change dbx and half the amount of change dby (p*dbx/2 in the x direction and p*dby/2 in the y direction). Specifically, as shown by Formulas (168) and (169) below, the center (xc1, yc1) of the optical axis of the first lens portion 113Da is generated so as to be moved by −dbx/2 in the x direction and −dby/2 in the y direction from the center (xc10, yc10) of the optical axis at the reference temperature Th0. As shown by Formulas (170) and (171) below, the center (xc2, yc2) of the optical axis of the second lens portion 113Db is generated so as to be moved by −dby/2 in the y direction from the center (xc20, yc20) of the optical axis at the reference temperature Th0. As shown by Formulas (172) and (173) below, the center (xc3, yc3) of the optical axis of the third lens portion 113Dc is generated so as to be moved by +dbx/2 in the x direction and −dby/2 in the y direction from the center (xc30, yc30) of the optical axis at the reference temperature Th0. As shown by Formulas (174) and (175) below, the center (xc4, yc4) of the optical axis of the fourth lens portion 113Dd is generated so as to be moved by −dbx/2 in the x direction from the center (xc40, yc40) of the optical axis at the reference temperature Th0. As shown by Formulas (176) and (177) below, the center (xc5, yc5) of the optical axis of the fifth lens portion 113De is generated so as not to be moved from the center (xc50, yc50) of the optical axis at the reference temperature Th0. As shown by Formulas (178) and (179) below, the center (xc6, yc6) of the optical axis of the sixth lens portion 113Df is generated so as to be moved by +dbx/2 in the x direction from the center (xc60, yc60) of the optical axis at the reference temperature Th0. As shown by Formulas (180) and (181) below, the center (xc7, yc7) of the optical axis of the seventh lens portion 113Dg is generated so as to be moved by −dbx/2 in the x direction and +dby/2 in the y direction from the center (xc70, yc70) of the optical axis at the reference temperature Th0. As shown by Formulas (182) and (183) below, the center (xc8, yc8) of the optical axis of the eighth lens portion 113Dh is generated so as to be moved by +dby/2 in the y direction from the center (xc80, yc80) of the optical axis at the reference temperature Th0. As shown by Formulas (184) and (185) below, the center (xc9, yc9) of the optical axis of the ninth lens portion 113Di is generated so as to be moved by +dbx/2 in the x direction and +dby/2 in the y direction from the center (xc90, yc90) of the optical axis at the reference temperature Th0.

$$xc1 = xc10 - dbx/2 \quad (168)$$

$$yc1 = yc10 - dby/2 \quad (169)$$

$$xc2 = xc20 \quad (170)$$

$$yc2 = yc20 - dby/2 \quad (171)$$

$$xc3 = xc30 + dbx/2 \quad (172)$$

$$yc3 = yc30 - dby/2 \quad (173)$$

$$xc4 = xc40 - dbx/2 \quad (174)$$

$$yc4 = yc40 \quad (175)$$

$$xc5 = xc50 \quad (176)$$

$$yc5 = yc50 \quad (177)$$

$$xc6 = xc60 + dbx/2 \quad (178)$$

$$yc6 = yc60 \quad (179)$$

$$xc7 = xc70 - dbx/2 \quad (180)$$

$$yc7 = yc70 + dby/2 \quad (181)$$

$$xc8 = xc80 \quad (182)$$

$$yc8 = yc80 + dby/2 \quad (183)$$

$$xc9 = xc90 + dbx/2 \quad (184)$$

$$yc9 = yc90 + dby/2 \quad (185)$$

Moreover, the image pickup apparatus of Embodiment 3 carries out the temperature compensation of each of the distortion coefficients kd2 and kd4, the magnification (rx, ry), the center (xc1, yc1) of the optical axis of the first lens portion 113a, the center (xc2, yc2) of the optical axis of the second lens portion 113b, the center (xc3, yc3) of the optical axis of the third lens portion 113c, the center (xc4, yc4) of the optical axis of the fourth lens portion 113d, the focal length f, and the distance Dx between the optical axes of the lens portions in the x direction, and then corrects the image pickup signal. However, the present embodiment is not limited to this. For example, high-order distortion coefficients, magnifications of respective lens portions, and rotations of respective lens portions may be corrected.

In Embodiments 1 and 2, the movement distances of the optical axes of the lenses are estimated based on the temperature detected by the temperature sensor, and the image pickup signal is corrected based on the estimated movement distances of the optical axes. In Embodiment 3, the correction coefficients including the movement distances of the optical axes of lenses are generated based on the temperature detected by the temperature sensor, and the image pickup signal is corrected based on the correction coefficients. However, the compensation of the image pickup signal in the present invention is not limited to these. The image pickup signal may be corrected in accordance with the movement distances of the optical axes of the lenses due to the temperature change based on the temperature detected by the temperature sensor.

From the foregoing explanation, many modifications and other embodiments of the present invention are obvious to one skilled in the art. Therefore, the foregoing explanation should be interpreted only as an example, and is provided for the purpose of teaching the best mode for carrying out the present invention to one skilled in the art. The structures and/or functional details may be substantially modified within the spirit of the present invention.

INDUSTRIAL APPLICABILITY

The image pickup apparatus of the present invention is a compact image pickup apparatus capable of measuring distances. Therefore, the image pickup apparatus of the present invention is useful as a mobile phone having a camera function, a digital still camera, an in-vehicle camera, a monitoring camera, a 3-D measuring device, a stereoscopic image input camera, and the like.

The invention claimed is:

1. An image pickup apparatus comprising:
a lens array including a plurality of lenses;
a plurality of image pickup regions disposed so as to correspond to the plurality of lenses one-to-one and each including a light receiving surface substantially perpendicular to a direction in which an optical axis of the corresponding lens extends;
a temperature sensor disposed in a vicinity of the lens array to detect a temperature;
a temperature compensating and image pickup signal correcting portion configured to obtain, based on the temperature detected by the temperature sensor, movement distances of all the optical axes of the plurality of lenses, and correct an image pickup signal, generated in the image pickup region, in accordance with the obtained movement distances; and
a parallax calculating portion configured to calculate a parallax based on the image pickup signal corrected by the temperature compensating and image pickup signal correcting portion.

2. The image pickup apparatus according to claim 1, wherein:
the temperature compensating and image pickup signal correcting portion includes a movement distance estimating portion configured to estimate the movement distances of all the optical axes of the plurality of lenses based on the temperature detected by the temperature sensor and an image pickup signal correcting portion configured to correct the image pickup signal, generated in the image pickup region, based on the movement distances estimated by the movement distance estimating portion; and
the parallax calculating portion is configured to calculate the parallax based on the image pickup signal corrected by the image pickup signal correcting portion.

3. The image pickup apparatus according to claim 2, wherein the movement distance estimating portion is configured to calculate amounts of changes in intervals between the optical axes of the plurality of lenses based on the temperature detected by the temperature sensor and estimate the movement distances of the optical axes based on the amounts of changes.

4. The image pickup apparatus according to claim 3, wherein the movement distance estimating portion is configured to estimate half the amount of change as the movement distance of the optical axis.

5. The image pickup apparatus according to claim 2, wherein the image pickup signal correcting portion is configured to correct positions of the optical axes based on the movement distances and to correct distortions around the optical axes.

6. The image pickup apparatus according to claim 2, wherein the image pickup signal correcting portion is configured to change a cut-out region based on the movement distance.

7. The image pickup apparatus according to claim 1, wherein:
the temperature compensating and image pickup signal correcting portion includes a correction coefficient generating portion configured to generate correction coefficients including the movement distances of all the optical axes of the plurality of lenses based on the temperature detected by the temperature sensor and an image pickup signal correcting portion configured to correct the image pickup signal, generated in the image pickup region, based on the correction coefficients to generate a corrected image pickup signal; and
the parallax calculating portion is configured to calculate the parallax based on the corrected image pickup signal.

8. The image pickup apparatus according to claim 7, wherein the correction coefficient generating portion is configured to calculate amounts of changes in intervals between the optical axes of the plurality of lenses based on the temperature detected by the temperature sensor and generate half the amount of change as the movement distance of the optical axis to generate the correction coefficient.

9. The image pickup apparatus according to claim 7, further comprising a correction coefficient storing portion configured to store plural sets of correction coefficients corresponding to the temperatures as plural sets of correction coefficient storing values, wherein
the correction coefficient generating portion is configured to select the correction coefficient storing value corresponding to the temperature from the plural sets of correction coefficient storing values to generate the correction coefficient.

10. The image pickup apparatus according to claim 9, further comprising a temperature sensor signal input portion configured to receive a signal from the temperature sensor to generate a temperature value that is a digital value, wherein:
the correction coefficient storing portion is configured to store the set of correction coefficient storing values which is lower in resolution than the temperature value; and
the correction coefficient generating portion is configured to select and interpolate the plural sets of correction coefficient storing values based on the temperature value to generate the correction coefficients.

11. The image pickup apparatus according to claim 7, wherein the image pickup signal correcting portion is configured to obtain reference coordinates based on the correction coefficients and refer to and interpolate a plurality of the image pickup signals indicated by the reference coordinates to generate the corrected image pickup signals.

12. A semiconductor circuit element used in an image pickup apparatus including a lens array having a plurality of lenses, and a plurality of image pickup regions disposed so as to correspond to the plurality of lenses one-to-one and each including a light receiving surface substantially perpendicular to a direction in which an optical axis of the corresponding lens extends,
the semiconductor circuit element comprising:
a temperature compensating and image pickup signal correcting portion configured to obtain, based on a temperature detected by a temperature sensor disposed in a vicinity of the lens array, movement distances of all the optical axes of the plurality of lenses, and correct an image pickup signal, generated in the image pickup region, in accordance with the movement distances; and
a parallax calculating portion configured to calculate a parallax based on the image pickup signal corrected by the temperature compensating and image pickup signal correcting portion.

13. The semiconductor circuit element according to claim 12, wherein:
the temperature compensating and image pickup signal correcting portion includes a movement distance estimating portion configured to estimate the movement distances of all the optical axes of the plurality of lenses based on the temperature detected by the temperature sensor and an image pickup signal correcting portion configured to correct the image pickup signal, generated in the image pickup region, based on the movement distances estimated by the movement distance estimating portion; and the parallax calculating portion is configured to calculate the parallax based on the image pickup signal corrected by the image pickup signal correcting portion.

14. The semiconductor circuit element according to claim 13, wherein the movement distance estimating portion is configured to calculate amounts of changes in intervals between the optical axes of the plurality of lenses based on the temperature detected by the temperature sensor and estimate the movement distances of the optical axes based on the amounts of changes.

15. The semiconductor circuit element according to claim 14, wherein the movement distance estimating portion is configured to estimate half the amount of change as the movement distance of the optical axis.

16. The semiconductor circuit element according to claim 13, wherein the image pickup signal correcting portion is configured to correct positions of the optical axes based on the movement distances and to correct distortions around the optical axes.

17. The semiconductor circuit element according to claim 13, wherein the image pickup signal correcting portion is configured to change a cut-out region based on the movement distance.

18. The semiconductor circuit element according to claim 12, wherein:

the temperature compensating and image pickup signal correcting portion includes a correction coefficient generating portion configured to generate correction coefficients including the movement distances of all the optical axes of the plurality of lenses based on the temperature detected by the temperature sensor and an image pickup signal correcting portion configured to correct the image pickup signal, generated in the image pickup region, based on the correction coefficients to generate a corrected image pickup signal; and the parallax calculating portion is configured to calculate the parallax based on the corrected image pickup signal.

19. The semiconductor circuit element according to claim 18, wherein the correction coefficient generating portion is configured to calculate amounts of changes in intervals between the optical axes of the plurality of lenses based on the temperature detected by the temperature sensor and generate half the amount of change as the movement distance of the optical axis to generate the correction coefficient.

20. The image pickup apparatus according to claim 1, wherein the lens array has a substantially circular shape.

21. The image pickup apparatus according to claim 1, wherein the plurality of image pickup regions are disposed below the plurality of lenses in the direction in which the optical axis of the corresponding lens extends.

\* \* \* \* \*